US006651020B2

(12) United States Patent
More

(10) Patent No.: US 6,651,020 B2
(45) Date of Patent: Nov. 18, 2003

(54) METHOD AND APPARATUS FOR ECONOMICAL DRIFT COMPENSATION IN HIGH RESOLUTION MEASUREMENTS

(76) Inventor: Edward S. More, #1072 2118 Wilshire Blvd., Santa Monica, CA (US) 90403

( * ) Notice: Subject to any disclaimer, the term of this patent is extended or adjusted under 35 U.S.C. 154(b) by 87 days.

(21) Appl. No.: 10/029,898

(22) Filed: Dec. 21, 2001

(65) Prior Publication Data

US 2002/0087281 A1 Jul. 4, 2002

Related U.S. Application Data

(63) Continuation-in-part of application No. 09/273,094, filed on Mar. 19, 1999, now Pat. No. 6,334,093, which is a continuation-in-part of application No. 08/997,901, filed on Dec. 24, 1997, now abandoned.

(51) Int. Cl.[7] .................. G01K 15/00; G01K 19/00; G06F 19/00
(52) U.S. Cl. .................. 702/99; 73/708; 73/23.2; 324/130; 324/704; 324/115; 374/183; 323/367
(58) Field of Search ............... 702/99; 73/708, 73/23.2; 323/367; 324/130, 704, 115; 374/183

(56) References Cited

U.S. PATENT DOCUMENTS

| | | | | |
|---|---|---|---|---|
| 4,611,163 A | * | 9/1986 | Madeley | 323/367 |
| 5,042,307 A | * | 8/1991 | Kato | 73/708 |
| 5,065,613 A | * | 11/1991 | Lehnert et al. | 73/23.2 |
| 5,132,609 A | * | 7/1992 | Nguyen | 324/130 |
| 5,162,725 A | * | 11/1992 | Hodson et al. | 324/115 |
| 5,171,091 A | * | 12/1992 | Kruger et al. | 374/183 |
| 5,253,532 A | * | 10/1993 | Kamens | 73/708 |
| 5,351,010 A | * | 9/1994 | Leopold et al. | 324/704 |
| 5,616,846 A | * | 4/1997 | Kwasnik | 73/708 |
| 6,334,093 B1 | * | 12/2001 | More | 702/99 |

FOREIGN PATENT DOCUMENTS

| | | |
|---|---|---|
| JP | 61-32375 B2 | 7/1986 |
| JP | 2-175837 A | 7/1990 |
| JP | 5-59489 A | 3/1993 |

(List continued on next page.)

*Primary Examiner*—John Barlow
*Assistant Examiner*—Aditya S Bhat
(74) *Attorney, Agent, or Firm*—William C. Milks, III

(57) ABSTRACT

A system for measuring differences in a physical variable, such as temperature or voltage, by utilizing predictable behavior in the relative time drift of offset curves for various circuit elements, including, for example, two sensors coupled to a difference signal amplifier, an ambient condition amplifier, and an analog to digital converter. In an initial calibration mode, the system records several offset curves, stored in memory, correlating ambient condition measurements to offset measurements acquired from the ambient condition amplifier and the difference signal amplifier. Offset curves recorded in the initial calibration mode, correlating ambient condition measurements to measurements from the difference signal amplifier, include one curve recorded with both inputs of the difference signal amplifier held at equal potential and another curve recorded with both sensors held at the same value of the physical variable, over a given ambient condition range. Another offset curve correlates ambient condition to measurements from the ambient condition amplifier, with inputs to the ambient condition amplifier connected to a system ground, or substantially time stable reference potential. These offset curves representing drift behavior, among electrical components, can be updated for time drift, at a single, current arbitrary ambient temperature, the measurements for which can be obtained quickly and applied as a time drift correction to the offset curves, without interrupting normal system operation, to provide a compensated difference measurement between the different values of the physical variable measured by the respective sensors. Additionally, the system dynamically tracks cumulative system errors, in order to calculate optimal system resolution, based upon current operating conditions.

96 Claims, 16 Drawing Sheets

FOREIGN PATENT DOCUMENTS

| | | |
|---|---|---|
| JP | 5-70836 A | 3/1993 |
| JP | 5-78784 A | 3/1993 |
| JP | 5-112845 A | 5/1993 |
| JP | 6-158162 A | 6/1994 |
| JP | 7-47796 B2 | 5/1995 |
| JP | 7-62209 B2 | 7/1995 |
| JP | 8-92656 A | 4/1996 |
| JP | 9-263903 A | 10/1997 |
| JP | 10-280092 A | 10/1998 |

* cited by examiner

METHOD AND APPARATUS FOR ECONOMICAL DRIFT COMPENSATION IN HIGH RESOLUTION MEASUREMENTS

CROSS-REFERENCES TO RELATED PATENT APPLICATIONS

This is a continuation-in-part of U.S. patent application Ser. No. 09/273,094 filed on Mar. 19, 1999 now U.S. Pat. No. 6,334,093, which is a continuation-in-part of abandoned U.S. patent application Ser. No. 08/997,901, filed on Dec. 24, 1997, both entitled "METHOD AND APPARATUS FOR ECONOMICAL DRIFT COMPENSATION IN HIGH RESOLUTION DIFFERENCE MEASUREMENTS AND EXEMPLARY LOW COST, HIGH RESOLUTION DIFFERENTIAL DIGITAL THERMOMETER."

TECHNICAL FIELD

The present invention relates to measuring and recording devices and techniques for compensating electronic measurement systems for the effects of electronic component drift over time and temperature. By way of example but without limitation, one embodiment of the present invention relates to temperature measuring and recording devices and techniques which perform high resolution temperature difference measurements, on the order of micro-degrees centigrade.

The method and apparatus of the present invention accurately resolve extremely small differences in electrical signals, in a very low cost, highly portable apparatus that can be battery operated. In an exemplary embodiment, the method and apparatus of the present invention are directed to the measurement of temperature differences, on the order of micro-degrees centigrade, by utilizing predictable behavior in the relative time drift of thermal offset curves, for various circuit elements, including a difference signal means optionally having amplification for providing an amplified difference signal, an ambient temperature amplification means, and an analog to digital converter means. In an initial calibration mode, preferably performed at the time of manufacture, the exemplary embodiment records several thermal offset curves, stored in memory, which correlate ambient temperature measurements to offset measurements acquired from the ambient temperature amplification means and the difference signal means, with both of said means connected to a measurement bridge, comprising two thermistors and two resistors, for measuring ambient temperature and temperature differences (via nodes of the measurement bridge). Thermal offset curves recorded in the initial calibration mode, correlating ambient temperature measurements to measurements from the difference signal means, include one curve recorded with both inputs of the difference signal means held at equal potential and another curve recorded with both thermistors of the measurement bridge held at the same temperature, over a given ambient temperature range. Another thermal offset curve, preferably recorded at the time of manufacture, correlates measured ambient temperature from the ambient temperature amplification means to measurements from the ambient temperature amplification means, with inputs to said ambient temperature amplification means shorted together or, alternatively, shorted together and connected to one or more reference signals (such as system ground), which in the exemplary embodiment are preferably voltages from a reference resistance bridge, preferably comprising substantially time stable (not necessarily temperature stable) resistors. The method and apparatus of the present invention require few components, and no precision active or passive components, resulting in low power consumption, and low cost. The method and apparatus of the present invention overcome time and temperature component drift, by utilizing the fact that the thermal offset curves, acquired in the initial calibration mode (preferably at the time of manufacture), drift with time in a predominantly linear fashion relative to one another. Consequently, during normal operation, these offset curves representing temperature drift behavior, among electrical components, can be updated for time drift, at a single, current arbitrary ambient temperature, the measurements for which can be obtained quickly and applied as a time drift correction to thermal offset curves, without interrupting normal system operation. Additionally, the present invention dynamically tracks cumulative system errors associated with the method of the present invention, in order to dynamically calculate optimal system resolution, based upon current operating conditions (rather than based upon more general component drift specifications).

BACKGROUND OF THE INVENTION

Various electronic systems exist for measuring extremely small differences in sensor measurements, such as temperature, for use in biological and physical analyses. It is known in the art that active and passive electronic components in such systems are subject to time and temperature drift, and that under normal operating conditions, the amplitude of time and temperature component drift is typically much greater than the amplitude of other inaccuracies generated by system components, such as amplifier noise voltage, noise current, and resistor noise. Consequently, component time and temperature drift are significant limiting factors to high resolution measurements, such as temperature difference measurements. To address the problem of component drift in electronic measurement systems generally, various approaches to compensate for drift have been devised.

For example, U.S. Pat. Nos. 5,253,532 (Kamens); 5,042,307 (Kato); 4,611,163 (Madeley); and 3,831,042 (La Claire) disclose electronic measurement systems (principally directed to pressure sensing, in the preferred embodiments) which include additional hardware components that change their electrical resistance, or other electrical parameters, with ambient temperature, in such a way as to compensate for thermal drift in measurement systems to which they are electrically connected. While such hardware compensation systems provide some compensation for thermal drift inaccuracies, they do not compensate for component drift over time, particularly the drift of sensors, such as thermistors. This would be sufficient to preclude temperature difference measurements, with resolution on the order of micro-degrees centigrade, if these techniques were applied to that purpose. Additionally, such hardware based compensation techniques do not readily compensate for component drift, resulting from the combined time drift characteristics of multiple system components, located at different parts of the system, with different thermal drift characteristics, and subject to non-uniform aging. In any case, the ability of the above hardware based compensation systems and techniques to compensate for system thermal drift are limited by the extent to which the particular technique tracks with thermal drift of the overall system, over time and temperature. Consequently, such techniques would not provide sufficient compensation for component time and temperature drift to permit differential temperature measurements, with resolution on the order of micro-degrees centigrade, if these techniques were applied to that purpose.

Other hardware compensation techniques, such as disclosed in U.S. Pat. Nos. 5,616,846 (Kwasnik); 5,171,091 (Kruger et al.); and 5,132,609 (Nguyen), require a time and temperature stable reference signal, and U.S. Pat. No. 5,351,010 (Leopold et al.) requires the use of precision analog amplification hardware and costly time and temperature stable resistors. The required precision analog components in these systems results in increased cost, complexity, and power consumption. Moreover, these systems do not compensate for time drift of passive components, such as thermistors, which would be sufficient to preclude temperature difference measurements, with resolution on the order of micro-degrees centigrade, if these systems were applied to that purpose.

Additionally, U.S. Pat. Nos. 5,162,725 (Hodson et al.); 5,065,613 (Lehnert); 4,958,936 (Sakamoto et al.); and 4,464,725 (Briefer) describe electronic measurement systems which compensate for thermal drift, and other system inaccuracies, by utilizing a computer, and memory for storing known temperature behavior of a measurement system, at various calibration temperatures. That is, system inaccuracies due to temperature drift are recorded at specific calibration temperatures. This stored temperature behavior is then used to interpolate system inaccuracies due to thermal component drift at operational temperatures within the calibration range. This has been accomplished by using mathematical formulae to model thermal offset curves (e.g., using a parabolic interpolation, such as the LaGrange method, to plot offset curves, based upon discrete offset measurements, at discrete ambient temperatures), and then during normal operation, using a said formula, with a current ambient temperature measurement, to determine expected circuit offsets for the current ambient temperature, so that actual system measurements during normal operation can be adjusted for the effects of said expected circuit offsets. The prior art measurement systems, which utilize a computer, can provide time and temperature compensation based only upon the most recent reference calibration data, the acquisition of which requires that the system be cycled through an entire temperature range, and is sufficiently time consuming to prevent, or significantly interrupt, normal system operation. Other techniques that utilize software compensation, such as disclosed in U.S. Pat. No. 4,532,601 (Lenderking et al.), as well as in U.S. Pat. No. 4,464,725 (Briefer, referred to above), require the use of a time and temperature stable reference signal, which increases cost, complexity, and power consumption. U.S. Pat. No. 4,959,804 (Willing) utilizes time and temperature stable passive components, which, even with costly bulk metal foil, or wirewound, resistors, would not provide the accuracy necessary in temperature difference measurements, with resolution on the order of micro-degrees centigrade, if this technique were applied to that purpose. Such time and temperature stable bulk metal foil resistors (e.g., manufactured by Vishay Electronics Foil Resistors, of Malvern, Pa.) and wirewound resistors, such as manufactured by Dale Electronics, of Norfolk, Nebr., are one to two orders of magnitude more expensive than standard metal film resistors, which provide comparable time stability, but are not nearly as temperature stable. Furthermore, U.S. Pat. No. 4,959,804 (Willing, referred to above) updates a previously recorded temperature curve according to the two endpoints of the curve, thereby ignoring variations that might occur at intervening points along the curve, over time, as well as time drift in temperature measuring thermistors, which drift sufficiently over time to invalidate temperature difference measurements, with resolution on the order of micro-degrees centigrade, if it were applied to the purpose of high resolution differential temperature measurements. U.S. Pat. No. 4,651,292 (Jeenicke) relies on updating a point on a measurement curve, requiring, however, the restriction that the sensor curve characteristic be linear (not the case with temperature sensors, such as thermistors, and not sufficiently so, to provide resolution on the order of micro-degrees centigrade, even with known thermistor linearization techniques) and that ambient temperature measurements not drift with time, to the extent that measurement accuracy would be affected, making this technique unsuitable for a differential thermometer with resolution on the order of micro-degrees centigrade, if such a technique were to be applied to that purpose.

In the above approaches, as they would relate to a temperature difference measurement system, utilizing a pair of thermistors (e.g., in a thermistor-resistor bridge arrangement), it is relevant to note that differences in thermistor resistance-temperature curve characteristics, between two thermistors, result in a difference in the two thermistor resistances, throughout an ambient temperature range, that varies significantly with ambient temperature. For instance, YSI 460 series "Super-Stable Thermistors", manufactured by YSI, Incorporated, of Yellow Springs, Ohio, are characteristic of well matched, commercially available thermistors, and are matched to within 0.05 C° of each other, between 0 C° and 50 C°. This means that within the 0 C° to 50 C° range of operating temperatures, the difference in thermistor resistances may change by as much as 0.001 C°, relative to each other, for each ambient temperature change of 1 C°, a significant amount in measurements intended to resolve temperature differences on the order of micro-degrees centigrade. The above approaches, as they would relate to a temperature difference measurement system, utilizing a pair of thermistors, do not provide a means to compensate for this effect. Additionally, in order to minimize common mode amplifier error, the use of bipolar power to the measurement bridge is often preferred in the above prior art, as are high precision amplifiers, which typically require bipolar power, resulting in added cost and complexity, compared to a single-ended power supply architecture.

In U.S. Pat. No. 5,295,746 (Friauf et al.), directed specifically to the technical field of temperature difference measurement, with resolution on the order of micro-degrees centigrade, it is pointed out that a number of digital thermometers exist, which, however, have accuracy limitations on the order of one hundred milli-degrees centigrade. U.S. Pat. No. 5,295,746 addresses some of the limitations of the prior art, in this respect, by using a computer to maintain a thermistor-resistor bridge in a balanced state, to provide a means for adjusting thermistor power dissipation and to null out thermally generated offsets in the system's analog to digital converter, digital to analog converters, and amplifiers, for a given thermistor power dissipation, for the current ambient temperature. However, this requires that the bridge circuit be balanced with extreme accuracy, requiring the addition of two digital to analog converters to the circuit, preferably employing high resolution, in order to achieve high resolution temperature difference measurements, resulting in added component count, cost, and power consumption. Additionally, no means is provided to compensate for time drift of thermistors, which typically amounts to ten or more milli-degrees/year (e.g., YSI 44018, manufactured by YSI Incorporated, of Yellow Springs, Ohio), a significant figure in temperature difference measurements, intended to approach micro-degree centigrade resolution. Additionally, software calibration of this system, for a current ambient temperature, is undertaken at the time when temperature difference measurements are undertaken, yet requires that bridge thermistors be completely powered down first, so that there is zero voltage potential across the bridge during calibration. That is, system calibration followed by continued operation in the temperature difference measurement mode must be undertaken by first powering down the bridge thermistors, and then powering them up again. Due to self-heating properties of thermistors, when a voltage is placed across thermistors, time is required for the thermistors to reach equilibrium with ambient temperature, which they do asymptotically. In cases where temperature difference measurements on the order of micro-degrees centigrade are to be resolved, this powering down and then powering up of the bridge, until the thermistors are within micro-degrees centigrade of equilibrium, adds significant time to the calibration process. Since each calibration offset measurement is associated with a specific ambient temperature, a calibration measurement (and, therefore, an ambient temperature) must be associated with each temperature difference measurement. Calibration measurements performed before and after a measurement run can conceivably be used to interpolate linear changes in ambient temperature with time, during a measurement run, but this places an unrealistic limitation on a measurement system which desirably operates under normal atmospheric conditions, in which ambient temperature changes may not be linear with time. Therefore, a calibration measurement must be undertaken for each temperature difference measurement, in which ambient temperature may not have undergone a linear change, thus adding significant time to the measurement process. Similarly, U.S. Pat. No. 5,351,010 (Leopold et al., also mentioned above) requires that current be reversed through zero, in resistive sensors, for each calibration, as well as requiring precision circuitry, that increases cost, complexity, and power consumption.

Additionally, the prior art does not provide a means to dynamically quantify compensation inaccuracies, resulting from the particular drift compensation technique used. These inaccuracies, inherent in the above compensation techniques, may vary widely, depending on specific operating conditions, such as: ambient temperature; number and location of temperature compensation/sensing devices in the system; thermal and time drift homogeneity among system components; time elapsed since a reference calibration (where relevant); and system warm-up status. In the above prior art, a general specification based upon a combination of individual system component drift tolerances, taken as a whole, can conceivably be computed to account for temperature and time drift limitations of a system. Based upon a given calibration, and/or compensation technique, over an intended temperature span, such a computation could be used to provide a limitation to achievable resolution in the above prior art, in a given operating environment, for a given calibration/compensation technique, over an expected temperature range of operation. However, in order to be reliable, such a computation would need to take into consideration factors which include long term time-drift characteristics of active and passive components, including amplifiers, and mixed-mode devices, such as analog/digital converters, as well as time drift of passive components, such as resistors and thermistors. An additional source of error to take into consideration, in devices expected to perform to specification when they are turned on, includes time versus drift behavior during system warm-up. Consequently, although a general specification for the ability of a technique to compensate for component time and temperature drift may be calculated, by combining manufacturer supplied drift specifications for relevant components, the actual value of errors associated with uncompensated component drift, in a given compensation technique, may change significantly, depending on the above factors, so that rather than being optimized, based upon current operating conditions, such a calculated specification must be set high enough to anticipate worst case conditions.

Such calculated resolution limits, for a given system, over a given temperature span, are often used to estimate performance in bridge measurement systems. However, it would be highly advantageous in detecting extremely small variations, approaching the limitations of modem electronics, to dynamically use limitation information that improves upon such absolute estimates, whenever possible. For example, system limitation specifications can be significantly enhanced by using such information as: elapsed time since a last reference calibration; empirically determined tolerance of temperature versus offset drift curves, over time; and elapsed time since power-up. In the above prior art, no means is provided to dynamically and efficiently account for collective circuit limitations, associated with a drift compensation method, in such a way as to provide an accurate, instantaneous indication, or continuous system control, reflecting optimum achievable system accuracy, under the drift compensation method, and based upon current operating conditions.

In spite of advances in bridge measurement systems, and in particular, high resolution temperature difference measurement systems, there remains a need for a high resolution measurement system, such as a differential thermometer, utilizing a minimum of low cost components, consuming minimal power (permitting battery powered operation), and operable from a single-ended power supply, that provides accurate temperature compensation, and that can be calibrated during normal operation, for temperature drift, and time drift of system components, without significantly interrupting operation in the field, and that sufficiently compensates for time drift of passive components, such as thermistors, so that a specified system resolution, in the case of the differential thermometer on the order of micro-degrees centigrade, is achievable. Additionally, there remains a need for such a system which provides an instantaneous indication of system resolution limitations, based upon current operating conditions, which can be reported to the user, or employed to continuously and automatically effect system reporting in such a way as to dynamically provide optimal resolution, rather than using a single specification based upon a combined estimate of expected system tolerances.

OBJECTS AND SUMMARY OF THE INVENTION

It is therefore a general object of the present invention to provide a very low cost means of accurately measuring small signals and signal differences.

It is a more particular object of the present invention to provide a very low cost system for accurately measuring small temperature differences, on the order of micro-degrees centigrade, that can provide accurate compensation for time and temperature component drift, without significantly interrupting normal system operation.

It is another object of the present invention to provide a very low cost means of measuring small temperature differences, on the order of micro-degrees centigrade, such that the system can be operated under normal atmospheric conditions, and calibrated during normal operation, for time and temperature drift of active system components, such as amplifiers and analog to digital converters, and such that said calibrations can be readily, and quickly, performed in the field, to permit accurate operation, with resolution on the order of micro-degrees centigrade, without significantly interrupting normal operation.

It is yet another object of the present invention to provide a very low cost means of measuring small temperature differences, which sufficiently compensates for time drift of passive components, such as thermistors and feedback resistors, to permit temperature difference measurements, with resolution on the order of micro-degrees centigrade, and such that said sufficient compensation can be performed readily, and quickly, in the field, without significantly interrupting normal operation.

It is still another object of the present invention to provide a very low cost, high resolution difference measurement system, with continuous indications of measurement system resolution capability, based upon current operating conditions, such that said resolution capability can be continuously reported to the user or employed to automatically and continuously effect system reporting in such a way as to dynamically provide optimum system resolution.

Another object of the present invention is to provide a very low cost system for measuring other parameters, such as electrical signals, pressure, flow, or other variables, that can provide accurate compensation for time and temperature component drift, resulting in highly accurate measurements without significantly interrupting normal system operation.

Still other objects and advantages of the present invention will be apparent from the specification which follows.

The various embodiments of the present invention improve over prior art systems and techniques for measuring low level signals, such as signals representative of differential temperature, by reducing the number and cost of components required to achieve high resolution measurements, such as difference signal measurements. One embodiment of the present invention improves over prior art high resolution difference measurement systems, by permitting accurate compensation for time and temperature drift of both active and passive system components, at a single current arbitrary temperature within a range of ambient temperatures, to permit temperature difference measurements, with resolution on the order of micro-degrees centigrade, and such that critical calibrations can be performed without interrupting normal system operation. Additionally, the various embodiments of the present invention improve over prior art high resolution measurement systems, by providing a continuous indication of measurement system resolution capability, based upon current operating conditions, and which can be continuously reported to the user, or employed to automatically and continuously effect system reporting in such a way as to dynamically provide optimum system resolution, as opposed to limiting optimum resolution to a general specification, based upon individual component performance over a temperature range.

Generally, in accordance with the present invention, an improved signal measurement method and apparatus are provided, which accurately resolves extremely small differences in electrical signals, in a very low cost, highly portable apparatus that can be battery operated, by utilizing predictable behavior in the relative time drift of offset curves, such as thermal offset curves, for various circuit elements of the apparatus, including difference signal means and ambient condition measurement means, such as ambient temperature amplification means. In an exemplary embodiment, which measures temperature differences, with resolution on the order of micro-degrees centigrade, the difference signal means includes a difference amplifier, which amplifies a voltage difference between two nodes of a measurement bridge, comprising two thermistors and two resistors, such that said voltage difference represents a temperature difference between said thermistors. Additionally, in the exemplary embodiment, the ambient temperature amplification means amplifies the difference in voltage between one of said nodes of said measurement bridge (the voltage of which varies with ambient temperature) and a reference node, the voltage of which is provided by a reference bridge (preferably comprising resistors, with substantially time stable temperature-resistance curves), in order to provide a signal representative of ambient temperature. It will be appreciated by those skilled in the art that the said voltage of the reference node may alternatively be provided by system ground or a reference voltage device of the type well known in the art, thereby eliminating the need for the said reference bridge, and that parameters other than temperature can be measured.

In an initial calibration mode (called reference calibration mode, in accordance with the present invention), preferably performed at the time of manufacture, thermal offset curves are recorded, which correlate ambient temperature measurements to offset measurements from both the ambient temperature amplification means and the difference signal means (said measurements are converted to digital form by the analog to digital converter means). The thermal offset curves include: one curve, recording measurements from the difference signal means, with both thermistors of the measurement bridge held at the same temperature, over the ambient temperature range; another curve, recorded with both inputs of the difference signal means held at equal potential, over the ambient temperature range; and yet another curve, correlating ambient temperature, over the ambient temperature range, to measurements from the ambient temperature amplification means, with both inputs of said ambient temperature amplification means connected to voltages of a reference resistor bridge, preferably comprising resistors having a substantially time stable temperature-resistance characteristic.

One of said thermal offset curves, recorded during operation in the reference calibration mode (said curve referred to as a difference temperature curve or, more generally, as a physical variable difference curve, in accordance with the present invention), correlates difference signal measurements to ambient temperature measurements, with the two thermistors of said measurement bridge held at the same temperature, throughout operation in the reference calibration mode. Consequently, the resulting difference temperature curve can be used, during normal operation, to correlate any ambient temperature measurement, within the range of calibrated ambient temperatures, to a point on the difference temperature curve, corresponding to the expected temperature difference, if both thermistors were at the same said measured ambient temperature. That is, during normal operation, a measured ambient temperature can be correlated to an expected temperature difference measurement (corresponding to zero temperature difference) to provide an offset, which can be used to adjust any measured difference temperature, by said offset, in order to compensate for non-matching temperature-resistance characteristics, between thermistors, over the ambient temperature range in which operation in the reference calibration mode was performed. Note that this does not compensate for drift of active components associated with the difference measurements, such as amplifiers and analog to digital converters, which are preferably compensated for as indicated below.

Another thermal offset curve, recorded during operation in the reference calibration mode, is referred to as a difference reference curve, in accordance with the present invention, and correlates ambient temperature measurements to an amplified difference between the two inputs of the difference signal means of the preferred embodiment, when both said inputs are shorted to the same potential, over the ambient temperature range in which the reference calibration mode is performed. The difference reference curve is used to compensate for time drift of the difference temperature curve, over the ambient temperature range in which the reference calibration mode was performed, and thus is used to compensate for time and temperature drift of active components associated with difference signal measurements, in contrast to drift of passive measurement bridge components, such as thermistors, which typically drift at different rates over time relative to active components, such as amplifiers and analog to digital converters. Note that the difference reference curve is acquired with both inputs of the difference signal means shorted to the same potential, in contrast to the difference temperature curve, which is acquired with both thermistors held at the same temperature, over the ambient temperature range, in which the reference calibration mode is performed.

Finally, another thermal offset curve, recorded during operation in the reference calibration mode, is referred to as an ambient reference curve, in accordance with the present invention, and correlates ambient temperature measurements to an amplified difference between two nodes of said reference bridge, as amplified by the ambient temperature amplification means. The ambient reference curve is used to compensate for time and temperature drift of ambient temperature measurements, by translating the positions of other thermal offset curves, acquired during the reference calibration mode, relative to ambient temperature measurements. Both the ambient reference curve and the ambient temperature scale, against which all thermal offset curves are measured, are shifted by the method of the present invention, utilizing at least one measured point and recorded points on the ambient reference curve, along with related measured and recorded ambient temperatures, such that a compensation is achieved for both the ambient temperature amplification means and passive measurement bridge components, associated with ambient temperature measurements.

The method of the present invention does not require that amplifiers of either the ambient temperature amplification means, nor difference signal means, provide precision performance (such as low offset voltage, low temperature drift, low common mode rejection, or, in the case of battery powered embodiments, in which battery voltage may vary over time, low power supply rejection). Nor does the method of the present invention require that the reference or measurement bridge employ time and temperature stable resistors. However, bridge and feedback resistors of the preferred embodiment of the present invention are preferably time stable, such as those of standard metal film composition (e.g., manufactured by Dale Electronics, of Norfolk, Nebr.), which offer stability over time, comparable to much more costly temperature stable, and time stable, bulk metal foil resistors (manufactured by Vishay Electronics Foil Resistors, of Malvern, Pa.), or wirewound resistors (such as manufactured by Dale Electronics, of Norfolk, Nebr.).

The method of the present invention overcomes time and temperature component drift, by utilizing the fact that the thermal offset curves, over a given ambient temperature range, drift with time in a predominantly linear fashion, relative to one another, in response to component time drift (e.g., resulting from active component offset voltage drift, common mode variations, power supply variations in battery powered embodiments, and temperature-resistance curve drift, over time, of thermistors and resistors associated with amplifiers and resistance bridges). Hence, the thermal offset curves, representing temperature drift behavior, which vary among each other in a predominantly linear fashion over time, within a calculable accuracy, are acquired, and stored in memory, so that during normal operation, these curves can be updated for time drift, at a single, current arbitrary ambient temperature, the measurements for which are obtained quickly (in a standard calibration mode, in accordance with the present invention) and applied as a time drift correction to thermal offset curves, without interrupting normal system operation. This method of the present invention enables compensation for time and temperature drift of active components and passive components sufficiently to permit accurate resolution of temperature differences, for example, on the order of micro-degrees centigrade.

Non-linear time drift, primarily associated with passive component drift over time (e.g., time drift of thermistors and feedback resistors, resulting in gain drift) is substantially compensated by the method of the present invention, over many months of operation, without requiring a re-acquisition of thermal offset curves over a temperature range, because such gain drift over time is manifested to a much smaller extent as a change in curve "shape", rather than as a linear curve translation. However, such non-linear changes in thermal offset curve shape, over time, will eventually affect the accuracy of measurements. The extent to which the effects of non-linear drift over a given time are compensated corresponds to a maximum time period, within which re-acquisition of thermal offset curves is required, in order to achieve a given measurement accuracy. This maximum period depends substantially on the time stability (not the temperature stability) of passive components, especially gain feedback resistors. In order to determine the maximum period between re-acquisition of offset curves that is required in order to achieve a given accuracy, operation in the reference calibration mode is preferably performed on two occasions, at the time of manufacture, utilizing a constant temperature bath, capable of providing at least two known, repeatable temperatures. Nevertheless, the method of the present invention permits a re-acquisition of thermal offset curves over an arbitrary temperature range, so that subsequent re-acquisitions of thermal offset curves can be performed, at any time, by the end user, without such costly calibration equipment.

Additionally, the method of the present invention dynamically tracks cumulative system errors, associated with drift compensation, and based upon current operating conditions, in order to dynamically calculate optimal system accuracy, based upon current operating conditions (rather than based upon a combination of more general component drift specifications). Once quantified, the calculated optimal system accuracy, based upon current operating conditions, can be used to dynamically control system reporting, to reflect achievable accuracy.

BRIEF DESCRIPTION OF THE DRAWINGS

Objects, features, and advantages of the present invention will best be understood from the following detailed description, taken in conjunction with the accompanying drawings, of which.

DETAILED DESCRIPTION OF THE PREFERRED EMBODIMENTS

Figure 1:
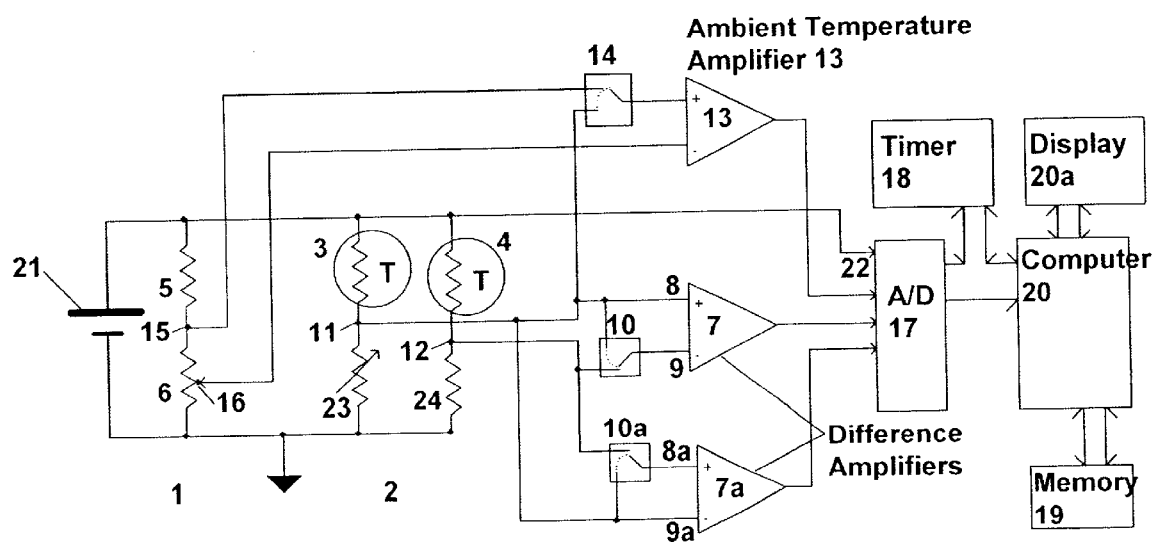
FIG. 1 is a schematic representation of components comprising a circuit in accordance with one preferred exemplary embodiment of the present invention.

Referring to FIG. 1, one exemplary embodiment of the present invention, providing a low cost, high resolution digital temperature difference thermometer, includes: a reference bridge 1; a measurement bridge 2; a first thermistor 3 and a second thermistor 4, said thermistors configured in parallel, as shown at the upper half of measurement bridge 2; reference resistors 5 and 6, comprising reference bridge 1, arranged as shown, between power rails of measurement bridge 2; a first high gain difference temperature amplifier 7, with inputs 8 and 9, which can be connected via a switch 10 to measurement nodes 11 and 12, respectively, of measurement bridge 2, or shorted together such that inputs 8 and 9 are both connected to bridge node 11; a second high gain difference temperature amplifier 7a, with inputs 8a and 9a, which can be connected via a switch 10a to measurement nodes 12 and 11, respectively, of measurement bridge 2, or shorted together such that inputs 8a and 9a are both connected to bridge node 11; an ambient temperature amplifier 13, which can be connected via a switch 14 to measurement node 11 of measurement bridge 2 and reference node 16 (to amplify the voltage difference between said nodes 11 and 16), or to reference nodes 15 and 16 (to amplify the voltage difference between said nodes 15 and 16), with said reference nodes 15 and 16, formed by reference bridge 1, preferably consisting of time stable, metal film resistor 5 and wirewound potentiometer 6. It will be appreciated that the use of potentiometer 6 is for convenience, and that potentiometer 6 may be replaced by a fixed resistor(s), if justified by cost considerations. Also, note that resistors 5 and 6 need not be temperature stable; however, they are preferably time stable, permitting the use of standard metal film resistors (e.g., manufactured by Dale Electronics, of Norfolk, Nebr.), which are one to two orders of magnitude less costly than time and temperature stable bulk metal foil and wirewound resistors (manufactured by Vishay Electronics Foil Resistors, of Malvern, Pa., and Dale Electronics, of Norfolk, Nebr., respectively), but provide comparable time stability.

As shown in FIG. 1, also included in the exemplary embodiment are: memory means 19; computer means 20; and 8-bit analog to digital (A/D) converter means 17, with at least three input channels (connected to the output of high gain difference temperature amplifiers 7 and 7a and ambient temperature amplifier 13); and digital display means 20a. Computer means 20 and 8-bit A/D converter 17, with at least three input channels, are preferably combined within a single, low cost integrated circuit, such as a Philips 8XC749 microcontroller (manufactured by Philips Semiconductors, of Sunnyvale, Calif.). Additionally, timing means 18, capable of continuous battery powered operation, independently of other system components, determines elapsed time since the most recent reference calibration, and may also be used to determine elapsed time during system warm-up. Memory means 19 contains calibration data, as well as other data, used by computer means 20, with output from A/D converter 17 and timing means 18, to compensate for system time and temperature drift, while determining temperature differences between thermistors 3 and 4, as well as computing optimal system resolution limitations, responsive to current operating conditions.

In the embodiment of FIG. 1, measurement bridge 2 is powered by bridge voltage 21 (e.g., a battery), with ratiometric bridge output 22, routinely used in the art with A/D converters, so that variations in bridge voltage 21 are compensated in A/D converter 17. Alternatively, it will be appreciated by those skilled in the art that A/D converter 17 itself may output a reference signal voltage which can alternatively be used to provide bridge voltage 21.

With the resistance of time stable, wirewound, left bridge potentiometer 23 (time stable, metal film resistors may be substituted, depending on cost/accuracy trade-offs), substantially equal to the resistance of time stable, metal film, right bridge resistor 24, and the nominal resistance of left bridge thermistor 3 substantially equal to the nominal resistance of right bridge thermistor 4, then any temperature difference between thermistor 3 and thermistor 4 will appear as a small voltage difference between bridge nodes 11 and 12. Difference temperature amplifiers 7 and 7a can be connected to measurement bridge 2, via switches 10 and 10a, respectively, at nodes 11 and 12, as shown in FIG. 1, so that the voltage potential difference between nodes 11 and 12, corresponding to any said temperature difference between thermistors 3 and 4, is amplified and further processed in accordance with the present invention to provide a temperature difference measurement. Furthermore, since the preferred embodiment operates from a single power supply, in order to insure that a positive difference voltage between bridge nodes 11 and 12 is available for amplification under all conditions, difference temperature amplifiers 7 and 7a are connected to bridge nodes 11 and 12, with opposite polarity, as shown, and bridge potentiometer 23, and/or amplifier offset voltages are trimmed, such that at least one positive difference voltage between bridge nodes 11 and 12 is always available, throughout the expected ambient temperature range.

In the embodiment of FIG. 1, at least one of the thermistors 3 and 4 is also used to determine system ambient temperature, using ambient temperature amplifier 13, at substantially lower gain than that of difference temperature amplifiers 7 and 7a, said gain preferably being determined so that a useful span of ambient temperatures can be measured without clipping the ambient temperature signal. Over any given ambient temperature range, difference temperature (and other thermal offset curve) measurements of the embodiment of FIG. 1 will typically vary two to three orders of magnitude more slowly than ambient temperature measurements. This permits the gain of ambient temperature amplifier 13 to be two to three orders of magnitude lower than the gain of difference temperature amplifiers 7 and 7a, in order to achieve a given temperature difference measurement resolution. Consequently, it will be appreciated by those skilled in the art that the amplification gain of ambient temperature amplifier 13 may be one (1), for example, such that ambient temperature amplifier 13 operates as a voltage follower, or, alternatively, such that ambient temperature amplifier 13 may actually attenuate the signal representative of ambient temperature, i.e., possess an amplification gain of less than one (1). It will also be appreciated by those skilled in the art that in the case where a gain of one (1) is sufficient for the signal representative of ambient temperature, it is conceivable that the ambient temperature amplifier 13 can be eliminated, and the output of switch 14 can be connected directly to A/D converter 17, bypassing ambient temperature amplifier 13 in FIG. 1, such that switch 14 can be operated to connect A/D converter 17 to a signal from measurement node 11, representative of ambient temperature, or to reference node 15 for the purpose of generating offset curves associated with ambient temperature measurement. Additionally, it will be appreciated by those skilled in the art that since, as mentioned above for the preferred embodiment of FIG. 1, ambient temperature measurements can be made with lower gain than difference measurements in order to achieve a given temperature difference measurement resolution, offset errors associated with ambient temperature measurements have a smaller effect than offset errors associated with difference measurements, so that the above said offset curves associated with ambient temperature measurement, that would otherwise be used to compensate said errors associated with ambient temperature measurement, may conceivably be unnecessary to achieve a given temperature difference measurement resolution, in which case switch 14 may also be eliminated, such that a signal from measurement node 11, representative of ambient temperature, is connected directly to A/D converter 17, without the need to connect A/D converter 17 to reference node 15 for the purpose of generating the said offset curves associated with ambient temperature measurement. In any case, whether an ambient temperature amplifier 13 or a switch 14 is included in the circuit path between a signal representative of ambient temperature and A/D converter 17, the means through which a signal representative of ambient temperature is provided to A/D converter 17 is more generally referred to as the ambient condition signal means.

Ambient temperature amplifier 13 also receives a reference signal, preferably in the form of a reference voltage from reference node 16, which is determined by resistors 5 and 6 of reference bridge 1, such that ambient temperature amplifier 13 amplifies the voltage difference between nodes 11 and 16, or the difference between nodes 15 and 16 (depending on the state of switch 14), and with said resistors 5 and 6 chosen so that ambient temperature amplifier 13 realizes the greatest possible gain, and range, without clipping output signals, over the expected operating temperature span of the system. Thus, in the preferred embodiment, the gain of ambient temperature amplifier 13 is preferably fixed, and the reference voltage from reference node 16 is also preferably fixed. Nevertheless, those skilled in the art will recognize that the gain of ambient temperature amplifier 13, and/or the voltage of reference node 16, may economically be made adjustable, to increase the achievable gain and input range of ambient temperature amplifier 13, if desirable. The output signals of difference temperature amplifiers 7 and 7a and ambient temperature amplifier 13 are converted from analog to digital form, using A/D converter 17, so that these signals are available for further processing by computer means 20 and memory means 19.

In one modification of the embodiment shown in FIG. 1, substantially balanced bipolar power can be supplied to reference bridge 1 and measurement bridge 2. Accordingly, it will be appreciated by those skilled in the art that bridge resistances can be selected such that voltages from nodes 15 and 16 of reference bridge 1 and voltages from nodes 11 and 12 of measurement bridge 2 may be approximately zero volts (ground). Consequently, with node 16 at ground potential, a minimal voltage difference between said node 16 and node 11, as measured by ambient temperature amplifier 13 with switch 14 operated to connect said node 11 to ambient temperature amplifier 13, is obtained over a given ambient temperature range, thus maximizing the possible amplification factor which can be provided by ambient temperature amplifier 13 without exceeding its output voltage limitations, so as to avoid clipping the output signal of ambient temperature amplifier 13 at ambient temperatures within the said ambient temperature range. It will also be appreciated by those skilled in the art that nodes 15 and 16 can alternatively be shorted together and connected to a single reference signal, such as system ground, or that the reference signals from nodes 15 or 16 can alternatively be provided by a reference signal source, such as a digital to analog converter. Those skilled in the art will recognize that in the case in which nodes 15 and 16 are shorted together, the reference bridge resistances 5 and 6 become unimportant and, consequently, can conceivably be omitted.

As described above, low cost, time stable metal film resistors may be used in place of more expensive time and temperature stable resistors in the preferred embodiment of FIG. 1. Additionally, in order to facilitate low system cost, difference temperature amplifiers 7 and 7a and ambient temperature amplifier 13 and other circuit components need not be optimized for low drift, low input offset voltage, low common mode rejection (CMR), or, in the case of battery powered embodiments, in which battery voltage may vary over time, low power supply rejection (PSR). Neither is it necessary that nodes 11 and 12 be maintained near zero volts, in the interest of minimizing amplifier CMR, as is often the case in prior art, high resolution difference measurement systems utilizing a bridge circuit, which consequently also resort to the added expense and components of a bipolar supply voltage, or other costly additions to the measurement bridge. In the preferred embodiment of the present invention, operational amplifiers, such as those used for difference temperature amplifiers 7 and 7a and ambient temperature amplifier 13, bipolar power, thermal drift, offset voltage, PSR, and CMR requirements need not limit system design, permitting full attention to be paid during design, and component selection, to minimizing amplifier noise, and cost.

A preferred embodiment of the present invention (utilizing low cost amplifiers, such as OPA2234, manufactured by Burr-Brown Corporation, of Tucson, Ariz.) compensates for offset and gain drift due to component time and temperature drift, without requiring the use of expensive precision components, by operating in three modes, according to the preferred embodiment of the method of the present invention, which serve to compensate for both time and temperature drift, of active and passive components, including drift of amplifier CMR with time and temperature. These modes include a reference calibration mode, a standard calibration mode, and an operational mode, as described in greater detail below.

Generally, the reference calibration mode is performed at least once, following initial manufacture, and generates a set of thermal offset curves, specific to a particular system. These thermal offset curves measure system offset voltages versus ambient temperature, over the ambient temperature span in which the system is expected to operate.

The standard calibration mode is preferably performed once, each time the system is turned on, and corrects the thermal offset curves generated during the reference calibration mode for time drift, with few pre-programmed measurements, that can be performed quickly, without additional equipment, at the outset of a measurement session. If the standard calibration mode is not performed during one or more particular sessions, in which the system is in continuous operation, the system can automatically reduce resolution to anticipate potentially resulting errors that are calculable, based upon data acquired during previous operation of the system in the standard calibration mode.

In the operational mode, the embodiment of FIG. 1 continuously measures ambient temperature, using thermal offset curves corrected during the standard calibration mode for time and temperature drift, and correlates each actual ambient temperature measurement, acquired during a normal operation run, to an expected temperature difference measurement, if both thermistors were at the same temperature (also corrected, during operation in the standard calibration mode, for component drift). Said expected temperature difference measurement, if both thermistors were at the same temperature, serves as an offset to an associated actual temperature difference measurement, correcting said actual temperature difference measurement for the effects of component time and temperature drift, at the current ambient temperature. Additionally, during the operational mode, while performing measurements of temperature difference between thermistors 3 and 4, the preferred embodiment of the present invention automatically determines, for each measurement, the optimum achievable system accuracy, based upon current operating conditions.

Each of the above three modes of operation has a specific function in the method in accordance with the present invention, which is first generally described below, for each mode. A complete description of each mode of operation follows these general descriptions.

Figure 2:
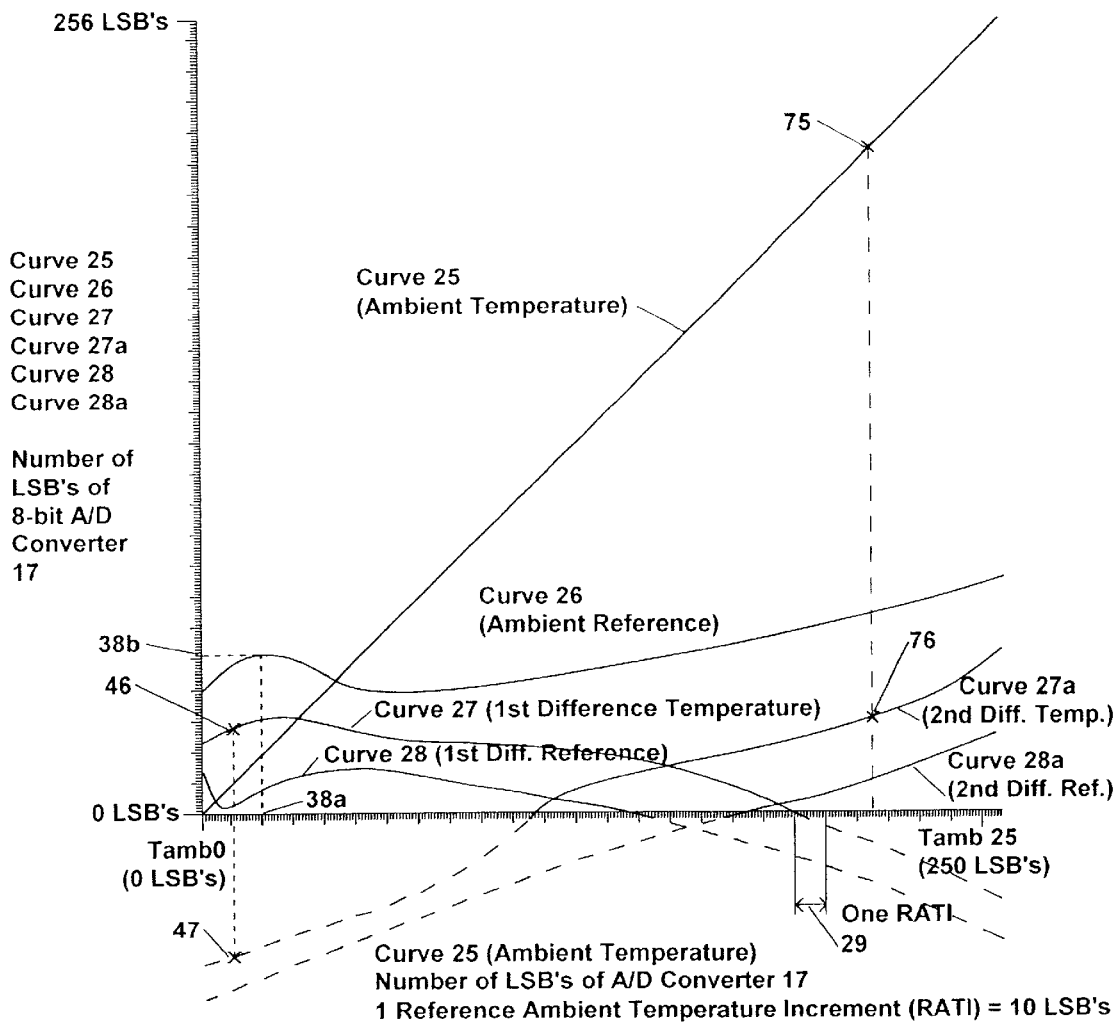
FIG. 2 illustrates a graph of the relationships between temperature calibration (offset) curves of various components of the circuit of FIG. 1, acquired in the reference calibration mode of the method of the present invention over an ambient temperature range.

Referring to FIGS. 1 and 2, the reference calibration mode (RCM) records data points in memory 19, corresponding to the various reference and temperature difference measurements performed by the embodiment of FIG. 1 versus ambient temperature (as amplified by ambient temperature amplifier 13), over the range of ambient temperatures in which the system is expected to operate. More specifically, these data points form curves, defining relationships between voltages representing ambient temperature, measured by ambient temperature amplifier 13, and the following:

a) a reference measurement from nodes 15 and 16, connected to ambient temperature amplifier 13 (corresponding to curve 26 in FIG. 2);

b) a reference measurement from bridge node 11, shorted to both inputs 8 and 9 of difference temperature amplifier 7 (via switch 10 in FIG. 1, and corresponding to curve 28 in FIG. 2);

c) another reference measurement from bridge node 11, shorted to both inputs 8a and 9a of difference temperature amplifier 7a (via switch 10a in FIG. 1, and corresponding to curve 28a in FIG. 2); and d) two temperature difference measurements, one for each of the difference temperature amplifiers 7 and 7a, representing a voltage difference between bridge nodes 11 and 12 over the range of temperatures in which the system is expected to operate (corresponding to curves 27 and 27a, respectively, in FIG. 2).

It is important to note that during RCM, both thermistors 3 and 4 (FIG. 1) are held at substantially the same temperature. This may be accomplished, for example, by holding thermistors 3 and 4 in close proximity or physical contact and/or in a homogeneous thermal environment, such as a constant temperature bath. The importance of holding thermistors 3 and 4 at substantially the same temperature during RCM relates to the fact that variance between thermistor resistance-temperature curve characteristics, even in well matched thermistors, will result in a variation in the measured temperature difference, between thermistors 3 and 4, over an ambient temperature range, even if the thermistors are held at exactly the same temperature. Nevertheless, it should be noted that variance between thermistor resistance-temperature curve characteristics occurs extremely slowly over ambient temperature. For example, if low cost, moderately matched thermistors are used, and said thermistors are held at the same ambient temperature, an ambient temperature change of 1 C° will correspond to a variation in temperature difference measurement of less than a few milli-degrees, but clearly, this is a significant amount in temperature difference measurements, with desired resolution on the order of micro-degrees centigrade. In part, to compensate for this effect, RCM generated curves 27 and 27a (FIG. 2) represent thermistor difference temperatures, corresponding to a zero temperature difference, over the ambient temperature range in which RCM is performed. During normal operation, these curves 27 and 27a are used to correlate a said zero temperature difference, as an offset voltage, to each measured temperature difference measurement, with said offset determined by measuring ambient temperature, and associating the measured ambient temperature with a corresponding said zero temperature difference offset, on curve 27 and/or 27a. That is, during RCM, with thermistors 3 and 4 at substantially the same temperature, any deviation from a zero temperature difference measurement, at a given ambient temperature, is an offset to the difference measurement, at said ambient temperature, which during normal operation is used to adjust measured temperature differences (at said ambient temperature) in order to compensate for non-matching temperature-resistance characteristics between thermistors 3 and 4, over the ambient temperature range in which operation in RCM was performed.

The present invention recognizes the fact that relationships between RCM generated curves drift over time, with respect to ambient temperature, in a predominantly linear fashion, to within a calculable accuracy. Consequently, though RCM generated curves are preferably acquired by cycling components of the embodiment of FIG. 1 through an expected operating range of ambient temperatures, said RCM generated curves need only be acquired once, or infrequently, when using resistive components whose temperature-resistance curves are substantially time stable (in contrast to resistance being stable with temperature, which is not necessary). Additionally, the RCM generated curves can be updated to reflect linear component drift over time, with a single measurement, in the standard calibration mode (described in more detail below), which can be performed almost instantly, in the field. To a high degree, gain drift over time, associated with the time drift of resistors and thermistors, is also substantially compensated by this method, since said gain drift is largely manifested as a linear translation of offset curves, and to a much smaller degree as a change in curve "shape". That is, linear translation of RCM generated offset curves, by the method of the present invention, substantially compensates both linear offset curve drift, and drift of passive components, normally associated with gain drift. The distinction between linear and non-linear curve drift, and how each is dealt with in the method of the present invention, is discussed in detail below, during the detailed description of the standard calibration mode (fourth step 213 in FIG. 12B). During normal operation, ambient temperature, and temperature difference measurements, acquired during the operational mode, also described in more detail later, proceed, utilizing RCM generated curves that have been adjusted for time drift during the standard calibration mode, such that normal operation proceeds without interruption for further time or temperature drift compensation. Errors associated with the above process are calculable, and vary with operating conditions, such as elapsed time since the most recent acquisition of RCM curves, current ambient temperature, measured curve trends, and elapsed time since power was applied to the system, which, once quantified, can be used to dynamically control system reporting to reflect accuracy limitations, as they change with the above system operating conditions.

The standard calibration mode (SCM) performs the function of adjusting the above acquired RCM generated curves for variation over time, preferably once, for each separate session during which the system is operated. SCM compensates for errors resulting from time drift of system components, by observing variations in the relationships of the RCM generated curves. This SCM compensation function can be performed at any single ambient temperature, and results in six data points being acquired, each said data point corresponding to a measurement for each of the six RCM generated curves, and such that each said data point is compared to its corresponding data points on previously acquired RCM generated curves.

Thermal offset curves associated with ambient temperature measurements (RCM generated curves 25 and 26 in FIG. 2) are substantially compensated for time drift, as a result of operation in SCM, at an arbitrary ambient temperature, by utilizing a measured ambient temperature point, corresponding to said arbitrary ambient temperature, positioned on the RCM generated ambient temperature curve 25, and then comparing a corresponding point to said measured ambient temperature point, said corresponding point situated on RCM generated ambient reference curve 26, with an actual measurement at said arbitrary ambient temperature, from ambient temperature amplifier 13, with switch 14 configured to connect both inputs of ambient temperature amplifier 13 to nodes 15 and 16 of reference bridge 1. The above actual and recorded measurement points, together with other point-to-point relationships between RCM generated curves 25 and 26, are used to effect a shift in the ambient temperature scale, relative to other RCM generated curves, including curves 27, 27a, 28, and 28a. The result of said shift is that the ambient temperature scale, against which all said thermal offset curves are measured, is shifted by the method of the present invention, utilizing the above mentioned points on both ambient reference curve 26 and ambient temperature curve 25, such that a substantial compensation is achieved for the ambient temperature amplification means, comprising ambient temperature amplifier 13 and associated feedback resistors, A/D converter 17, and passive measurement bridge components associated with the ambient temperature measurement, including resistors and thermistors.

Additionally, during operation in SCM, components associated with temperature difference amplification, including difference temperature amplifiers 7 (and 7a), and associated feedback resistors, are substantially compensated for drift, by comparing previously recorded points associated with the current said arbitrary ambient temperature (as measured on the ambient temperature scale, adjusted as above described) on the RCM generated difference reference curve 28 (and 28a), with a point acquired with switches 10 (and 10a) configured to re-acquire said point at the current ambient temperature (i.e., with switches 10 and 10a configured to connect all inputs of difference temperature amplifiers 7 and 7a to measurement bridge node 11). Combined with measurements at the current ambient temperature, that re-acquire points on the RCM generated difference temperature curve 27 (and 27a), and calculations that compare said re-acquired points with previously recorded points on said RCM generated difference temperature curve 27 (and 27a), at the current ambient temperature (as measured on the ambient temperature scale, adjusted as above described), the above described comparisons and calculations, involving RCM generated curves 28 (and 28a), and 27 (and 27a), are used to substantially compensate for component drift associated with the temperature difference measurements. Once again, it is important to note that during operation in SCM, both thermistors 3 and 4 (FIG. 1) are held at substantially the same temperature. The importance of holding thermistors 3 and 4 at substantially the same temperature during SCM is that the RCM generated curves 27 and 27a (FIG. 2) represent a zero difference temperature between thermistors, over the ambient temperature range in which RCM was performed, as described above. Therefore, in order for operation in SCM to adjust curves 27 and 27a at a given measured ambient temperature to reflect updated values for said curves 27 and 27a, at said measured ambient temperature, said operation in SCM must recreate the condition of zero temperature difference between thermistors 3 and 4, as when said curves 27 and 27a were initially acquired during operation in RCM.

During operation in SCM, RCM generated curves are corrected for linear time drift to within a quantifiable accuracy, described later in terms of an error quantity, referred to as translation error. SCM also dynamically calculates error tolerance from error sources, such as translation error, that are responsive to current operating conditions, such as ambient temperature, trends in translation error over time, and elapsed time since the last operation in RCM, so that estimates of system accuracy limitations are always optimized, during the operational mode, based upon current operating conditions, rather than being based upon generalized component drift specifications for the applicable temperature range. It will be appreciated that system accuracy limitations can be displayed, or used to actively system accuracy. Additionally, SCM tracks trends in component drift, so that sources of error related to random effects can be separated from sources of error which reflect a consistent shift in RCM generated curves, so that said RCM generated curves can be further compensated, resulting in improved accuracy without having to generate RCM curves. Finally, it will be appreciated that RCM generated curves acquired at different times, can be compared in order to quantify RCM curve drift over time, thus conceivably providing a means of predicting RCM generated curve drift over time without actually generating the RCM curves.

Primarily, the operational mode (OM) uses SCM time drift corrected curves to dynamically calculate temperature differences (between thermistors 3 and 4) to perform a high resolution differential temperature measurement. Specifically, each current ambient temperature measurement is associated with an accompanying temperature difference measurement, which, in turn, is additionally associated with an expected zero temperature difference measurement, reflecting the expected measured temperature difference if thermistors 3 and 4 were both held at said current ambient temperature. The expected zero temperature difference for the current ambient temperature is then effectively used to adjust the temperature difference measurement, acquired at the current ambient temperature, as a difference measurement offset, in order to accurately report the temperature difference between thermistors 3 and 4. Additionally, OM uses dynamic error tolerances calculated during SCM to automatically control reporting of temperature differences, such that said reporting reflects achievable accuracy, that is dynamically updated to reflect current operating conditions.

Reference Calibration Mode (RCM)

Referring to the graph of FIG. 2, RCM of the preferred embodiment of the method of the present invention serves as the initial step in compensating for offset and gain drift of system components due to time and temperature, by generating curves 25, 26, 27, 27a, 28, and 28a over a range of measured ambient temperatures, and correlating the discrete calibration points on these curves to said measured ambient temperatures, at which they were acquired. That is, each of the RCM generated curves 25, 26, 27, 27a, 28, and 28a represents a measured voltage (vertical axis) versus measured voltage of ambient temperature (horizontal axis), the latter as measured by ambient temperature amplifier 13 (FIG. 1). The embodiment shown in FIG. 1 is preferably operated in RCM, at least once, after manufacture. Subsequent operation in RCM may optionally be performed, as desired, to augment the more frequent operation in SCM (described in more detail later). It is also conceivable that curves generated by RCM may be acquired once for many systems (e.g., in which analog components are "matched" by the manufacturer), and hard-coded into memory 19 (FIG. 1), for all such devices. However, unless RCM curves are generated for a specific system, this would result in inaccuracy resulting from minor differences between identical components, in different systems, thus limiting achievable accuracy. Additionally, it is conceivable that individual system drift parameters may be hard-coded into memory 19 (FIG. 1) in order to characterize the performance of system components, such as thermistors, resistors, and amplifiers, over an intended operating temperature range. For example, thermistor resistance curves over temperature can be hard-coded into memory 19 (FIG. 1), using coefficients routinely specified for thermistors (see, for example, Philips Components Data Handbook PA02, 1995, page 75) or empirically determined for one or both thermistors 3 and 4, in order to permit a degree of interchangeability between thermistors used in similar systems, so that the behavior of one or both thermistors 3 and 4 can be anticipated using said coefficients, said anticipated behavior being applied along with the effects of other circuit components in order to generate said RCM curves, without necessarily requiring that the system be operated in RCM in order to accommodate particular thermistors.

Referring to FIGS. 1 and 2, in RCM the embodiment of FIG. 1 is preferably cycled through an expected range of ambient temperatures. Each said ambient temperature is measured, with switch 14 operated to connect ambient temperature amplifier 13 to bridge node 11, and for each ambient temperature measurement, a point is recorded (in memory 19) on ambient temperature curve 25 (FIG. 2). Additionally, for each said recorded point on ambient temperature curve 25, another measurement is recorded in memory 19 for each of the following:

a) ambient temperature amplifier 13, connected to reference nodes 15 and 16 (corresponding to ambient reference curve 26);

b) difference temperature amplifier 7, connected to bridge nodes 11 and 12 (corresponding to first difference temperature curve 27);

c) difference temperature amplifier 7, with both inputs connected to bridge node 11 (corresponding to first difference reference curve 28);

d) difference temperature amplifier 7a, connected to bridge nodes 11 and 12 (corresponding to second difference temperature curve 27a); and e) difference temperature amplifier 7a, with both inputs connected to bridge node 11 (corresponding to second difference reference curve 28a).

Referring to FIG. 2, curves 27 and 28 are approximately mirrored by curves 27a and 28a, respectively, about the horizontal axis. This reflects the way that difference temperature amplifiers 7 and 7a are connected to bridge nodes 11 and 12, with opposite polarity, as shown in FIG. 1. The intent of this, as briefly mentioned above, is to permit at least one of the difference temperature amplifiers 7 and 7a to always amplify a positive difference voltage. Additionally, to insure that offset errors for difference temperature amplifiers 7 and 7a are such that a positive difference voltage is always available from at least one of amplifiers 7 and 7a, said amplifiers 7 and 7a are preferably manufactured on a single silicon substrate (e.g., as a "dual" op amp, such as OPA2234, manufactured by Burr-Brown Corporation, of Tucson, Ariz.). An additional measure, to insure that at least one of the difference temperature amplifiers 7 and 7a always provides a positive difference voltage, is to introduce an artificial offset to said difference temperature amplifiers using an offset adjustment technique for operational amplifiers, which is well known to persons skilled in the art. Another conceivable alternative is to replace difference temperature amplifiers 7 and 7a with a single bipolar (positive and negative supply) amplifier, which would also necessitate the use of a bipolar A/D converter 17 and conceivably include bipolar power to measurement bridge 2 and reference bridge 1.

To summarize, referring to FIG. 2, ambient temperature curve 25 consists of measured ambient temperature calibration points, each correlated to a corresponding point on ambient reference curve 26; and to a point on each of the difference temperature curves 27 and 27a; as well as to a point on each of the difference reference curves 28 and 28a. Hence, to each ambient temperature calibration point generated in RCM on ambient temperature curve 25, five other points are correlated, one point for each of the other five RCM generated curves (26, 27, 27a, 28, and 28a), as shown in FIG. 2.

Referring to FIG. 2, in the preferred embodiment of the method of the present invention, measurement points for RCM generated curves are acquired over a range of discrete ambient temperatures, in the range $T_{amb0}-T_{amb25}$, corresponding to twenty-five equally spaced increments, each said increment corresponding to ten output levels of A/D converter 17 (FIG. 1). These output levels are measured in least significant bits (LSB's) of A/D converter 17, said A/D converter 17 having a full range of two-hundred and fifty-six LSB's, though for simplicity, in the preferred embodiment, only two-hundred and fifty of said LSB's are used for measuring ambient temperature. RCM is preferably performed in two phases: a measurement phase, followed by an analysis phase, both described in detail below.

Figure 12A:
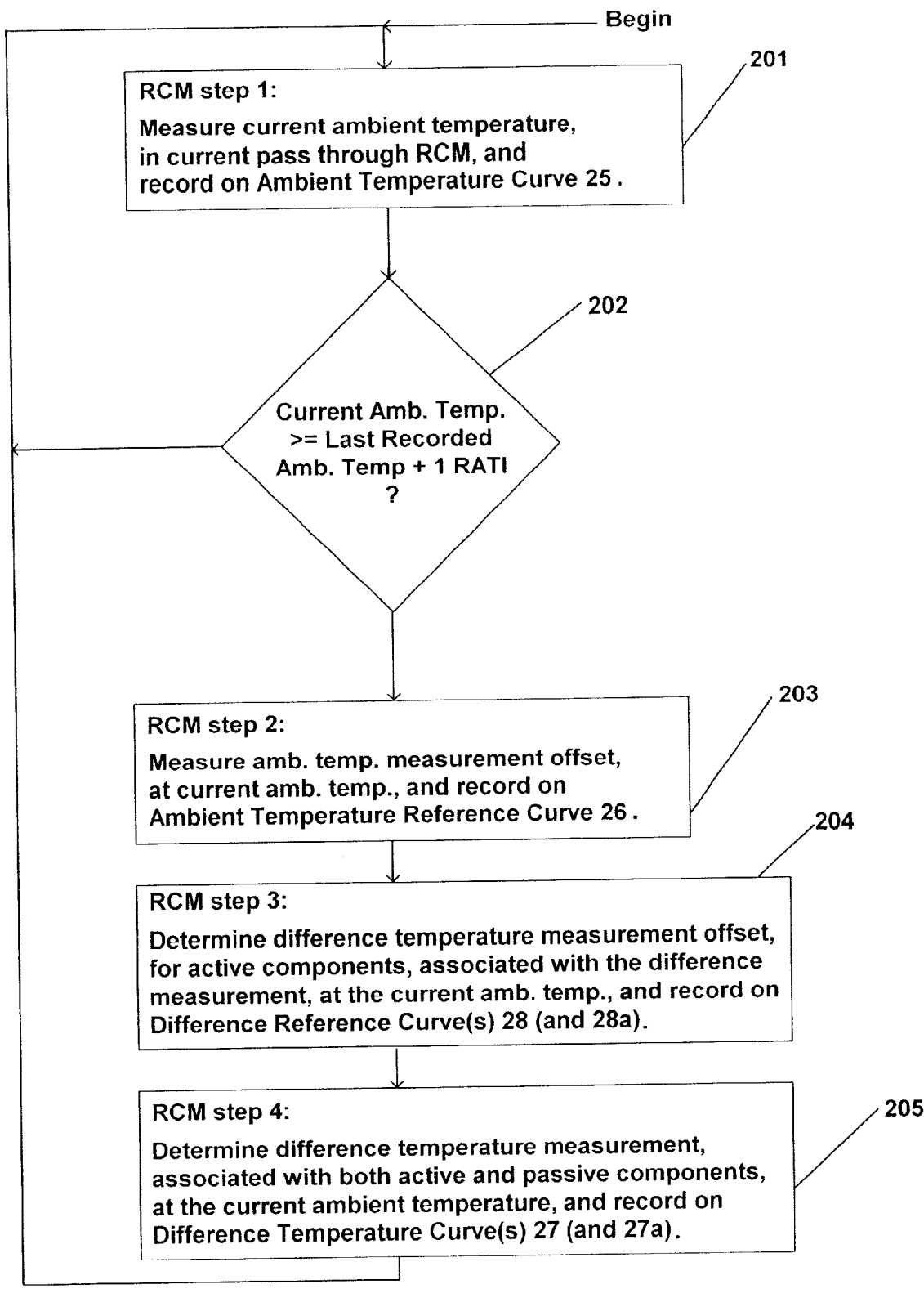
FIG. 12A is a flow diagram representing the steps involved in the preferred embodiment of the method of the present invention in the reference calibration mode.

Referring to FIG. 2, each of the following RCM steps of the RCM measurement phase, described below, is repeated in the following sequence, at each calibration temperature, each said calibration temperature associated with an ambient temperature calibration point on ambient temperature curve 25. The calibration temperatures are separated from one another by one reference ambient temperature increment (RATI), preferably defined as ten LSB's of A/D converter 17 (a typical RATI is identified as 29 in FIG. 2). However, it will be appreciated by those skilled in the art that the number of LSB's of A/D converter 17 associated with one RATI can be increased or reduced, with a resulting reduction or improvement in measurement accuracy, respectively. A flow diagram, generally representing each of the individual steps involved in operation of the preferred embodiment of the present invention in the reference calibration mode, is shown in FIG. 12A.

RCM Step 1 (201 in FIG. 12A): Referring to FIG. 1, switch 14 is operated, preferably by computer means 20, to connect ambient temperature amplifier 13 to bridge node 11, and the resulting signal from ambient temperature amplifier 13 is converted to digital form by A/D converter 17 and stored in memory 19, as the ambient temperature measurement to be associated with subsequent RCM measurements (RCM steps 2–4, corresponding to 203–205 in FIG. 12A, below), to be acquired at the present ambient temperature. Referring to FIG. 2, the curve eventually generated by points derived over successive operations in RCM, due to this RCM step 1 (201 in FIG. 12A), is hereafter referred to as the RCM generated ambient temperature curve 25.

RCM Step 2 (203 in FIG. 12A): Referring to FIG. 1, the offset of ambient temperature amplifier 13 at the present ambient temperature is next measured. To effect this measurement, switch 14 is operated, preferably by computer means 20, to connect reference voltages 15 and 16, determined by time stable resistors 5 and 6, to the inputs of ambient temperature amplifier 13. The resulting reference voltage measurement from ambient temperature amplifier 13 is converted to digital form by A/D converter 17 and stored in memory 19, as being associated with the current ambient temperature measurement, derived above, in RCM step 201. Referring to FIG. 2, the curve eventually generated by points derived over successive operations in RCM, due to this RCM step 203, is hereafter referred to as the RCM generated ambient reference curve 26. In the modified embodiment in which nodes 15 and 16 are shorted together as described earlier, whether said nodes 15 and 16 are connected to a single reference signal, such as system ground, or left floating, and switch 14 is operated to connect ambient temperature amplifier 13 to reference node 15, as above described for this RCM Step 2, both inputs to ambient temperature amplifier 13 are consequently shorted together, and ambient reference curve 26 is acquired in this configuration.

RCM Step 3 (204 in FIG. 12A): Next, referring to FIG. 1, switches 10 and 10a are operated, preferably by computer means 20, to connect both inputs (8 and 9) of difference temperature amplifier 7, and both inputs (8a and 9a) of difference temperature amplifier 7a, respectively, to bridge node 11, so that only offset voltages resulting from difference temperature amplifiers 7 and 7a and A/D converter 17 for the current ambient temperature measurement will be represented. These offset voltages are stored in memory 19 and associated with the current ambient temperature measurement, derived above, in RCM step 201. Referring to FIG. 2, the curve eventually generated, by points derived over successive operations in RCM, due to this RCM step 204, associated with difference temperature amplifier 7, is hereafter referred to as the first RCM difference reference curve 28. The curve eventually generated by points derived over successive operations in RCM (due to this RCM step 204), associated with difference temperature amplifier 7a, is hereafter referred to as the second RCM difference reference curve 28a. Note that when both inputs to difference temperature amplifier 7 or 7a are shorted to a single potential, or when both inputs to ambient temperature amplifier 13 are shorted to a single potential, for example, as described above in connection with RCM step 203, the said single potential is more generally referred to as a common signal.

RCM Step 4 (205 in FIG. 12A): Finally, referring to FIG. 1, switches 10 and 10a are operated, preferably by computer means 20, to reconnect the two inputs 8 and 9 of difference temperature amplifier 7, and the two inputs 8a and 9a of difference temperature amplifier 7a, respectively, to separate bridge nodes 11 and 12, such that both difference temperature amplifiers 7 and 7a amplify the voltage difference between said bridge nodes 11 and 12. The resulting difference voltages from difference temperature amplifiers 7 and 7a, after being converted to digital form by A/D converter 17, are then stored in memory 19 and associated with the current ambient temperature measurement, derived above, in RCM step 201. Note that the first difference temperature amplifier 7 is configured to amplify the voltage difference of node 11, minus that of node 12, while the second difference temperature amplifier 7a is configured to amplify the voltage difference of node 12, minus that of node 11, to insure the consistent availability of a positive difference voltage, as described above. Referring to FIG. 2, the curve eventually generated by points derived over successive operations in RCM, due to this RCM step 205, associated with the first difference temperature amplifier 7, is hereafter referred to as the first RCM difference temperature curve 27. The curve eventually generated by points derived over successive operations in RCM (due to this RCM step 205), associated with the second difference temperature amplifier 7a, is hereafter referred to as the second RCM difference temperature curve 27a.

As briefly described above, both thermistors 3 and 4 (FIG. 1) are configured to experience substantially the same temperature throughout the RCM operation. This is preferably accomplished by placing thermistors 3 and 4 in an assembly which mechanically places them together during RCM, in such a way as to facilitate good thermal contact, preferably packed within a thermally conducting sleeve, with said sleeve surrounding, and in physical contact with, both thermistors 3 and 4, so that they experience substantially the same temperature. The quality of this contact will, in part, determine the error implicit in subsequent difference measurements between thermistors 3 and 4. For example, if the maximum possible temperature differential between thermistors 3 and 4, while in thermal contact during RCM and due to less than perfect thermal contact, is one micro-degree centigrade, then one micro-degree centigrade will be a practical limit to reliable temperature compensation, in subsequent temperature difference measurements, based upon these calibrations. A conceivable alternative, to enhance or replace physical thermal contact during operation in RCM, is to place the embodiment of FIG. 1 in a substantially homogeneous thermal environment, such as a constant temperature bath during RCM, and slowly ramp the temperature of the bath, from one end of the expected ambient temperature range to the other.

Referring to FIG. 1, in order to increment the temperatures at which RCM calibration points are acquired, computer means 20 monitors the output from ambient temperature amplifier 13 until a specified RCM generated ambient temperature increment (RATI, e.g., 29 in FIG. 2) exists between the last ambient temperature measurement and a current ambient temperature measurement. Note, as mentioned above, that one RATI in FIG. 2 is designated to be ten LSB's of A/D converter 17, as indicated on the horizontal axis of FIG. 2. When said increment of one RATI exists between the last ambient temperature measurement and a current ambient temperature measurement, the RCM process is repeated (beginning at RCM step 201, as indicated at 202 in FIG. 12A), such that each time the RCM process is repeated, a new set of six calibration points is acquired, one said calibration point for each of the six RCM generated curves 25, 26, 27, 27a, 28, and 28a in FIG. 2, at said current ambient temperature.

In order to determine when to terminate the RCM process, computer means 20 (FIG. 1) uses timer 18 to determine if sufficient time has elapsed since the last RCM generated ambient temperature measurement, during which ambient temperature has not incremented by at least one RATI 29 (FIG. 2), to indicate that the current ambient temperature is the maximum currently available. If this is the case, computer means 20 terminates the measurement phase of RCM.

Referring to FIG. 2, note that vertical axis units (LSB's) are the same as horizontal axis units, and that the horizontal axis is a measurement of the current ambient temperature (also represented by ambient temperature curve 25), and the vertical axis measures each of the curves 25, 26, 27, 27a, 28, and 28a at said current ambient temperature. Referring to FIG. 1, these curves are related to ambient temperature, as in the following example. In order to know the value of the expected ambient reference measurement (from ambient temperature amplifier 13 when said amplifier is connected via switch 14 to node 15) on ambient reference curve 26 in FIG. 2, at an ambient temperature, indicated by the dashed line 38a, on the horizontal axis (at two RATI's, or twenty LSB's of A/D converter 17), one can draw a vertical line through 38a, as shown, to the intersection with ambient reference curve 26, and at said intersection, draw a horizontal line to point 38b, on the vertical axis, as shown (corresponding to a measurement of roughly fifty-one LSB's of A/D converter 17, as shown). Hence, referring to FIG. 2, the RCM ambient reference measurement, correlated with ambient temperature 38a, is 38b. Similarly, each of the curves 26, 27, 27a, 28, and 28a can be associated with an ambient temperature measurement.

After initially operating the system in RCM, following manufacture, RCM may conceivably be performed in the field, as desired to occasionally augment SCM (described in more detail below), without the use of a temperature controlled environment (such as a constant temperature bath). This is preferably accomplished by allowing the embodiment of FIG. 1 to cool in a readily available cold environment (e.g., a refrigerator, or melting ice) and subsequently allowing it to warm to room, or other available, ambient temperature. These cooling and warming processes can conceivably be conducted by placing the embodiment of FIG. 1 in a box that is moderately insulated, permitting said embodiment to cool and warm more slowly and uniformly.

During the analysis phase of RCM, computer means 20 (FIG. 1) uses data points generated for the six curves, in the measurement phase of RCM, to better describe these curves, so that interpolations between discrete points can readily be made during normal operation, in order to minimize calculations necessary during normal operation, and to facilitate more exact measurements. The simplest approach is to organize only the existing calibration points for each of the six curves, so that the voltage associated with any ambient temperature measurement (on ambient temperature curve 25 in FIG. 2) is readily correlated to its five associated points on the other five curves. Then during normal operation, any intermediate point, between two calibration points for a given curve, acquired during RCM, can readily be interpolated linearly, using the equation of the line defined by the said two calibration points, surrounding said intermediate point. Alternatively, a polynomial expansion may be created during the analysis phase of RCM, for each of the six curves, using a curve fitting method, such as the least squares method, well known to persons skilled in the art, to fit a curve to discrete data.

Achievable system accuracy depends in part on which of the available analysis methods (e.g., linear interpolation or polynomial expansion) is used, and the number of points involved. In the following discussions, linear interpolations are used to describe points along curves, situated between measured calibration points. This results in a linear interpolation error, distinct from such errors associated with other curve fitting methods. Accordingly, the method of the present invention preferably strives to take a sufficient number of calibration points to minimize, or negate, the effects of linear interpolation error.

Standard Calibration Mode (SCM)

Figure 12B:
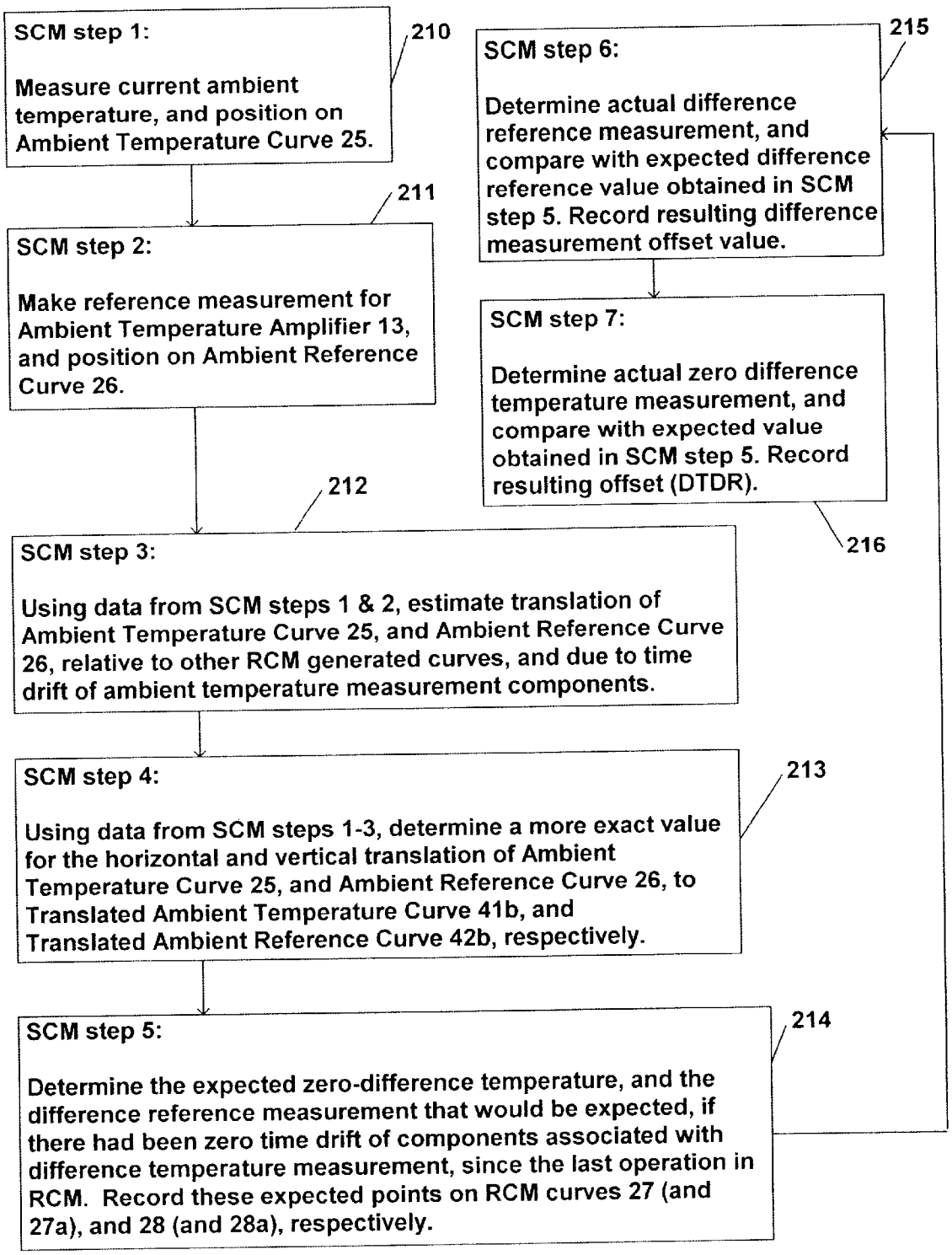
FIG. 12B is a flow diagram representing the steps involved in the preferred embodiment of the method of the present invention in the standard calibration mode.

Referring to FIG. 2, the preferred embodiment of the method of the present invention in SCM adjusts the positions of the above described RCM generated curves 26, 27, 27a, 28, and 28a relative to ambient temperature curve 25, in order to compensate for time drift of said RCM generated curves 26, 27, 27a, 28, and 28a relative to said ambient temperature curve 25. Since SCM compensation compensates for time drift, which is generally small compared to other forms of component drift (e.g., thermal offset drift), over a typical period (for example, a few days) between consecutive uses of the embodiment of FIG. 1, said SCM compensation need not be performed frequently. Additionally, it is an advantage of the present invention that said RCM generated curves, which vary relative to one another in a predominantly linear fashion over time, consequently permit a single operation in SCM, at a single arbitrary ambient temperature, which is sufficient to accurately adjust the relative positions of said curves, with respect to ambient temperature curve 25, across the temperature range of operation, for a given session of operation. Said compensation for time drift of system components is performed to within an estimable accuracy, to which normal operation will subsequently be limited. (See SCM steps 213 and 216, below.) The estimable accuracy, at any time during operation, is based upon several factors, which it is also the function of SCM to calculate, including, and based upon:

a) elapsed time since the last operation in RCM, relating to non-linear curve drift over time (i.e., change in curve "shape"), and later referred to as translation error (discussed in detail in connection with SCM step 213 in FIG. 12B);

b) method used to describe RCM generated curves, and the number of points used to describe those curves (referred to above as interpolation error); and c) current warm-up status (based upon elapsed time since power-on).

SCM is preferably initiated only once, during each period of continuous operation, preferably shortly after power is applied to the system components, permitting active components to warm up. Thermistors 3 and 4 in FIG. 1 must be at substantially the same temperature during operation in SCM, in order to effect a measurement that can be compared to RCM measurements taken earlier, under the same circumstances of substantially equal temperature between thermistors 3 and 4, as described above. Preferably, thermistors 3 and 4 are normally in close enough proximity to permit a mechanical assembly to place thermistors 3 and 4 in good thermal contact, temporarily, during SCM (e.g., packed within a thermally conducting sleeve), so that said thermistors experience the same temperature, as described above. Alternatively, a thermally homogeneous environment, such as a constant temperature bath, or even melting ice, can be used to help maintain thermistors 3 and 4 at substantially the same temperature during SCM. After operation in SCM, the RCM generated curves will have been repositioned, relative to ambient temperature, thus compensating for time drift of said curves, so that regular measurements of ambient temperature, during the operational mode, using one of thermistors 3 or 4 subjected to ambient temperature (thermistor 3 in the preferred embodiment of FIG. 1), is sufficient to determine drift-corrected ambient temperature, and thus permits accurate temperature difference measurements (between thermistors 3 and 4), on the order of micro-degrees centigrade, without the need for operating in SCM again during a continuous period of operation. Since operation in SCM is preferably conducted only once during a session of operation of the embodiment of FIG. 1, at a single, arbitrary ambient temperature, and practically instantaneously, SCM need not noticeably delay normal system operation (which subsequently continues without interruption), beyond considerations associated with holding thermistors 3 and 4 at substantially the same temperature during the brief period associated with SCM. A flow diagram, generally representing each of the individual steps involved in operation of the preferred embodiment of the present invention in the standard calibration mode, is shown in FIG. 12B. SCM consists of seven steps, described as follows.

Figure 3:
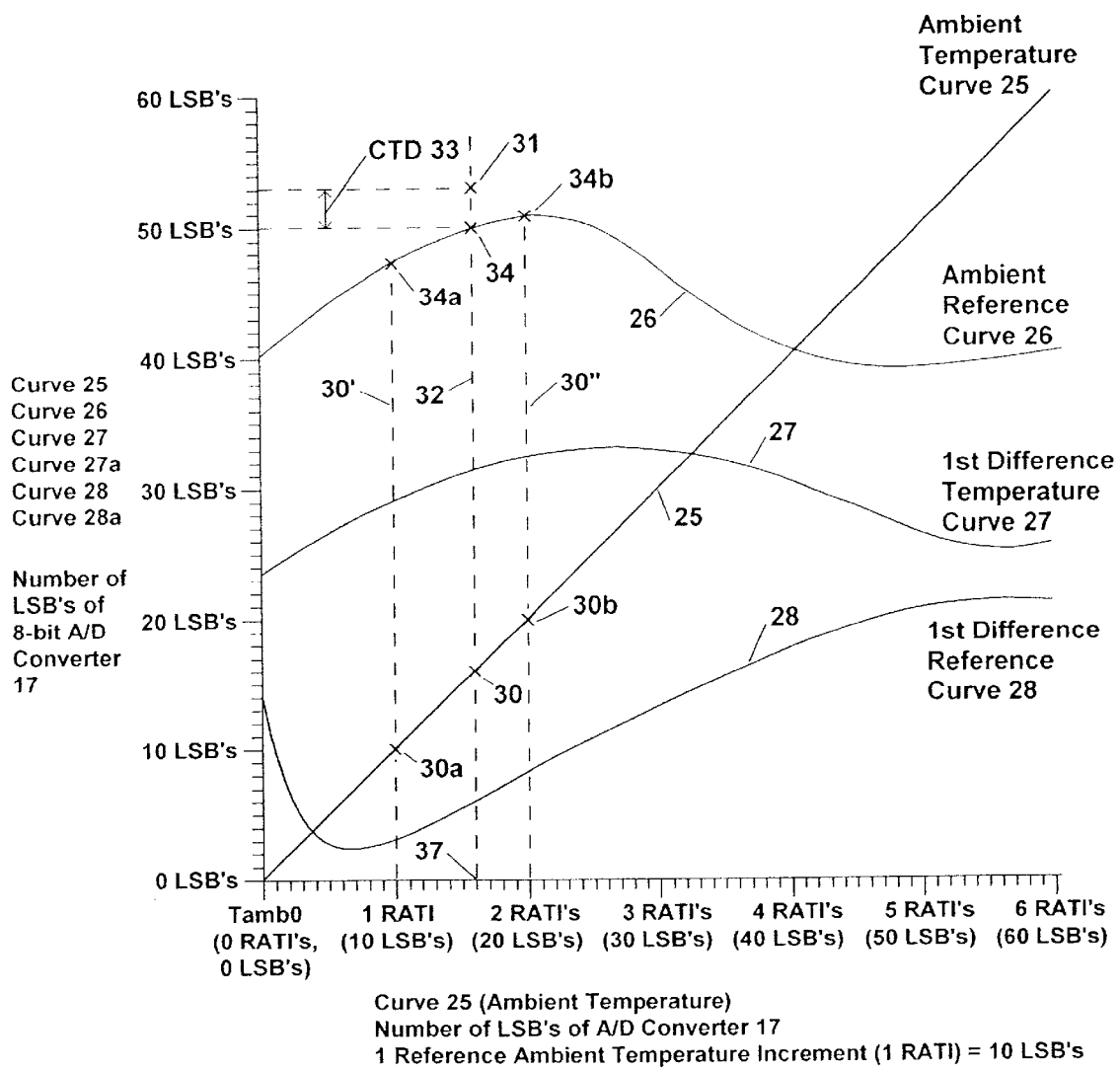
FIG. 3 is a detailed view of the lower left portion of the graph of FIG. 2, and illustrates the relationships between reference and temperature data points, associated with temperature calibration (offset) curves, acquired from an ambient temperature amplifier, in order to estimate component time drift affecting ambient temperature measurements, in accordance with the fourth step of the method of the present invention in the standard calibration mode.

SCM step 1 (210 in FIG. 12B): First, an ambient temperature measurement is acquired. Referring to FIG. 1, switch 14 is operated to connect ambient temperature amplifier 13 to bridge node 11, resulting in an ambient temperature measurement voltage from A/D converter 17, referred to hereafter as ambient temperature point 30, as shown in FIG. 3 (FIG. 3 depicts an expanded portion of the lower left corner of the graph of FIG. 2). Said ambient temperature point 30 is stored in memory 19, and is subsequently available for processing. For the purpose of the following description of operation in SCM, said ambient temperature point 30 is placed on ambient temperature curve 25, as shown, such that said point's horizontal and vertical axis coordinates correspond to the same measurement (in the present example, this measurement is 1.6 RATI's, or sixteen LSB's, as shown in FIG. 3). Referring to FIG. 1, note that reference node 16 is always connected to ambient temperature amplifier 13, such that in this SCM step 210, the output of ambient temperature amplifier 13 is the amplified difference between the voltage at bridge node 11 and the voltage at reference node 16.

SCM step 2 (211 in FIG. 12B): Next, a substantially time stable (in contrast to time and temperature stable) reference measurement is acquired for ambient temperature amplifier 13, that will contribute to compensation for drift of the ambient temperature curve 25 (FIG. 3) relative to other RCM generated curves. Referring to FIG. 1, during SCM step 211, switch 14 is operated to connect ambient temperature amplifier 13 to reference node 15, so that the output of ambient temperature amplifier 13 is the amplified difference between the voltage at reference node 15 and the voltage at reference node 16. The resulting reference measurement voltage, converted to digital form by A/D converter 17, hereafter referred to as ambient reference point 31 in FIG. 3, and more generally referred to as an actual ambient reference, is stored in memory 19.

Additionally, again referring to FIG. 3, for the purpose of the following description of operation in SCM, said ambient reference point 31 is placed directly on the vertical line 32, associated with ambient temperature point 30, acquired above, during SCM step 210, as shown. Note that ambient reference point 31 is not situated directly on ambient reference curve 26, representing a time drift of said ambient reference curve 26 relative to ambient temperature curve 25. If there were zero time drift of components associated with the ambient temperature measurement, then measured ambient reference point 31 would have been placed at the position of point 34 on ambient reference curve 26. The difference between points 31 and 34 will serve below to illustrate an initial, estimated time drift adjustment, in SCM step 212, which is later made more exact during SCM step 213.

Also, referring to FIG. 1, in the following description it is assumed that the ambient temperature, as detected by bridge node 11, is sufficient to describe ambient temperature. However, it will be appreciated that ambient temperature, as detected by either, or both, bridge nodes 11 and 12, or even an additional temperature sensor, could conceivably be used for this purpose. It will also be appreciated that said additional temperature sensor could conceivably be connected in series with a resistor, and said series-connected additional temperature sensor and resistor connected in parallel with other series-connected thermistor-resistor pairs (e.g., thermistor 4 and resistor 24) across measurement bridge voltage 21. It will also be appreciated by those skilled in the art that the use of an additional temperature sensor, and resistor, if said additional sensor is a thermistor, with substantially the same time drift characteristics as thermistors 3 and 4, could be used to acquire an additional thermal offset curve, over an ambient temperature range, which conceivably could be used to provide additional time drift compensation for measurement thermistors 3 and 4.

SCM step 3 (212 in FIG. 12B): Referring again to the graph of FIG. 3, depicting an expanded view of the lower left portion of FIG. 2, recall that ambient temperature point 30, acquired above during SCM step 210 and placed on ambient temperature curve 25, was associated during SCM step 211 with ambient reference point 31, as indicated by dashed connecting line 32, which connects points 30, 31, and 34. In this SCM step 212, the translation of RCM generated curves 25 and 26, due to component time drift, is estimated. This translation is relative to other offset curves acquired during RCM, and following the estimation of said translation in this SCM step 212, said translation is made more exact, during SCM step 213.

Referring to FIG. 3, the above said translation will correct discrepancies, due to ambient temperature measurement time drift, in correlations between ambient temperature points with points on other RCM generated curves (such as temperature difference offset curves, data points on which are associated with specific ambient temperature points on ambient temperature curve 25, as described above). Said discrepancies, due to time drift in components associated with the ambient temperature measurement, if not compensated, would result in an incorrect ambient temperature measurement, and consequently, for example, an incorrect correlation to expected zero temperature difference measurements associated with temperature difference curves 27 and 27a (FIG. 2).

Referring to FIG. 3, in order to effect the estimated translation of ambient temperature curves, relative to other RCM generated curves, points 30, 31, and 34 are used to initially estimate time drift of components associated with the ambient temperature measurement (e.g., ambient temperature amplifier 13, A/D converter 17, thermistors 3 and 4, and bridge resistors). Recall that although to a lesser degree than in offset drift, gain drift, over time, usually associated with resistor and thermistor time drift, is manifested in a predominantly linear translation of offset curves, relative to one another, in contrast to a change in curve "shape". The estimated translation is accomplished by first determining, based upon the voltage level of ambient temperature point 30, where one would expect the current ambient reference point 31 to have been measured, if there were zero time drift of components associated with the ambient temperature measurement since the last RCM operation, i.e., point 34, generally referred to as an estimated ambient reference, on ambient temperature reference curve 26. The discrepancy between point 34 and the measured voltage level of ambient reference point 31, acquired during SCM step 211, above, is used to estimate said time drift, as described below.

Recall that each discrete point generated during RCM, on any RCM generated curve, is associated in memory 19 (FIG. 1) with one point, referring to FIG. 3, on ambient temperature curve 25, representing the measured ambient temperature at which said discrete point was acquired. Referring to FIG. 3, the voltage level associated with measured ambient temperature point 30, provided by A/D converter 17 (FIG. 1), for indicating ambient temperature, is situated between known calibration points 30a and 30b, both acquired during RCM (RCM step 201), on ambient temperature curve 25, as shown. Note that both points 30a and 30b were each associated during RCM, in memory 19, with specific points 34a and 34b, respectively, on RCM generated ambient reference curve 26, as depicted by dashed connecting lines 30' and 30", respectively. Note also that ambient temperature point 30 itself is not associated with a specific calibration point on RCM generated ambient reference curve 26, because it is situated between calibration points, as shown. Therefore, in order to correlate ambient temperature point 30 on RCM generated ambient temperature curve 25 to a corresponding point on RCM generated ambient reference curve 26, as required by SCM step 212 to determine where one would expect the current ambient reference point 31 to be, if there were zero time drift of components associated with the ambient temperature measurement since the last RCM operation (i.e., the exact position of point 34), it is necessary to determine the relative position of ambient temperature point 30, between known calibration points 30a and 30b, on RCM generated ambient temperature curve 25. In the present example, ambient temperature point 30 is 60% of one RATI between calibration points 30a and 30b on RCM generated ambient temperature curve 25, as shown. The fraction of 60% is hereafter referred to as an interpolation fraction, and is used to estimate the point corresponding to current ambient temperature on RCM generated ambient reference curve 26 between known ambient reference calibration points 34a and 34b, where one would expect the current actual ambient reference point 31 to be, if there were zero time drift of all components associated with the ambient temperature measurement since the last RCM operation, said estimated ambient reference point represented in FIG. 3 as point 34. The difference between said actual ambient reference point 31 and said estimated ambient reference point 34, considered at this stage to approximate the time drift associated with components associated with ambient temperature measurement detected via bridge node 11, is identified in FIG. 3 as component time drift (CTD) 33.

Note that in FIG. 3 calibration points are spaced relatively far apart, in order to better illustrate the method for drift compensation. It will be appreciated by those skilled in the art that in practice, as mentioned briefly above, the embodiment of the present invention will strive to acquire a sufficient number of calibration points, during RCM, such that interpolation error is minimized in all measurements.

Referring to FIG. 1, note also that low time drift, metal film reference resistor 5 and wirewound potentiometer 6 of reference bridge 1, generating ambient reference potentials 15 and 16, are maintained near the common mode voltage of ambient temperature amplifier 13, in order to minimize the effect of possible time drift of amplifier common mode error for the common mode range of input voltages, potentially seen by ambient temperature amplifier 13, when connected to bridge node 11. That is, the possible time drift of common mode error, which may vary according to the common mode voltage seen by ambient temperature amplifier 13, is minimized by adjusting the resistance values of resistors 5 and/or 6, such that the voltage level at node 15 is as close as practicable to voltage levels of bridge node 11, over the expected operating temperature range of the embodiment of FIG. 1. Additionally, as mentioned above, this is preferably done such that the gain of ambient temperature amplifier 13 can be maximized, without clipping the differential signal from ambient temperature amplifier 13, representing the amplified voltage difference between nodes 11 and 16, and so that neither the gain of ambient temperature amplifier 13, nor the voltage associated with reference node 16, need be variable. Nevertheless, those skilled in the art will appreciate that such solutions as variable gain are conceivable, and could be implemented economically. However, as noted above, though not apparent from thermal offset curves, as depicted in FIGS. 2–8 and 10–11, over any given ambient temperature range, zero difference temperature (and other thermal offset curve) measurements of the preferred embodiment of FIG. 1 typically vary two to three orders of magnitude more slowly than ambient temperature measurements. This permits the gain of ambient temperature amplifier 13 to be two to three orders of magnitude lower than the gain of difference temperature amplifiers 7 and 7a, in order to achieve a given temperature difference measurement resolution.

Additionally, referring to FIG. 3, recall that CTD 33 currently only provides an estimate of component time drift associated with the ambient temperature measurement. CDT 33 is preferably made more accurate below during SCM step 213.

SCM step 4 (213 in FIG. 12B): Referring to FIG. 3, in this SCM step 213, RCM generated ambient temperature curve 25 and RCM generated ambient reference curve 26 are translated relative to other RCM generated curves, in order to compensate for error due to ambient temperature measurement time drift (estimated above during SCM step 212 as CTD 33). This is accomplished in this SCM step 213 by making CTD 33 more exact, and then executing the translations of ambient temperature curve 25 and ambient reference curve 26, accordingly, relative to other RCM generated curves, so that expected measured values on said other RCM generated curves can accurately correspond to measured ambient temperature values at the time SCM is performed, and shortly thereafter (during the operational mode), such that time drift of said other RCM generated curves, relative to measured ambient temperature, is substantially compensated. Additionally, the use and derivation of translation error (error associated with the translation of curves), is later described.

Figure 4:
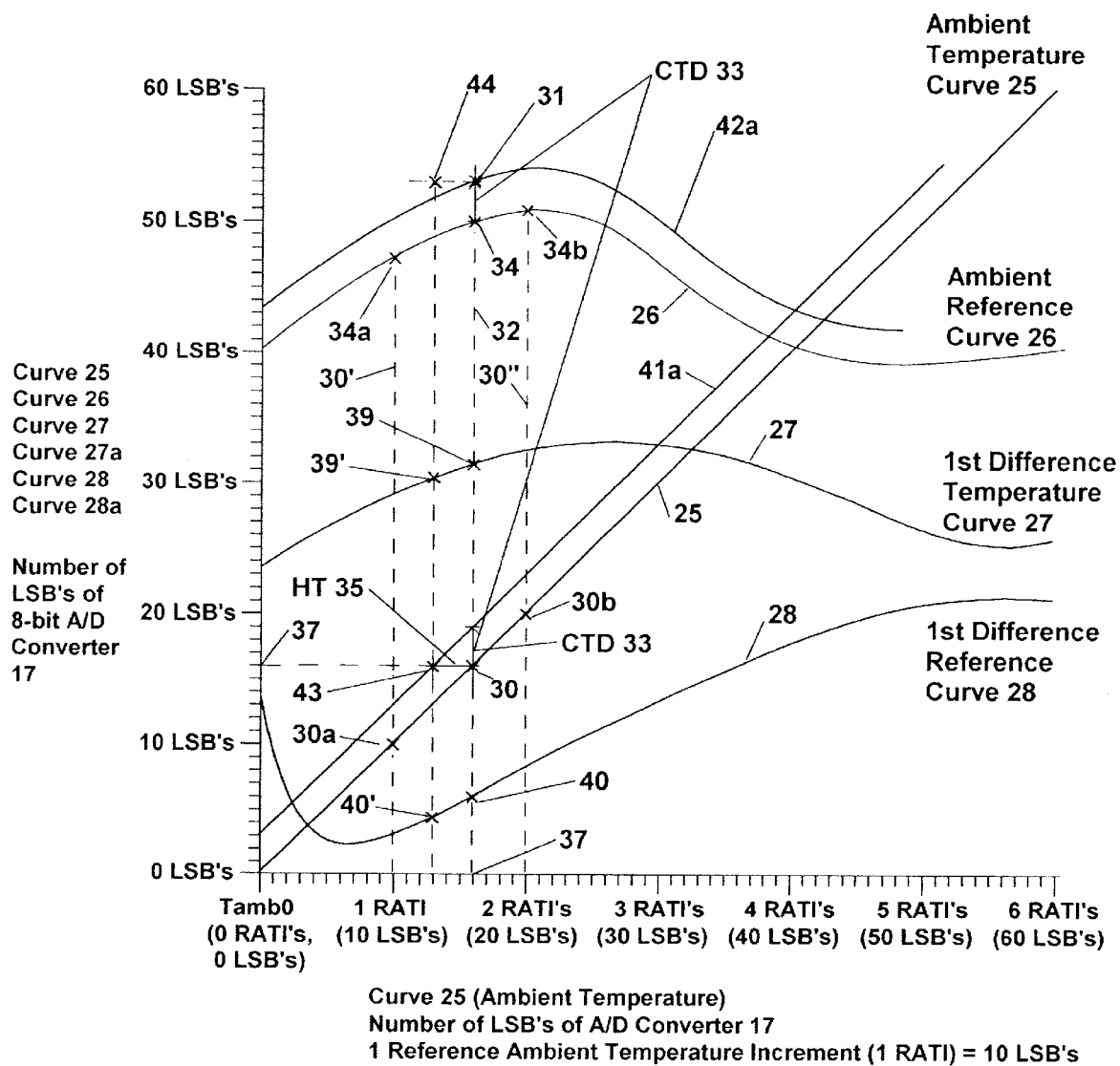
FIG. 4 is a detailed view of the lower left portion of the graph of FIG. 2, and illustrates calculations involved in the initial vertical and horizontal translation of ambient temperature curves, to approximate time drift compensation for the ambient temperature measurement, in accordance with the fourth step of the method of the present invention in the standard calibration mode.

Referring to FIG. 4, depicting the measurements last acquired, above, during SCM step 212 in connection with FIG. 3, ambient temperature curve 25 and ambient reference curve 26 are first translated vertically, in the following analysis, by the amount initially approximated above by CTD 33. This vertical translation serves as an initial approximation of ambient temperature measurement time drift, that will later facilitate a more exact calculation of the extent to which RCM generated curves 27, 27a, 28, and 28a (FIG. 2) are horizontally translated, relative to RCM generated ambient temperature curve 25, so that subsequent ambient temperature measurements will be corrected for said time drift.

Referring to FIG. 4, RCM generated curves 25 and 26 are first translated vertically, by the amount CTD 33, determined above during SCM step 212. The new curves are identified in FIG. 4 as SCM translated ambient temperature curve 41a and SCM translated ambient reference curve 42a, respectively. This vertical translation will facilitate an approximation as to the horizontal translation of ambient temperature curve 25 and ambient reference curve 26, required to compensate for time drift of active and passive components associated with ambient temperature measurement.

Next, again referring to FIG. 4, the positions of ambient temperature point 30 and ambient reference point 31 are horizontally translated by amount horizontal translation (HT) 35, more generally referred to as an ambient signal offset, such that they are re-positioned close to newly translated curves 41a and 42a, respectively. The horizontal translation is a direct consequence of vertical translation of ambient temperature curve 25 and ambient reference curve 26 by amount CTD 33, as described above, and is conducted such that the values of ambient temperature point 30 and ambient reference point 31, as measured on the vertical axis, remain constant throughout said horizontal translation, i.e., reflecting the fact that their measured (Y-axis) values are preserved throughout the translation. Additionally, the positions of ambient temperature point 30 and ambient reference point 31 retain equal X-axis coordinates throughout the horizontal translation, as shown, reflecting the fact that they continue to represent measurements at a single, equal ambient temperature throughout the translation. The new, translated points formerly associated with points 30 and 31 are identified as translated ambient temperature point 43 and translated ambient reference point 44, respectively, after HT 35, as shown in FIG. 4. Note that HT 35, applied during this SCM step 213, is an approximation that can be useful to initially localize the current ambient temperature on offset curves that can conceivably, in the general case, be high order functions of ambient temperature. Consequently, it is useful to initially localize the current ambient temperature on the graph of FIG. 4, as described above, in contrast to skipping the initial localization and simply applying a function to translate RCM generated curves 25 and 26 to "fit" the measured ambient temperature and ambient reference points 30 and 31, respectively.

Referring to FIG. 4, it should also be noted that initially approximated HT 35, of ambient temperature curve 25, would have the following effect on subsequent measurements (HT 35 is made more exact later). Prior to horizontal translation, HT 35, with ambient temperature point 30 being associated with horizontal axis measurement 37, the expected difference measurement between bridge nodes 11 and 12 with thermistors 3 and 4 at the same temperature would be associated with point 39 in FIG. 4, as shown on the first difference temperature curve 27 from difference temperature amplifier 7. Also, the expected difference reference measurement would be associated with point 40 in FIG. 4, as shown on the first difference reference curve 28 from difference temperature amplifier 7. Additionally, the expected ambient reference measurement would be associated with point 34 in FIG. 4, as shown on ambient reference curve 26 from ambient temperature amplifier 13.

Referring to FIG. 4, following the application of HT 35, resulting from vertical translation of ambient temperature curve 25 and ambient reference curve 26 by amount CTD 33, if the same ambient temperature associated with horizontal axis point 37 is measured, now corresponding to ambient temperature point 43 on SCM translated ambient temperature curve 41a, then the expected zero difference temperature measurement between bridge nodes 11 and 12 with thermistors 3 and 4 at the same ambient temperature would be 39' on the first difference temperature curve 27 from difference temperature amplifier 7. Also, the expected difference reference measurement would be 40' on the first difference reference curve 28 from difference temperature amplifier 7. Additionally, the expected ambient reference measurement would be 44, as shown. However, note that point 44 is not precisely situated on translated ambient reference curve 42a. This reflects a discrepancy, that is resolved below, with methods for determining HT (so far approximated by HT 35) more precisely, so that points 30 and 31 are translated to both be situated substantially on translated ambient temperature and translated ambient reference curves (so far approximated by curves 41a and 42a, respectively).

Referring to FIG. 4, one way to determine the above vertical translations of ambient temperature curve 25 and ambient reference curve 26 associated with SCM step 213, such that points 30 and 31 can both be translated horizontally to be situated more precisely on said vertically translated curves, is to employ a least squares curve fit to both RCM generated curves 25 and 26, such that a polynomial is created for each of said curves. The creation of such a polynomial by the least squares method is well known in the art, and said polynomials for RCM generated curves 25 and 26 will be of the form:

$$Y_{ambtemp25} = \sum_{i=0}^{1} a_i (X_{25})^i \quad \text{Equation 1}$$

$$Y_{ambref26} = \sum_{i=0}^{N} b_i (X_{26})^i \quad \text{Equation 2}$$

where, referring to FIG. 4, $(Y_{ambtemp25}, X_{25})$ is a point on ambient temperature curve 25; $(Y_{ambref26}, X_{26})$ is a point on ambient reference curve 26; $a_i$ are polynomial coefficients corresponding to ambient temperature curve 25; $b_i$ are polynomial coefficients corresponding to ambient reference curve 26; and N is the desired order of the resulting polynomial. Note that the order of Equation 1 is one, indicating a straight line, as is appropriate for ambient temperature curve 25.

Figure 5:
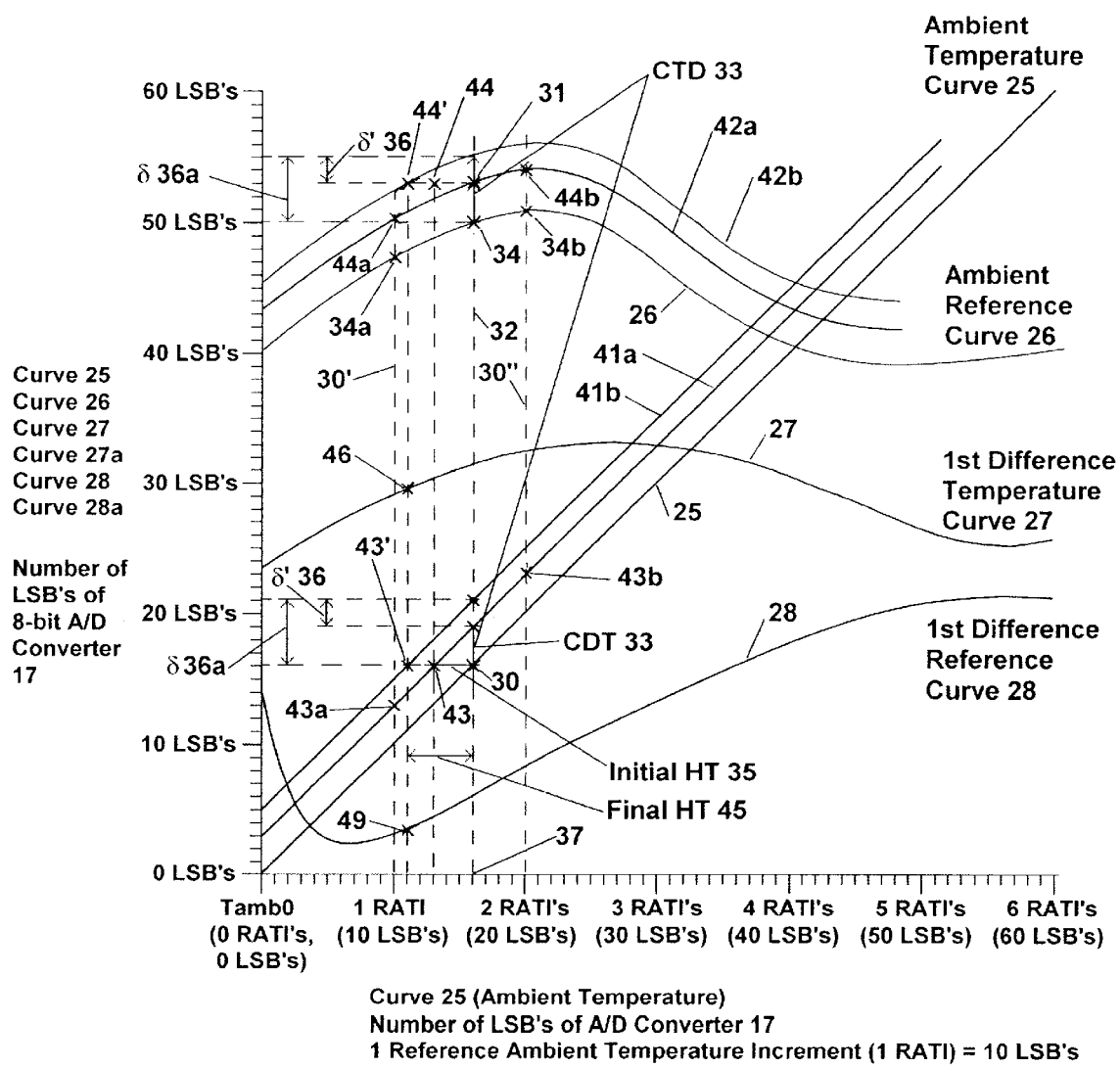
FIG. 5 is a detailed view of the lower left portion of the graph of FIG. 2, and illustrates calculations involved in a final determination of vertical and horizontal translation of ambient temperature calibration (offset) curves, to reflect time drift compensation, for the ambient temperature measurement, in accordance with the fourth step of the method of the present invention in the standard calibration mode.

Referring to FIG. 5, with a vertical translation 6 (corresponding to a more precise estimate of CTD 33, determined above) applied to each of the RCM generated curves 25 and 26, in order to translate them to new SCM translated curves 41b and 42b shown in FIG. 5, respectively, so that points 30 and 31 can be translated to both be situated substantially upon said SCM translated curves 41b and 42b, the above polynomials become:

$$Y_{SCMxlated41b} = \sum_{i=0}^{1} a_i (X_{41b})^i + \delta \quad \text{Equation 3}$$

$$Y_{SCMxlated42b} = \sum_{i=0}^{N} b_i (X_{42b})^i + \delta \quad \text{Equation 4}$$

where, $(Y_{SCMxlated41b}, X_{41b})$ are points on newly translated SCM translated ambient temperature curve 41b, and $(Y_{SCMxlated42b}, X_{42b})$ are points on newly translated SCM translated ambient reference curve 42b shown in FIG. 5. Note that coefficients $a_i$ and $b_i$ remain the same as in Equations 1 and 2, indicating that curve shape is unchanged from that of RCM generated curves 25 and 26 (error associated with this assumption is referred to as translation error, and is discussed below, as part of SCM step 213). Note that starting from a given point $(X_{25}, Y_{ambtemp25})$, situated on RCM generated ambient temperature curve 25 (Equation 1) to be translated such that its Y-axis value remains constant, when repositioned to be situated upon curve 41b (via Equation 3, i.e., RCM generated ambient temperature curve 25 vertically translated by amount 6), said given point $(Y_{ambtemp25}, X_{25})$ is translated to position $(Y_{SCMxlated41b}, X_{41b})$, with $Y_{ambtemp25}$ in Equation 1 set equal to $Y_{SCMxlated41b}$ in Equation 3. Then, due to the effect of vertical translation δ in Equation 3, the corresponding value for $X_{25}$ in Equation 1 is translated (horizontally) to $X_{41b}$. Similarly, for a given value $Y_{ambtemp26}$ in Equation 2, due to the effect of vertical translation δ in Equation 4, the corresponding value for $X_{26}$ in Equation 2 is translated (horizontally) to $X_{42b}$ (Equation 4). Note also that the horizontal translation $(X_{42b} - X_{26})$ is identical to $(X_{41b} - X_{25})$.

Referring to FIG. 5, in order to solve for the desired vertical translation 636a, affecting both RCM generated curves 25 and 26, such that ambient temperature point 30 and ambient reference point 31 can be more precisely translated horizontally to be each positioned substantially on SCM translated curves 41b and 42b, respectively, values in Equation 3 and Equation 4 are set as follows. $Y_{SCMxlated41b}$ is the measured voltage associated with ambient temperature point 30, and $Y_{SCMxlated42b}$ is the measured voltage associated with ambient reference point 31 (reflecting, as mentioned above, that the vertical axis values of ambient temperature point 30 and ambient reference point 31 remain constant throughout the horizontal translation, i.e., preserving their measured values); and $X_{41b}$ is assumed to equal $X_{42b}$ (as mentioned above), such that the positions of ambient temperature point 30 and ambient reference point 31 retain equal X-axis coordinates throughout said horizontal translation, reflecting the fact that they represent measurements conducted at a single, equal ambient temperature.

Referring to Equations 3 and 4, with the values for $Y_{SCMxlated41b}$ and $Y_{SCMxlated42b}$ known, and the values for coefficients $a_i$ and $b_i$ also known (from the polynomial curve fit of Equations 1 and 2, above), it remains to solve for δ 36a (FIG. 5) and $X_{41b}$ (which equals $X_{42b}$). Hence, Equations 3 and 4 are a pair of nonlinear equations, with a pair of unknown variables, which can therefore be solved by methods well known to persons skilled in the art. Referring to FIG. 5, the value for δ 36a is preferably determined first, followed by a determination of $X_{41b}$ (which equals $X_{42b}$). Once $X_{41b}$ and $X_{42b}$ are determined, they are subtracted from $X_{25b}$ (which equals $X_{26b}$ and corresponds to the X-axis value of points 30 and 31), resulting in the appropriate final horizontal translation (final HT) 45, more generally referred to as a final ambient signal offset, required to translate ambient temperature point 30 and to translate ambient reference point 31 to be substantially situated on the newly translated curves 41b and 42b, respectively, formerly corresponding to RCM generated ambient temperature curve 25 and ambient reference curve 26, respectively.

A less general, and simpler approach, with comparable accuracy, and preferred when a sufficient number of calibration points is acquired during RCM, is considerably less computationally intensive. Referring to FIGS. 4 and 5, the simpler approach is directed toward making efficient use of the discrete nature of measurements with the embodiment of FIG. 1, to solve the problem of translating RCM generated ambient temperature curve 25 and RCM generated ambient reference curve 26, described above, such that time drift is accurately reflected in said translation, i.e., such that ambient temperature point 30 and ambient reference point 31 can be horizontally translated, so that said points are substantially situated on the resulting translated curves, as described above.

Referring to FIG. 5, the less computationally intensive approach is as follows. First, determine the exact region of RCM generated curves 25 and 26, where vertical translation of the RCM generated curves 25 and 26 is likely to occur. This is performed by translating both RCM generated ambient temperature curve 25 and RCM generated ambient reference curve 26 by an amount initially approximated by CTD 33 as done above, and as shown in FIGS. 4 and 5. These initially translated curves are identified in FIGS. 4 and 5 as initially translated ambient temperature curve 41a and initially translated ambient reference curve 42a.

Next, referring to FIG. 5, choose the closest RCM calibration points to the Y-axis value of ambient temperature point 30 and ambient reference point 31 on initially translated curves 41a and 42a, respectively. Referring to FIG. 5, the closest calibration points, on initially translated curve 41a, to the Y-axis value of ambient temperature point 30 are identified as 43a and 43b. The closest calibration points, on initially translated curve 42a, to the Y-axis value of ambient reference point 31 are identified as 44a and 44b.

Next, again referring to FIG. 5, form two linear equations, one of said linear equations representing the line between calibration points 43a and 43b on initially translated ambient temperature curve 41a, and the other of said linear equations representing the line between calibration points 44a and 44b on initially translated ambient reference curve 42a. Said two linear equations are of the form:

$$Y_{41a} = A_{41a} X_{41a} + B_{41a} \quad \text{Equation 5}$$

$$Y_{42a} = A_{42a} X_{42a} + B_{42a} \quad \text{Equation 6}$$

where, referring to FIG. 5, Equation 5 represents the line between points 43a and 43b, on initially translated ambient temperature curve 41a, and Equation 6 represents the line between points 44a and 44b, on initially translated ambient reference curve 42a. In Equation 5, the values for coefficients $A_{41a}$ and $B_{41a}$ may be determined by substituting the X and Y values for the pair of points 43a and 43b, and solving the resulting pair of equations for $A_{41a}$ and $B_{41a}$, as is well known to persons skilled in the art. The same approach, using points 44a and 44b, is used to determine the values for $A_{42a}$ and $B_{42a}$ in Equation 6.

Next, referring to FIG. 5, an additional vertical translation δ' 36 is applied to the initially translated curves 41a and 42a (initially translated vertically by the amount identified as CTD 33), so that said initially translated curves 41a and 42a are finally translated vertically by the total amount δ 36a (δ=δ'+CTD) to final positions represented by SCM translated ambient temperature curve 41b and SCM translated ambient reference curve 42b, respectively. Said additional translation is effected such that ambient temperature point 30 and ambient reference point 31 can be horizontally translated to substantially fit on said SCM translated ambient temperature curve 41b (at point 43') and SCM translated ambient reference curve 42b (at point 44'), respectively. In order to determine the value for δ' 36, the above Equations 5 and 6, representing initially translated ambient temperature curve 41a and initially translated ambient reference curve 42a, respectively, are modified to include said additional vertical translation δ' 36.

$$Y_{41a} = A_{41a} X_{41a} + B_{41a} + \delta' \quad \text{Equation 7}$$

$$Y_{42a} = A_{42a} X_{42a} + B_{42a} + \delta' \quad \text{Equation 8}$$

Then, referring to FIG. 5, with the values for $A_{41a}$, $B_{41a}$, $A_{42a}$, and $B_{42a}$ determined, as described above, and substituting the Y-axis value (measured voltage level) of ambient temperature point 30 for $Y_{41a}$ and substituting the Y-axis value (measured voltage level) of ambient temperature point 31 for $Y_{42a}$, and assuming that $X_{41a} = X_{42a}$ (reflecting the fact that substituted points 30 and 31 share a single measured ambient temperature value, and will continue to do so, throughout the horizontal translation, which finally positions them at point 43' and point 44', respectively), the result is a pair of equations with a pair of unknown variables, namely, δ and $X_{41a}$ (which equals $X_{42a}$). This pair of equations is then solved for the pair of unknowns, δ' and $X_{41a}$ (which equals $X_{42a}$), by methods well known to persons skilled in the art. Specifically, solving for δ' yields:

$$\delta' = \left[\frac{(A_{41a} * A_{42a})}{(A_{42a} - A_{42a})}\right] * \left[\frac{(A_{41a} - B_{41a})}{A_{41a}} - \frac{(Y_{42a} - B_{42a})}{A_{41a}}\right] \quad \text{Equation 9}$$

Referring to FIG. 5, once δ' 36 is determined, $X_{41a}$ (which equals $X_{42a}$) is calculated, using either Equation 7 or Equation 8, above, and substituting, respectively, the Y-axis value (measured voltage level) of ambient temperature point 30 for $Y_{41a}$ (Equation 7) or substituting the Y-axis value (measured voltage level) of ambient temperature point 31 for $Y_{42a}$ (Equation 8), respectively. Once $X_{41a}$, corresponding in the present example to the X-axis value of point 43' is known, it is subtracted from $X_{25}$, corresponding in the present example to the X-axis value of point 30, to yield the final value of horizontal translation, final HT 45, necessary to more precisely reposition ambient temperature point 30 on SCM translated ambient temperature curve 41b (at point 43') and to simultaneously reposition ambient temperature point 31 on SCM translated ambient reference curve 42b (at point 44'). It will be appreciated that an identical process, subtracting $X_{42a}$ (X-axis value of point 44') from $X_{26}$ (X-axis value of point 31) will arrive at the same value for final HT 45. The value of final HT 45 in the present example is five LSB's of A/D converter 17 (FIG. 1), or 0.5 RATI, as shown in FIG. 5. Note the value of final HT 45 in comparison to the initial HT 35 that was determined in connection with FIG. 4, and as a result of using an initial vertical translation of CTD 33 as an approximation, shown in FIG. 5.

Note also the dependence on relatively consistent RCM curve contour, or "shape", over time, which permits these relative translations of an entire curve from one location to another based upon measurements at a single ambient temperature. Inaccuracies resulting from the assumption of consistent curve "shape", over time, associated with a given curve, are hereafter referred to as translation error for said given curve. Translation error has an effect on the accuracy of translations described above, as well as on subsequent calculations, that depends on those translations. For example, referring to FIG. 5, calculations which determine final HT 45, which are used to translate ambient temperature curve 25, so that it correctly compensates for time drift in ambient temperature measurements, relative to other RCM generated curves, are affected by translation error. The cause of translation error (TE) is discussed below, as part of the description of SCM step 213, along with its derivation and application to measurements in accordance with the present invention, since TE is a byproduct of the translations performed in SCM step 213.

Translation error (TE) is primarily the result of amplifier gain drift over time (e.g., resulting from feedback resistor drift over time), thermistor drift over time, and time drift of bridge resistors. Consequently, TE can be estimated, at the time of manufacture, based upon combined component time drift specifications. In accordance with the present invention, TE of a given curve can be regarded as a tendency of the curve to change its "shape" as a function of time, in contrast to any uniform, linear translations of said curve (e.g., due to component drift, that is uniform throughout the temperature range of interest). If curves are described as polynomials, TE is the tendency of all but the linear coefficients of said polynomials to vary over time, that is, irrespective of any linear drift that may occur due to thermal and temporal component drift. TE for any given RCM generated curve is then a function of time since the last operation of the system components in RCM (at which time, the shapes of said curves were stored in memory 19 in the form of discrete points). Since TE may also vary along the temperature range of an RCM generated curve, it is conceivable that TE can be quantified as a function of both time (elapsed since the last operation in RCM) and ambient temperature, as measured by ambient temperature amplifier 13 (FIG. 1).

It should be noted that the method of the present invention compensates for any component time drift which manifests itself, in whole or in part, as a linear translation in the thermal offset curves acquired during RCM. That is, while certain types of component time drift, such as those associated with feedback resistors and thermistors, may to some extent be manifested as a change in "shape" of a given thermal offset curve over time, such drift is to a significantly greater extent manifested as a linear translation of said given curve over time, and consequently, is substantially compensated by the method of the present invention.

Figure 6:
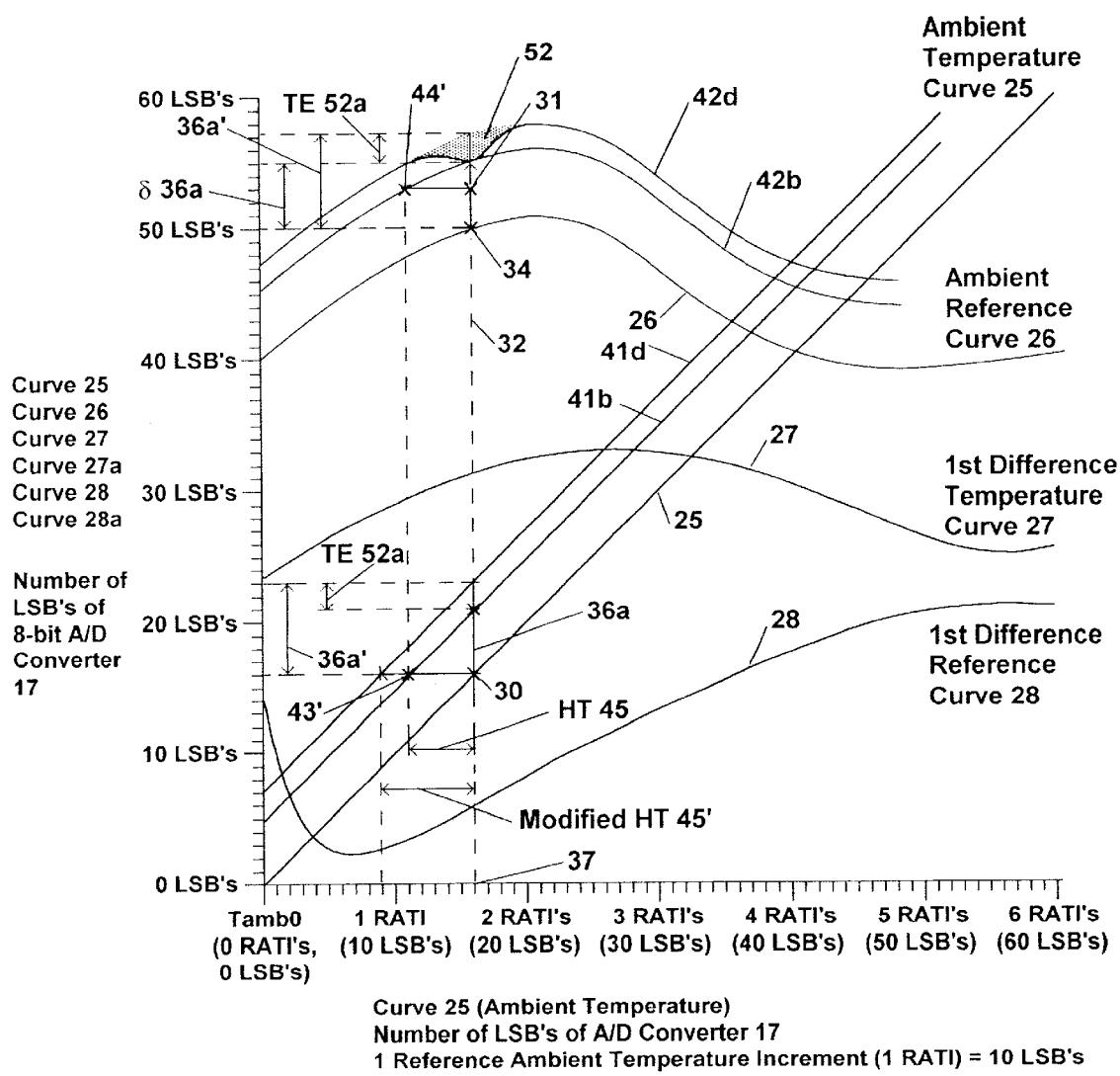
FIG. 6 illustrates the effect that translation error can have on the vertical and horizontal translation of ambient temperature curves, in accordance with the fourth step of the method of the present invention in the standard calibration mode, and a method to quantify said translation error.

Referring to FIG. 6, as an example to illustrate the effect of TE, consider that at a time T, following the generation of RCM generated curves 25 and 26, during an operation of the embodiment of FIG. 1 in SCM, said RCM generated curves 25 and 26 undergo a linear, vertical shift by the process described above in SCM steps 210–213 (said shift indicated in FIGS. 5 and 6 as δ 36a), to become translated curves 41b and 42b, respectively. However, referring to FIG. 6, if the shape of translated ambient reference curve 42b has changed, to some extent, in the intervening time T, since the last operation in RCM, in the form indicated by shaded region 52 (exaggerated for the sake of illustration), in the vicinity of ambient reference measurement 31, and represented in FIG. 6 as part of curve 42d, then the magnitude of this hypothetical change of shape, identified as translation error (TE) 52a in FIG. 6, will have an effect upon the accuracy of translations associated with SCM steps 212 and 213. As can be seen from FIG. 6, curves 42b and 42d share the same value at the ambient temperature (on line 32), at which ambient temperature point 30 and ambient reference point 31 are depicted. Consequently, at the ambient temperature associated with line 32, previously determined vertical and horizontal translations δ 36a and final HT 45, respectively, will correctly compensate for time drift of curves associated with the ambient temperature measurement, only at said ambient temperature associated with line 32. Hence, though point 31 is measured correctly, under the influence of the change in curve shape 52, the use of point 31 to determine the vertical and horizontal translations during SCM step 213 would result in an incorrect determination of final HT 45, outside of the immediate vicinity of the ambient temperature associated with line 32. In order to translate RCM generated ambient temperature curve 25 and RCM generated ambient reference curve 26, such that a final HT value is correctly determined for subsequent operations of the preferred embodiment outside of the ambient temperatures affected by TE 52a, the vertical translation should actually be 36a'=δ 36a+TE 52a, as shown in FIG. 6. With the adjusted translation 36a', RCM generated ambient temperature curve 25 is translated to curve 41d, and RCM generated ambient reference curve 26 is translated to curve 42d, and the modified value HT becomes 45', as shown, in contrast to the earlier derived final HT 45.

Referring to FIG. 6, note also that TE 52a can be applied to translated ambient temperature curve 41b, as well as to translated ambient reference curve 42b, to illustrate TE. That is, the magnitude of TE 52a observed in the present example, as associated with translated ambient reference curve 42b, may alternatively be applied directly to SCM translated ambient temperature curve 41b, with the same effective modification on the resulting final HT 45, as can be seen by inspection in FIG. 6.

As briefly mentioned above, TE is largely a function of component time drift, particularly associated with feedback resistors and bridge resistors, as well as thermistors. The effects of TE can be greatly reduced through the use of time stable resistive components in the preferred embodiment, such as standard metal film resistors, manufactured by Dale Electronics, of Norfolk, Nebr., which, as described above, offer stability over time comparable to much more expensive temperature stable, and time stable, bulk metal foil and wirewound resistors. Referring to FIG. 1, this preference for time stability in resistive elements, which serves to reduce TE, can be applied to resistive components of the preferred embodiment, excluding thermistors, and applies particularly to amplifier feedback resistors, reference resistors 5 and 6, as well as to bridge resistors 23 and 24. Note that time stability can also be substantially satisfied by the use of wirewound potentiometers, which for convenience are used for resistors 6 and 23 in the preferred embodiment of FIG. 1. However, it will be appreciated that these may be replaced by fixed metal film resistors, if justified by cost considerations. Derivations for TE, as a function of time (elapsed since the latest operation in RCM) are preferably initially specified by manufacturers (e.g., as resistor time drift) of individual system components and subsequently combined to estimate TE associated with all relevant components for a given RCM generated curve. Such an initial specification, however, applies to a range of components and temperatures, rather than specific parts and temperatures, and therefore is only useful in estimating the maximum TE for similar components, from the same manufacturer, over a specified temperature range.

An alternative, or addition, to the use of time stable resistive components, for reducing the effects of TE, is to periodically re-acquire, i.e., update, RCM generated curves, by operating the embodiment of FIG. 1 in RCM over an available temperature range, as described during the description of RCM, above. As described above, passive component drift, resulting in, for example, gain drift, is manifested to a much greater extent as a linear translation in thermal offset curves, than as a non-linear change, i.e., a change in curve "shape" over time, and consequently is substantially compensated by the method of the present invention. However, such changes in curve "shape" will eventually affect the accuracy of measurements. The extent to which the effects of non-linear drift over a given time are compensated corresponds to a maximum time period, within which re-acquisition of thermal offset curves is required, in order to achieve a given measurement accuracy. This maximum period depends substantially on the time stability (not the temperature stability) of passive components, such as gain feedback resistors. In order to determine the maximum period, between re-acquisition of offset curves, required to achieve a given accuracy, the operation in RCM is preferably performed at the time of manufacture, utilizing a constant temperature bath, capable of providing at least two known, repeatable temperatures (the reason for a constant temperature bath relates to a process described below for empirically quantifying TE at the time of manufacture). Nevertheless, the method of the present invention permits a re-acquisition of thermal offset curves over an arbitrary temperature range as described above, so that subsequent re-acquisitions of thermal offset curves can be performed, at any time, by the end user, without such costly calibration equipment.

It will be appreciated by those skilled in the art that updated RCM curves possess endpoints, representing either end of the "updated" calibrated ambient temperature range. It is conceivable that if a given curve is sufficiently smooth, the endpoints can be extended by extrapolating beyond said endpoints, using curve extrapolation methods known to persons skilled in the art, and/or by noting characteristics of previously acquired versions of said curve, beyond the range of said endpoints. It is also conceivable that during normal operation, the system can warn the operator, or simply stop functioning, when ambient temperature exceeds the limits of a calibrated range.

Alternatively, or as a means of more tightly defining manufacturer supplied specifications for TE, TE may be determined empirically, by using additional operations in RCM, at different times, and comparing the shapes of the resulting versions of RCM generated curves at said different times, using curve comparison techniques known to those skilled in the art. Note that the additional operations are conducted separately from SCM step 213. However, these additional operations used to empirically quantify TE are described below, since TE is a byproduct of the translations performed during SCM step 213 and has a direct impact upon the accuracy of measurements conducted in this SCM step 213 (such as final HT 45).

Generally, in order to determine TE for a given RCM generated curve, it is necessary to generate at least two versions of said curve, each at a different time. Next, any linear drift component of the two said versions of said curve, generated at two different times, is quantified (e.g., by performing a linear curve fit algorithm, well known to persons skilled in the art), so that said two curves can be more easily compared for the effects of purely non-linear drift (i.e., TE). Then, pairs of discrete points, each said pair associated with a particular ambient temperature, are differenced, with said differences associated with the ambient temperature measurement at which said pair was acquired, and additionally associated with the time elapsed since the last operation in RCM. Thus, TE for a given curve can be defined as a function of ambient temperature measurement and elapsed time since the most recent operation in RCM.

More specifically, a preferred approach that can be used to determine TE for a given RCM generated curve, in the embodiment of FIG. 1, has the effect of positioning two versions of a given RCM generated curve, acquired at two different times, such that they can be compared for variations in curve "shape" (i.e., non-linear drift), and requires that the preferred embodiment of FIG. 1 be operated between two temperatures, at least one of which is repeatable. In accordance with this preferred approach, referring to FIG. 7, an RCM generated curve 55a is generated during an operation in RCM at a time $T_0$. Later, at a time $T_1$, another RCM generated curve 55b is generated. These two operations in RCM are effected between two temperatures, at least one of which is a repeatable temperature, such as that of melting ice, so that the two operations in RCM can be performed by the end user, without expensive calibration equipment. However, in the preferred embodiment, the two operations in RCM are effected at the time of manufacture, in order to establish TE for the life of the system, such that both of said two operations in RCM are performed between two known, repeatable ambient temperatures, for example, by placing the embodiment of FIG. 1 during RCM in a constant temperature bath, that is ramped between the two known, repeatable temperatures. As is known in the art, electronic component time drift decreases over the life of components, so that TE, thus determined at the time of manufacture, will provide a worst case TE estimate, for the life of a system, comprising said components.

Figure 7:
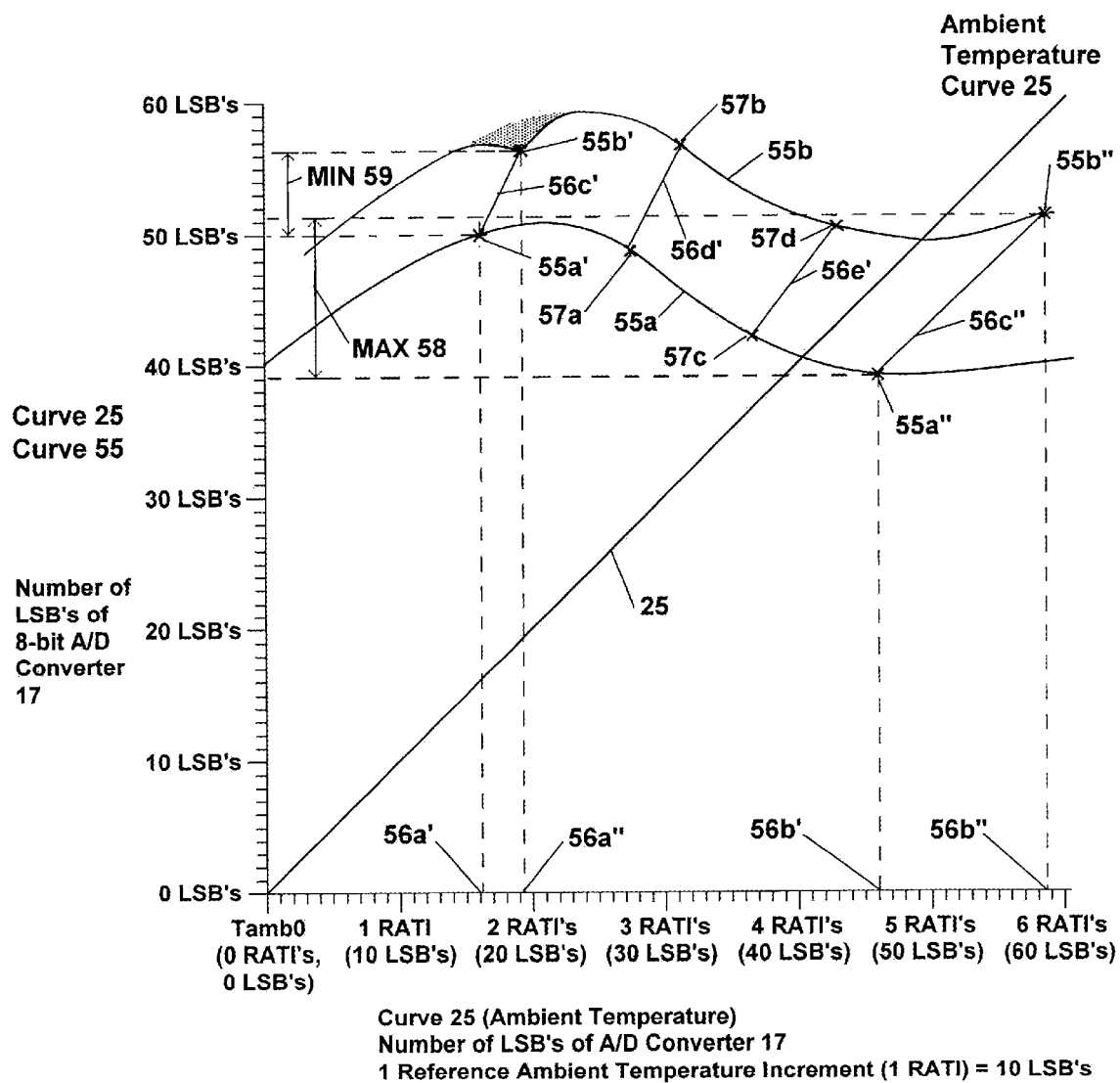
FIG. 7 illustrates an alternative method to quantify said translation error, affecting vertical and horizontal translation of ambient temperature curves, in accordance with the fourth step of the method of the present invention in the standard calibration mode.

Referring to FIG. 7, operation in RCM between the two known, repeatable temperatures at time $T_0$ results in a curve 55a, with endpoints at measured ambient temperatures 56a' and 56b'. A subsequent operation in RCM between the same two known, repeatable temperatures at a later time $T_1$ results in another curve 55b with endpoints at measured ambient temperatures 56a'' and 56b''. Curves 55a and 55b are translated diagonally with respect to each other, as shown in FIG. 7, representing a combination of linear and non-linear time drift of said curves over a time $(T_1-T_0)$, which is exaggerated for the sake of illustration, and also includes an exaggerated change in curve shape, identified as 52 in FIG. 6. By this method, the curves 55a and 55b, thus generated on the above two occasions, are effectively positioned, for comparison of pairs of endpoints on curves 55a and 55b, with said pairs of endpoints, used in said comparison, acquired at the same ambient temperatures. Two pairs of endpoints are indicated by connecting lines 56c' and 56c'' in FIG. 7, located at the endpoints of the temperature range, described above, and associated with the two known, repeatable temperatures, between which curves 55a and 55b were acquired. Connecting line 56c' connects left endpoints 55a' and 55b', and connecting line 56c'' connects right endpoints 55a'' and 55b''. The length and slope of lines 56c' and 56c'' can conceivably differ between the two known, repeatable temperatures, between which curves 55a and 55b were acquired, as shown in FIG. 7. Therefore, the length and slope of intervening connecting lines 56d' and 56e', shown in FIG. 7, are preferably determined by linearly interpolating between the length and slope of endpoint connecting lines 56c' and 56c''. Thus, respective connecting lines 56c' and 56c'', which connect points on curves 55a and 55b, that are acquired between the same known ambient temperatures (measured as 56a' through 56b' and 56a'' through 56b'', respectively) are used to estimate the length and slope of connecting lines 56d' and 56e', intended to connect intervening points on curves 55a and 55b, said intervening points acquired at the same ambient temperatures.

Referring to FIG. 7, the above said diagonal translation, which over an intervening time ($T_1-T_0$) modifies and translates curve 55a to be re-positioned as curve 55b, as shown, can be used to quantify TE across the above measured ambient temperature range. First, a determination is made of the maximum and minimum difference between each pair of associated points on RCM curves 55a and 55b, said associated points connected by connecting lines 56c', 56d', 56e', and 56c" in FIG. 7. That is, each pair of calibration points, such as pair of points 55a' and 55b', connected by connecting line 56c'; pair of points 57a and 57b, connected by connecting line 56d'; pair of points 57c and 57d, connected by connecting line 56e'; and pair of points 55a" and 55b", connected by connecting line 56c", are differenced, and said differences are compared. The maximum difference among the set of associated pairs of points, hereafter referred to as $\Delta$max, is identified as 58 in FIG. 7, and the minimum said difference among said pairs of points is hereafter referred to as $\Delta$min and is identified as 59 in FIG. 7. Therefore, the maximum TE associated with the curves (acquired at two different times) represented by curves 55a and 55b in FIG. 7, over the measured range of temperatures, can be estimated as $\Delta$max$-\Delta$min. The use of this difference, $\Delta$max$-\Delta$min, in estimating TE eliminates the effect of any linear shift between RCM curves 55a and 55b within the measured range of ambient temperatures (which is compensated by the method of the present invention), leaving only that portion of component drift that is not manifested as a linear translation and consequently not directly compensated by the method of the present invention. Since the elapsed time $T_1-T_0$, between operations in RCM, is known (said elapsed time being determined by timer 18 in FIG. 1), TE as a function of time t, for an RCM generated curve 55 (represented at times $T_0$ and $T_1$ as curves 55a and 55b, respectively, in FIG. 7) may be expressed as $TE_{55}(t)=t^*(\Delta max-\Delta min)/(T_1-T_0)$. Subsequent measurements within the measured range of temperatures can be expected to exhibit $TE_{55}(t)$, where $TE_{55}(t)$ is the TE associated with a said RCM generated curve 55, and where elapsed time t is the time elapsed since $TE_{55}(t)$ was last determined. Also, it will be appreciated that if one knows that the embodiment of FIG. 1 is operating in a specific, limited temperature range, the estimate for $TE_{55}(t)$ can be improved by using only ($\Delta$max$-\Delta$min) within the specific limited temperature range for the calculation of $TE_{55}(t)=t^*(\Delta max-\Delta min)/(T_1-T_0)$. Additionally, it will be appreciated that if several ambient temperature ranges are thus determined, and associated with several functions TE(t), said several functions can conceivably be associated with said several ambient temperature ranges and consolidated into a single function of both time and ambient temperature.

Referring to FIG. 7, it is also conceivable that a determination of $TE_{55}(t)$ can be estimated without applying known repeatable temperatures to an operation in RCM, by identifying distinctive and unique slope characteristics, if they can be so identified, on various parts of RCM curve 55a acquired at time $T_0$, and substantially aligning them (e.g., by horizontal translation) to the same said slope characteristics on RCM curve 55b acquired at time $T_1$. The identification of unique slope characteristics can be accomplished by applying a known curve fitting formula to RCM curves 55a and 55b, and, for example, taking the derivative of said formula at the points of interest to determine the slope at said points of interest. Next, points on RCM curves 55a and 55b with uniquely matching patterns of slope characteristics can be aligned, by translating said RCM curves horizontally, relative to one another, so that the effect is that of a correspondence between pairs of points, comparable to that shown for RCM curves 55a and 55b in FIG. 7, said pairs of points having substantially the same unique slope characteristics. Then, once again, the formula $TE_{55}(t)=t^*(\Delta max-\Delta min)/(T_1-T_0)$ can be applied, after determining ($\Delta$max$-\Delta$min), over the temperature range of interest.

Yet another conceivable approach in determining TE, preferably applicable during a separate operation in SCM, involves taking an SCM measurement, as described above in connection with FIG. 5, to calculate vertical translation $\delta$ 36a and final HT 45 at one or more particular points on a given RCM generated curve, relative to ambient temperature curve 25. In this case, said $\delta$ and final HT can then be used, referring to FIG. 7, to approximate a repositioning of an RCM generated curve 55a to translated RCM generated curve 55b, relative to ambient temperature, such that pairs of recorded points on both said RCM curves 55a and 55b can be identified as being associated with substantially the same ambient temperature, the effect again being that of alignment shown for RCM curves 55a and 55b in FIG. 7. Then, once again, the formula $TE_{55}(t)=t^*(\Delta max-\Delta min)/(T_1-T_0)$ can be applied, after determining ($\Delta$max$-\Delta$min), over the temperature range of interest.

The application of TE in the method of the present invention, specifically how it is used with other error terms to determine a final difference temperature error, is described in the discussion of the operational mode, which follows the present discussion of SCM, which now continues below.

SCM step 5 (214 in FIG. 12B): Referring back to FIG. 5, SCM step 214 uses the SCM translated ambient temperature point 43' to determine the position 46 on RCM generated difference temperature curve 27, where one would expect to find the current measured difference temperature point, if there were zero difference temperature between thermistors 3 and 4 (FIG. 1), and if there were zero time drift of components associated with the difference temperature measurement since the last operation of the embodiment of FIG. 1 in RCM. Similarly, SCM step 214 determines the position 49 on RCM generated difference reference curve 28 of the point on said difference reference curve 28 where one would expect to find the current difference reference point on difference reference curve 28, if there were zero time drift of components associated with difference temperature amplifiers 7 (and 7a) and A/D converter 17, since the last RCM operation, at which time said difference reference curves 28 and 28a were last stored (recall that during RCM, points on difference reference curves 28 and 28a were acquired by using switches 10 and 10a to connect the same bridge node 11 to both inputs of difference temperature amplifiers 7 and 7a). Thus, SCM begins to compensate for drift of active and passive components associated with difference measurements.

Figure 8:
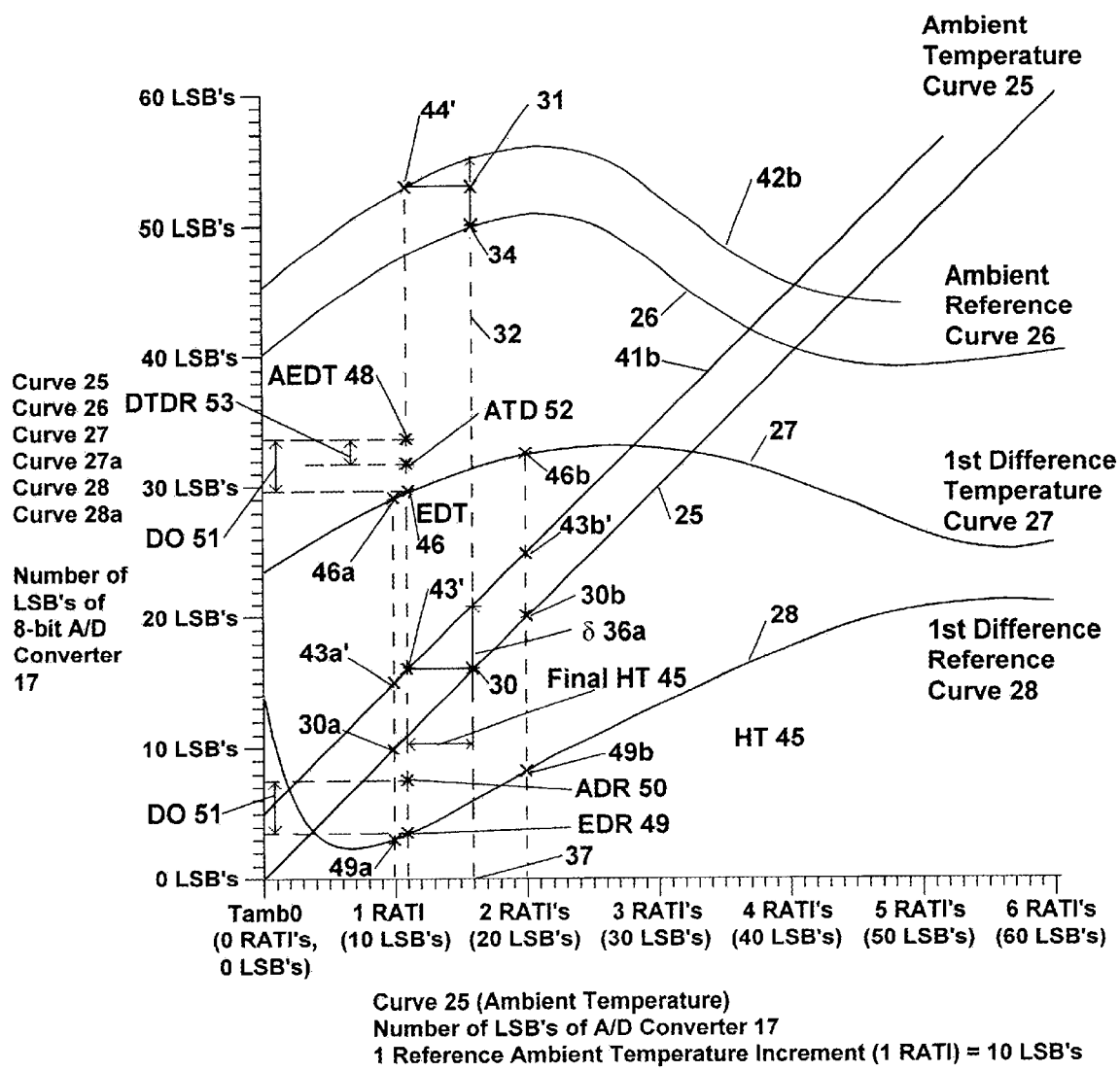
FIG. 8 is a detailed view of the lower left portion of the graph of FIG. 2, and illustrates calculations involved in a determination of time drift for components, associated with the temperature difference measurement in accordance with the fifth, sixth, and seventh steps of the method of the present invention in the standard calibration mode.

Referring to FIG. 8, depicting the same portion of the graph of FIG. 2 as shown in FIG. 5, translated ambient temperature point 43', situated on SCM translated ambient temperature curve 41b, can be associated with the corresponding point 46 on RCM generated first difference temperature curve 27 (measured via the first difference temperature amplifier 7 in FIG. 1). Similarly, referring to FIG. 2, note that the value of point 47 on RCM generated second difference temperature curve 27a (measured via the second difference temperature amplifier 7a), also associated with the current ambient temperature, would correspond to a negative value. However, since both difference temperature amplifiers 7 and 7a are single supply amplifiers in the preferred embodiment of FIG. 1, said negative value is amplified by said difference temperature amplifier 7a as (essentially) a zero level voltage. Consequently, in the preferred embodiment of FIG. 1, employing a single ended supply voltage, only the value of corresponding point 46, referring to FIGS. 2 and 8, on RCM generated first difference temperature curve 27, hereafter referred to as temperature difference point 46, is used in the following description. Nevertheless, referring back to FIG. 2, it will be appreciated that other points on RCM generated ambient temperature curve 25, for example, ambient temperature point 75, will correspond to a positive valued point 76 on the second difference temperature curve 27a, and that, in general, the preferred embodiment of FIG. 1 must determine which of the RCM generated difference temperature curves 27 and 27a to correlate to selected points of translated ambient temperature curve 41b in FIG. 8. Referring to FIG. 2, this determination is preferably made by selecting the greater of the two values from the first and second RCM generated difference temperature curves 27 and 27a associated with the current ambient temperature. Also, recall that in the preferred embodiment of FIG. 1, using a single ended supply voltage, thus requiring the use of two difference temperature amplifiers 7 and 7a, the possibility of simultaneous negative values from both first and second RCM generated difference temperature curves 27 and 27a in FIG. 2, associated with a given point of RCM ambient temperature curve 25, is effectively eliminated by adjusting measurement bridge resistor 23 (FIG. 1) accordingly, and/or adjusting offset voltages of difference temperature amplifiers 7 and 7a accordingly, using amplifier offset adjustment techniques well known to persons skilled in the art. Additionally, it will be appreciated by those familiar with the art that the above discussion also applies to first and second RCM generated difference reference curves 28 and 28a. Nevertheless, it is also conceivable that an embodiment may be powered by a bipolar supply voltage, in which case only one difference temperature amplifier is required, since said bipolar supply can accommodate a single bipolar temperature difference amplifier, permitting negative difference voltage measurements, thus eliminating the need for the two difference temperature amplifiers 7 and 7a.

Referring to FIG. 8, recall that the ambient temperature measurement point 43' was subject to a final HT 45 of half (0.5) of a RATI calibration point (or five LSB's of A/D converter 17 in FIG. 1), as described above in SCM step 213. Additionally, recall that in memory 19, each discrete point of ambient temperature throughout the range of RCM generated ambient temperature curve 25, in addition to being associated during operation in RCM with a unique discrete point on RCM difference temperature curves 27 and 27a, is also associated during RCM operation with a unique discrete point on RCM difference reference curves 28 and 28a. Also, recall that in SCM step 212, above, there was a linear interpolation fraction (60%) related to the position of original ambient temperature point 30 on RCM generated ambient temperature curve 25, between calibration points 30a and 30b. Note that this interpolation fraction changes to 10% when applied to translated ambient temperature point 43', between calibration points 43a' and 43b' on translated ambient temperature curve 41b, as can be seen by inspection. This interpolation fraction of 10%, associated with ambient temperature point 43', is now used to interpolate the position on RCM generated difference temperature measurement curve 27 of the point on said difference temperature measurement curve 27 between known temperature difference points 46a and 46b, where one would expect to find the current measured difference temperature point 46, if there were zero time drift of components associated with the difference temperature measurement, since the last RCM operation. This estimated temperature difference point, hereafter referred to as estimated difference temperature (EDT), is represented in FIG. 8 as point 46.

Again referring to FIG. 8, a similar procedure is followed in order to determine the point 49 on difference reference curve 28, which is associated with ambient temperature measurement point 43' situated on SCM translated ambient temperature curve 41b. Again, recall that the ambient temperature measurement point 43' was subject to a final HT 45 of 0.5 RATI calibration points (five LSB's), as described above in SCM step 213. In the present example, associated with SCM translated ambient temperature point 43', the above mentioned interpolation fraction associated with points 43a' and 43b' (10%) is now used to interpolate the position on difference reference curve 28 between known difference reference points 49a and 49b, where one would expect to find the current difference reference point on difference reference curve 28, if there were zero time drift of difference temperature amplifiers 7 (and 7a) and A/D converter 17, since the last RCM operation at which time said difference reference curves 28 and 28a were last stored. This current difference reference point is represented in FIG. 8 as point 49 and hereafter referred to as estimated difference reference (EDR). Recall that during RCM, points on difference reference curves 28 and 28a were acquired by using switches 10 and 10a in FIG. 1 to connect the same bridge node 11 to both inputs of difference temperature amplifiers 7 and 7a.

SCM step 6 (215 in FIG. 12B): Next, referring to FIG. 1, the actual offset of components which are associated with difference measurements, such as difference temperature amplifiers 7 and 7a and A/D converter 17, are determined, so that said actual offsets can be compared with expected offsets, permitting component time drift associated with temperature difference measurements to be estimated. Referring to FIG. 1, the measurements of the said actual offsets of components, which are associated with difference measurements, are effected by operating switches 10 and 10a to connect both difference amplifier inputs of difference temperature amplifiers 7 and 7a to the voltage at bridge node 11, such that all inputs of these amplifiers 7 and 7a (i.e., inputs 8, 9, 8a, and 9a) experience the same said voltage at bridge node 11. Although time drift of common mode rejection ratio (CMRR) is substantially compensated by the method of the present invention, the reason for using one of the bridge nodes in this measurement is to minimize the effects of any potential drift of amplifier CMRR over time, as described above in SCM step 212. Referring to FIG. 8, the difference between the resulting actual difference reference measurement (ADR) 50 and the estimated difference reference EDR 49 (derived above during SCM step 214) represents actual total drift of active components associated with difference measurement. The actual difference reference measurement (ADR) 50, subtracted from the value of the estimated difference reference (EDR) 49, equals a difference signal offset, more commonly referred to below as difference offset (DO) 51 in FIG. 8. Alternatively, as a way to determine the value for DO 51 in FIG. 8, it is conceivable that the current value for DO 51 can be estimated by comparing previously stored values of DO on RCM difference reference curves 28 and 28a, each said DO value associated with an elapsed time since a previously recorded DO value, and preferably associated with the current point on the SCM translated ambient temperature curve 41*b*, corresponding to current ambient temperature compensated for drift of components associated with the ambient temperature measurement. Then, using elapsed time since the last operation in RCM, as determined by timer 18 in FIG. 1, the current DO value can be predicted. Additionally, it will be appreciated by those skilled in the art that said predicted values for DO, calculated at different measured ambient temperatures, may result in different values of DO associated with different ambient temperatures. Nevertheless, as has been pointed out, due to the substantially linear drift of offset curves over time, a DO value can typically be determined at a single arbitrary ambient temperature and used as a vertical translation for all points on RCM difference reference curve 28, over the entire ambient temperature range in which said RCM difference reference curve 28 was acquired during operation in RCM, in order to substantially compensate said points on said RCM difference reference curve 28 for time drift of components associated with difference temperature measurement. That is, in accordance with the preferred embodiment, any point on said RCM difference reference curve 28 is substantially compensated for time drift of components associated with difference temperature measurement by adding the value DO to said point on said RCM difference reference curve 28. Referring to FIG. 8, the value DO 51 can thus be regarded as a vertical translation of the RCM difference reference curve 28, and if applied to all points on said RCM difference reference curve 28, this translation would result in a vertically translated difference reference curve, more generally referred to as a translated difference reference curve. It will be appreciated by those skilled in the art, however, that in the above-mentioned case in which predicted values for difference signal offset (or DO), calculated at different ambient temperatures, result in different values for DO at said different ambient temperatures, or in the case in which data acquired during operation in SCM conducted at more than one arbitrary ambient temperature otherwise results in different values for DO, which differ for each of the arbitrary ambient temperatures, these different values of DO would result in a translated difference reference curve that is translated by different amounts at different ambient temperatures, depending on the value of DO associated with each said ambient temperature. It will be appreciated that in this case of multiple values for DO associated with different ambient temperatures, values for DO, and the resulting required amount of translation of the difference reference curve (required to determine said translated difference reference curve), at ambient temperatures other than those for which said multiple values of DO have been associated, may be estimated by methods of interpolation and extrapolation well known in the art. It will also be appreciated by those skilled in the art that if, as described above for the preferred embodiment, DO 51 is a single value throughout the ambient temperature range over which RCM curves were acquired, or if DO is limited to a number of discrete values over the said ambient temperature range (each said discrete value associated with an ambient temperature) as noted above in the case of predicted values for DO, then the additional software and memory overhead required to calculate a translated difference reference curve from which to determine values for DO over said range of ambient temperatures may not be required, and instead only said single value for DO, or said discrete values for DO, respectively, need to be determined and stored in memory in order to determine values for DO that, with difference reference curve 28, could be used to determine a translated difference reference curve. Rather than showing the translated difference reference curve in the accompanying figures, which would unnecessarily complicate the figures, the value for DO 51 is assumed to be constant throughout the range of ambient temperatures over which offset curves were acquired during operation in RCM, in accordance with the preferred embodiment of the present invention, and said value DO 51 is used below to compensate individual points on RCM difference reference curve 28 for component drift over time. Additionally, as will be described below in OM step 2 (221 in FIG. 12C), the value DO 51 is also used, in accordance with the preferred embodiment of the present invention, for compensating points on the difference temperature curve 27 for time drift, in order to compensate difference temperature measurements for time drift of components associated with difference temperature measurement.

It will be appreciated by those skilled in the art that DO 51, derived above without the use of measurement bridge components, consequently only compensates for time drift of components associated (referring to FIG. 1) with A/D converter 17 and difference temperature amplifiers 7 and 7*a*, including associated feedback resistors. Referring to FIG. 1, the effect on difference measurements of different rates of time drift in measurement bridge resistances (thermistors 3 and 4 and resistors 23 and 24) is substantially compensated by the fact that time drift in measurement bridge resistances substantially cancels itself in the bridge configuration of the preferred embodiment. With metal film and wirewound resistors, the value of differential time drift between resistors is already extremely low, so that the effects of said differential resistance time drift between said resistances (relevant in differential measurements) will not significantly impact difference temperature measurements, with resolution on the order of micro-degrees centigrade. Note that thermistors generally possess a significantly higher time drift than other measurement bridge resistances, are preferably matched by manufacturing them in close physical proximity to each other, resulting in nearly identical time drift behavior. Additionally, it should be noted that any uncompensated time drift of thermistors (or measurement bridge resistors), associated with differential temperature measurements, is manifested as TE associated with difference temperature curves 27 and 27*a*, quantifiable as described in SCM step 213 in connection with FIG. 7. Finally, any uncompensated time drift of thermistors (or measurement bridge resistors) associated with differential temperature measurement is additionally manifested as difference time drift remainder (DTDR), quantifiable as described below, during SCM step 216 (in connection with FIG. 8), which, as described below, can be used to reduce the impact of such errors manifested as said DTDR (including time drift of measurement bridge resistances) over multiple operations in SCM. It is also noted that the time drift behavior of measurement bridge resistances (particularly thermistors) will have an effect on ambient temperature measurements, but these are substantially compensated, as described above, by final HT 45 (FIG. 8) in connection with SCM step 213.

SCM step 7 (216 in FIG. 12B): Expected difference measurements are again compared to actual difference measurements, this time for the purpose of determining a difference temperature measurement error term to be used during the operational mode, when all error terms associated with the method of the present invention are consolidated. Referring to FIG. 8, DO 51 is added to the value for the estimated difference temperature (EDT) point 46

(determined above during SCM step 214) on RCM temperature difference curve 27, in order to adjust EDT 46 for difference measurement component offset, represented by DO 51. The result is the point indicated by adjusted EDT (AEDT) 48. Next, referring to FIG. 1, switches 10 and 1a are operated to re-connect inputs 8 and 9 of difference temperature amplifier 7 to bridge nodes 11 and 12, respectively, and to re-connect inputs 8a and 9a of difference temperature amplifier 7a to bridge nodes 12 and 11, respectively, in order to measure the actual temperature difference value ATD 52 in FIG. 8 (remember that during SCM, as in RCM, thermistors 3 and 4 are at substantially the same temperature).

Referring to FIG. 8, note the discrepancy between the estimated difference value AEDT 48 (determined above) on the RCM generated difference temperature curve 27 and the actual (measured) temperature difference value (ATD) represented by point 52. This discrepancy is identified in FIG. 8 as difference time drift remainder (DTDR) 53. DTDR 53 is an error term in all subsequent difference temperature measurements. The application of the DTDR error term, as it applies to operation of the embodiment of FIG. 1, is discussed in more detail below.

DTDR 53 is a cumulative error term associated with temperature difference measurements and is observed as a discrepancy, during SCM step 216, between the predicted and actual difference temperature measurements, AEDT 48 and ATD 52, respectively, in FIG. 8. DTDR 53 may result from unpredictable factors including RFI and sudden temperature fluctuations, as well as from other, more predictable changes in the system, such as variations in the "shape" of RCM generated curves over time at the current ambient temperature, i.e., TE (e.g., associated with uncompensated, differential time drift of measurement bridge resistances); interpolation errors; and warm-up effects, related to elapsed time since power-on. Unpredictable environmental factors, such as RFI, and sudden temperature variations may, to some extent, be reduced or eliminated by good design, or at least quantified for worst case effect on the system. Warm-up error can also be essentially negated if necessary, by requiring a warm-up period, or at least quantified for worst case effect on the system, based upon elapsed time since system power was applied. Remaining DTDR error sources, particularly TE, change in an orderly fashion, compared to the above unpredictable factors. Consequently, over the course of operating the embodiment of the present invention in SCM, on several occasions, the effects of random sources of error may, to some degree, be separated from the more ordered sources of DTDR error, such as TE, e.g., by tracking DTDR, and noting consistent deviations among successive DTDR measurements, taken during different operations in SCM. That is, it is conceivable that consistent deviations can be quantified and, to some extent, subtracted from the total system error, evidenced by DTDR, thus increasing reportable system accuracy, each time the embodiment of the present invention is operated in SCM. For example, one of the ways this error reduction can be accomplished, if DTDR is tracked over N operations in SCM, over an ambient temperature range of, say, 1 C°, the result will be a series of N values for DTDR 53 in FIG. 8, and N AEDT values 48 in FIG. 8, associated with said specific ambient temperature range of 1 C°. If the mean value of the N DTDR values is greater than the standard deviation $\sigma_{AEDT}$, associated with said N AEDT values (and assuming that $\sigma_{DTDR} < \sigma_{AEDT}$), then it may be assumed that an ordered, consistent shift in the relevant difference temperature curve 27 (or 27a) within the 1 C° temperature range has taken place. Consequently, DTDR error may be reduced by an amount equal, or related to, the mean of the said N DTDR values, over the 1 C° temperature range. That is, a portion of said observed consistent behavior of DTDR may be effectively subtracted from the DTDR error term, used later in a consolidated estimate of error terms, including DTDR, to quantify achievable system accuracy, since said observed consistent behavior reflects a consistent shift in system behavior over multiple operations in SCM. It will be appreciated by those skilled in the art that said consistent behavior reflecting a consistent shift in system behavior, such as in the shape of the difference temperature curve 27 at a given ambient temperature, may be used to modify the shape of the difference temperature curve 27 at said given ambient temperature. Since, as will be described in connection with OM step 2 (221 in FIG. 12C), DO 51 is used to compensate difference temperature measurements, it is conceivable that said modification in the shape of difference temperature curve 27 at said given ambient temperature may be effected by modifying the value for DO at said certain ambient temperature, which would also have the effect of modifying the shape of the translated difference reference curve determined above in SCM step 215, since said translated difference reference curve is determined by translating difference reference curve 28 by the value of DO.

Figure 9:
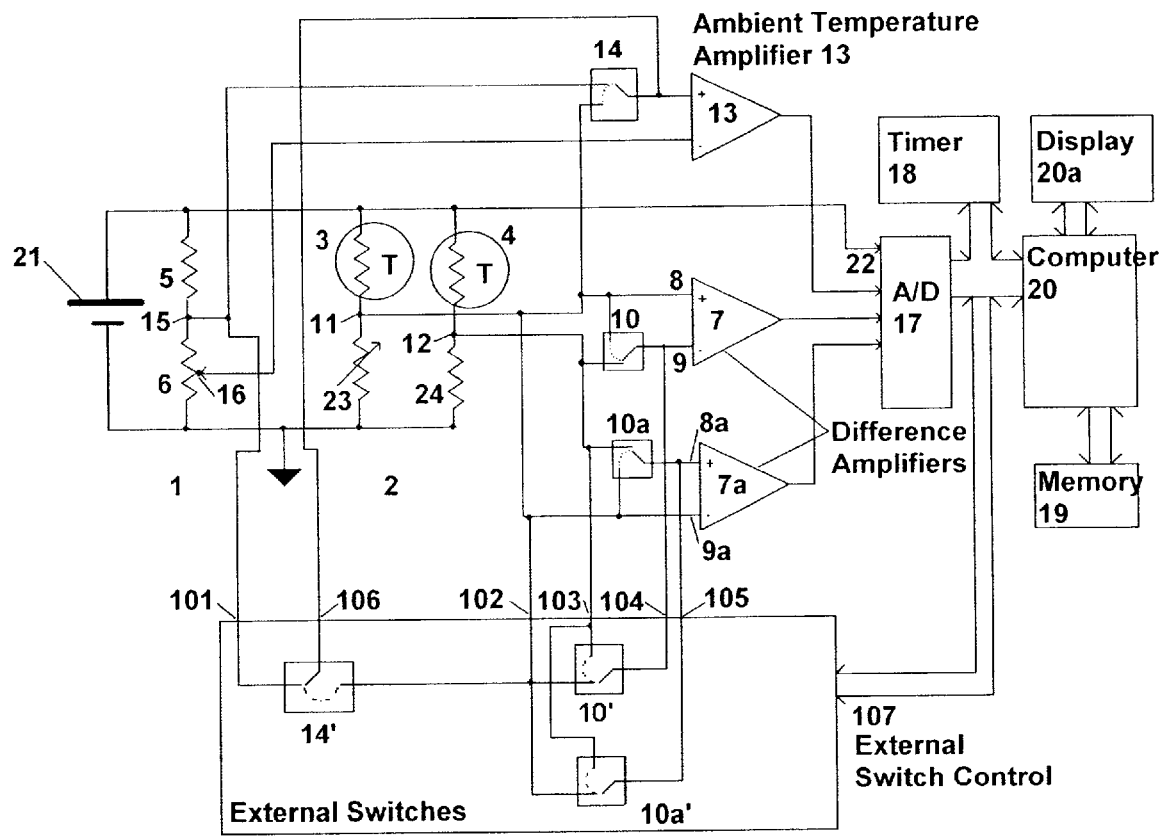
FIG. 9 is a schematic representation of a preferred external switching means for operating the preferred embodiment of FIG. 1 in the reference calibration mode, in accordance with the present invention.

Note that SCM step 211 and SCM step 215 are used to acquire reference measurements, which, referring to FIG. 1, require the use of switches 10, 10a, and 14. In the above description of the preferred embodiment, it facilitated explanation to sequence SCM steps in the above order. However, it is conceivable that SCM steps 211 and 215 may be conducted prior to the other SCM steps listed above, which would require fewer changes in the state of switches 10, 10a, and 14 in FIG. 1 during operation in SCM. Referring to FIGS. 1 and 9, it is also conceivable that a mechanical switch, or push button, may be used to both mechanically hold thermistors 3 and 4 in thermal contact during SCM, and at the same time operate switches 10, 10a, and 14 (which may also be mechanical switches). For example, this could be accomplished by using a mechanical "power on" switch that provides mechanically delayed movement (e.g., with a movement damping mechanism) after the operator presses the "power on" switch, with the delay permitting the system to substantially warm-up, while holding thermistors 3 and 4 in substantial thermal contact, and while operating switches 10, 10a, and 14 as required by SCM steps 211 and 215 for reference measurements, as described above. Subsequently, with thermistors 3 and 4 still in thermal contact, as required by operation in SCM, switches 10, 10a, and 14 would be re-configured (responsive to the above mechanically delayed movement) to be in a "measurement position" for difference measurements and ambient temperature measurements, as described in the remaining SCM steps 210, 212–214, and 216, which would be performed as described above (excluding SCM steps 211 and 215), beginning with SCM step 210. It will be appreciated by those skilled in the art, that the above mentioned mechanically delayed movements and switching actions could also be accomplished by electronic means. Note that the above described measurements in SCM are conducted quickly, and at a single ambient temperature. Subsequently, switches 10, 10a, and 14 would be configured in the measurement position (in contrast to the switch position required by SCM steps 211 and 215), throughout the remaining session of operation, including operation in the operational mode, with thermistors 3 and 4 also configured for measurements in said operation in the operational mode.

Additionally, referring to FIG. 1, note that despite the above described use during SCM and the operational mode of internal switches 10, 10a, and 14, operation in RCM still requires that computer means 20 automatically control current flow, associated with said internal switches, during RCM measurements, taking place over a range of multiple ambient temperatures. This is addressed in FIG. 9, depicting external switches for use with the preferred embodiment of FIG. 1, during operation in RCM, facilitating the use of entirely mechanical internal switches 10, 10a, and 14, and eliminating the need during RCM for computer means 20 to automatically operate internal switches 10, 10a, and 14 in successive cycles of operation in RCM, at different ambient temperatures. Connection points 101, 102, 103, 104, 105, 106, and data bus 107, for connection with internal computer means 20, are provided as shown, so that RCM, performed at the factory, would use these said connection points to permit internal computer means 20 to automatically operate external electronic switches 10', 10a', and 14', in place of internal switches 10, 10a, and 14, respectively (while internal switches 10, 10a, and 14 are configured to be in an "open" state, i.e., with no poles of said internal switches connected to inputs of any amplifier 7, 7a, or 13). Furthermore, if internal switches 10, 10a, and 14 are mechanical switches, it is conceivable that external switches 10', 10a', and 14' may be of electromechanical design, in order to more closely approximate the electrical behavior of mechanical switches, and eliminate other inaccuracies associated with solid state electronic switches, while retaining the ability to be automatically controlled by computer means 20. That is, said external switches would be used in place of internal mechanical switches 10, 10a, and 14 during operation in RCM, so that said internal switches 10, 10a, and 14 could be of mechanical design, providing lower cost and simplicity.

Operational Mode (OM)

Figure 12C:
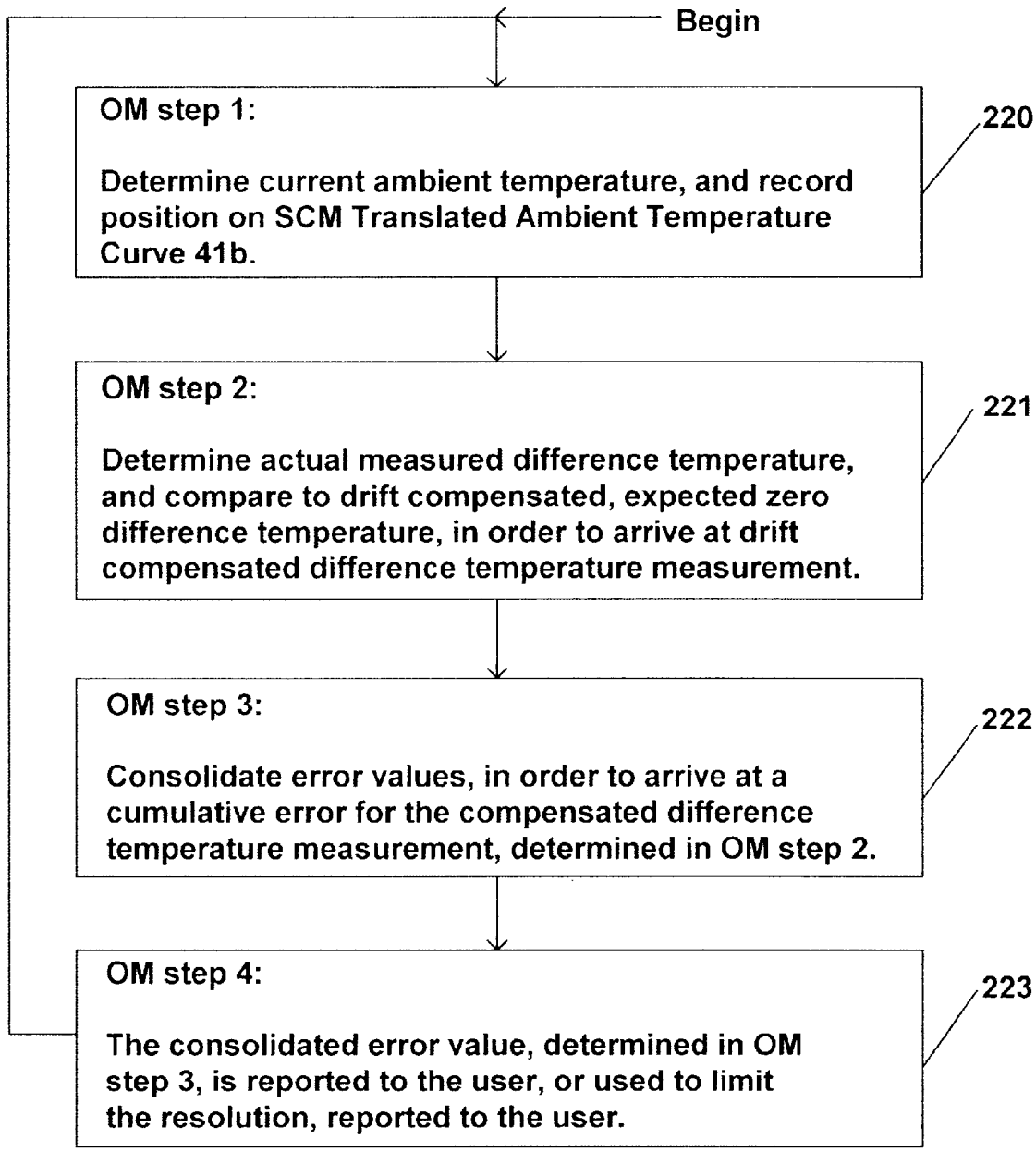
FIG. 12C is a flow diagram representing the steps involved in the preferred embodiment of the method of the present invention in the operational mode.

The embodiment of FIG. 1 is operated in the operational mode (OM) after SCM has been completed. In OM, the translated, time drift corrected curves from the most recent operation in SCM, along with a measured ambient temperature, are used to facilitate instantaneous thermal compensation, on every temperature difference measurement. Recall that operation in SCM compensates for time drift of RCM generated thermal offset curves, preferably at the outset of a session of operation, taking measurements at a single ambient temperature, and subsequently permitting substantially continuous operation in OM, utilizing said time drift corrected RCM generated offset curves. OM involves four steps, which are continuously repeated, as described below. Additionally, throughout OM, switch 10 is configured to connect bridge nodes 11 and 12 to difference temperature amplifier inputs 8 and 9, respectively, of the first difference temperature amplifier 7. Additionally, during OM, switch 10a is configured to connect bridge nodes 12 and 11 to difference temperature amplifier inputs 8a and 9a, respectively, of the second difference temperature amplifier 7a. Additionally, switch 14 is configured to connect bridge node 11 to ambient temperature amplifier 13. Switches 10, 10a, and 14 are held in this configuration for the duration of OM, which in the preferred embodiment of FIG. 1 is the remainder of the current session of operation (while power is applied to the system components of the preferred embodiment). A flow diagram, generally representing each of the individual steps involved in operation of the preferred embodiment of the present invention in the operational mode, is shown in FIG. 12C.

OM step 1 (220 in FIG. 12C): Referring to FIG. 1, in this OM step 220, computer means 20 determines the current ambient temperature, as measured by ambient temperature amplifier 13.

Figure 10:
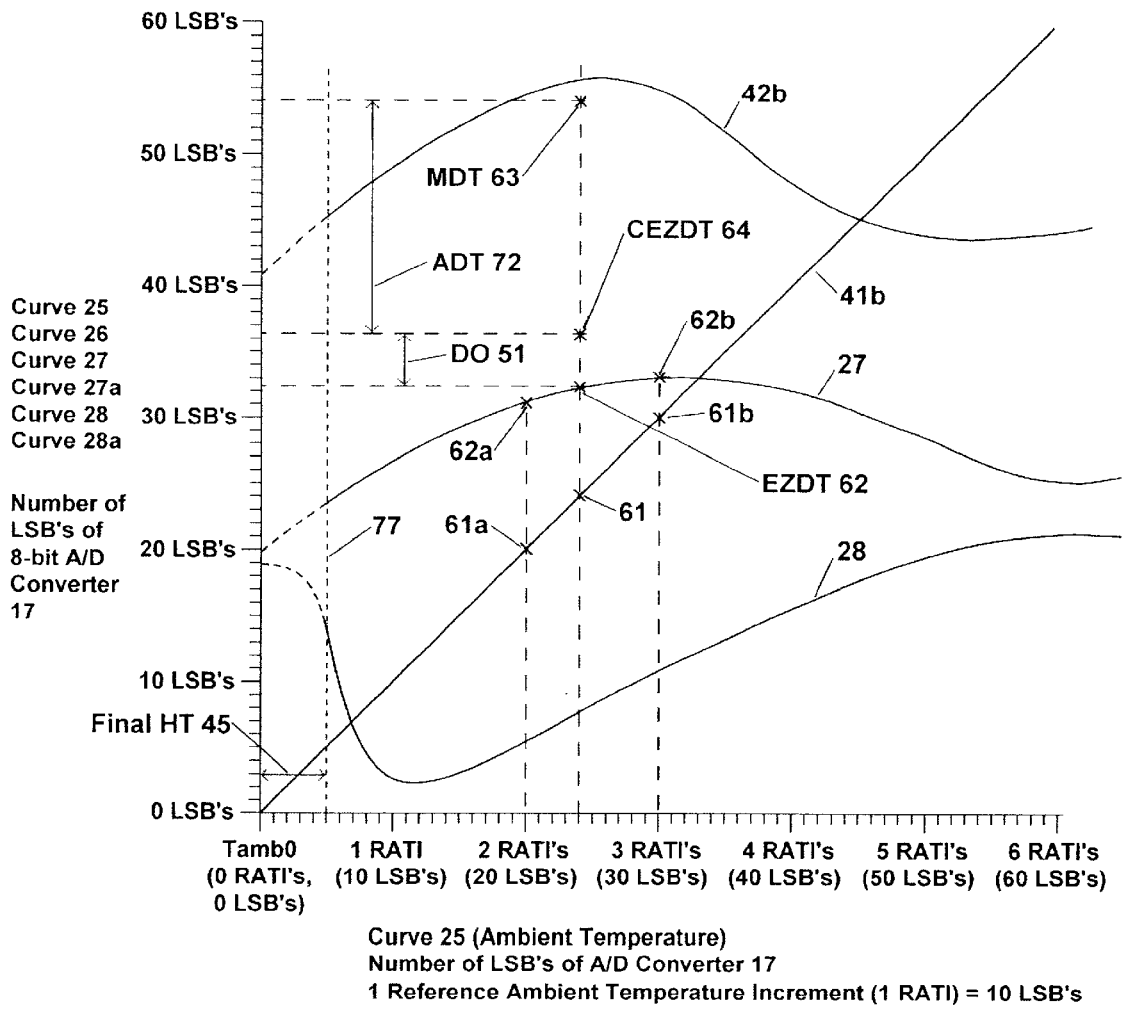
FIG. 10 is a detailed view of the lower left portion of the graph of FIG. 2, and illustrates calculations involved in relating a determination of current ambient temperature with an initial temperature difference measurement, in accordance with the first and second steps of the method of the present invention in an operational mode.

FIG. 10 depicts the same section of the graphs of FIGS. 5 and 8. However, note that RCM generated ambient temperature curve 25 does not appear (nor does RCM generated ambient reference curve 26). Instead, the coordinate system of FIGS. 5 and 8 has been shifted horizontally, by amount final HT 45 (determined during SCM step 213), such that SCM translated ambient temperature curve 41b is used to correlate ambient temperature to RCM difference temperature curve 27 and to RCM difference reference curve 28 (SCM translated ambient reference curve 42b is not used during OM, but is depicted in FIG. 10 for reference). Also, note that the shift in coordinate system, by the amount final HT 45, causes endpoints on RCM generated curves 27 and 28 to be shifted, such that to the left, of the left end of the ambient temperature range (i.e., to the left of line 77), RCM generated curves 27 and 28 do not possess stored values. Therefore, the choice of ambient temperature range over which RCM generated curves are recorded preferably takes such potential shifts (as that depicted in FIG. 10 to the left of line 77) into consideration, so that operation of the preferred embodiment of FIG. 1 is supported over a desired range of temperatures, which may be subject to said potential shifts.

In order to determine the current ambient temperature, an ambient temperature measurement is made, as previously described, according to the preferred embodiment of FIG. 1, using ambient temperature amplifier 13. Referring to FIG. 10, depicting the same section of the graph of FIGS. 5 and 8, shifted as described above, a current ambient temperature measurement is identified as point 61 and is hereafter referred to as measured ambient temperature point 61, situated on SCM translated ambient temperature curve 41b. Additionally, an interpolation fraction is associated with measured ambient temperature point 61 (the use of interpolation fractions is described above in SCM step 212), based upon the closest calibration points to said ambient temperature point 61 on SCM translated ambient temperature curve 41b (points 61a and 61b). The interpolation fraction associated with ambient temperature point 61 (40% in FIG. 10) is stored in memory 19.

OM step 2 (221 in FIG. 12C): In this OM step 221, computer means 20 (FIG. 1) determines the actual temperature difference measurement between thermistors 3 and 4 (FIG. 1), at the current measured ambient temperature, determined above in OM step 220. Thermistors 3 and 4 are deployed in different thermal environments or at different thermal contact positions to perform temperature difference measurements, or alternatively thermistors 3 and 4 are in thermal contact to produce random thermal difference measurements between said thermistors 3 and 4.

First, computer means 20 preferably finds the larger of points on RCM difference temperature curves 27 and 27a (FIG. 2), which are associated with the above measured ambient temperature point 61 on SCM translated ambient temperature curve 41b (FIG. 10), acquired during OM step 220. In FIG. 10, the above said associated points on the RCM difference temperature curve 27 (curve 27 is assumed to possess the larger of temperature difference points, compared to curve 27a in the present example), associated with said points 61a and 61b, are identified as points 62a and 62b, respectively. Next, computer means 20 uses the interpolation fraction, determined during OM step 220, above, (40%) to determine the expected point on RCM temperature difference curve 27, identified as point 62 in FIG. 10, which represents the expected difference voltage for the current ambient temperature, if thermistors 3 and 4 were at the same temperature. Use of said interpolation fraction is as described above in SCM step 212. Said expected point is hereafter referred to as expected zero difference temperature (EZDT) 62.

Next, referring to FIG. 1, a measurement of the difference between bridge nodes 11 and 12 is performed by difference temperature amplifiers 7 and 7a. The largest of these is stored in memory 19, along with a reference to the amplifier (7 or 7a) which acquired it. Referring to FIG. 10, the stored measurement of the difference between bridge nodes 11 and 12 is hereafter referred to as the measured difference temperature (MDT) and is identified as MDT 63. For the purpose of the present description, MDT 63 is placed as shown in line with points 61 and 62.

Next, computer means 20 adds the value last stored for DO 51 (determined during the last operation during SCM step 215) to the value (referring to FIG. 10) associated with EZDT 62, and the result is the compensated expected zero difference temperature (CEZDT), identified as point 64 in FIG. 10. This is the expected difference temperature measurement for the current ambient temperature, if both thermistors 3 and 4 were at the same temperature, compensated for difference measurement component drift (DO 51). It is noted that in the preferred embodiment, DO 51 is applied to any measured EZDT 62 in this OM step 221, in order to arrive at a corresponding value for CEZDT 64, and therefore, due to the substantially linear drift of offset curves over time, DO 51, as determined in SCM step 215 at an arbitrary ambient temperature, can be regarded as a vertical translation of the difference temperature curve over the full range of ambient temperatures over which difference temperature curve 27 was acquired during operation in RCM, as well as a vertical translation of the difference reference curve 28, which resulted in a translated difference reference curve, as was described above in connection with SCM step 215. It will be appreciated by those skilled in the art that if, as described above for the preferred embodiment, DO 51 is a single value throughout the range of ambient temperatures over which RCM curves were acquired during operation in RCM, then the additional software and memory overhead required to calculate and store a translated difference reference curve from which to determine values for DO at different ambient temperatures within said range of ambient temperatures is not required, and instead only the said single value of DO 51 needs to be stored in memory, since said translated difference reference curve is determined only by adding said single value of DO 51 to the difference reference curve 28, as was described above in connection with SCM step 215. Referring to FIG. 10, the discrepancy between the value associated with CEZDT point 64 and MDT 63 represents a difference temperature between thermistors 3 and 4, compensated for component drift, and is hereafter referred to as adjusted difference temperature (ADT) and is identified as 72 in FIG. 10. Cumulative error values associated with the difference temperature measurement are discussed below in OM step 222.

OM step 3 (222 in FIG. 12C): In this OM step 222, error values associated with the above measurements are consolidated, to yield a cumulative error associated with the adjusted difference temperature (ADT) 72, determined above during OM step 221.

Figure 11:
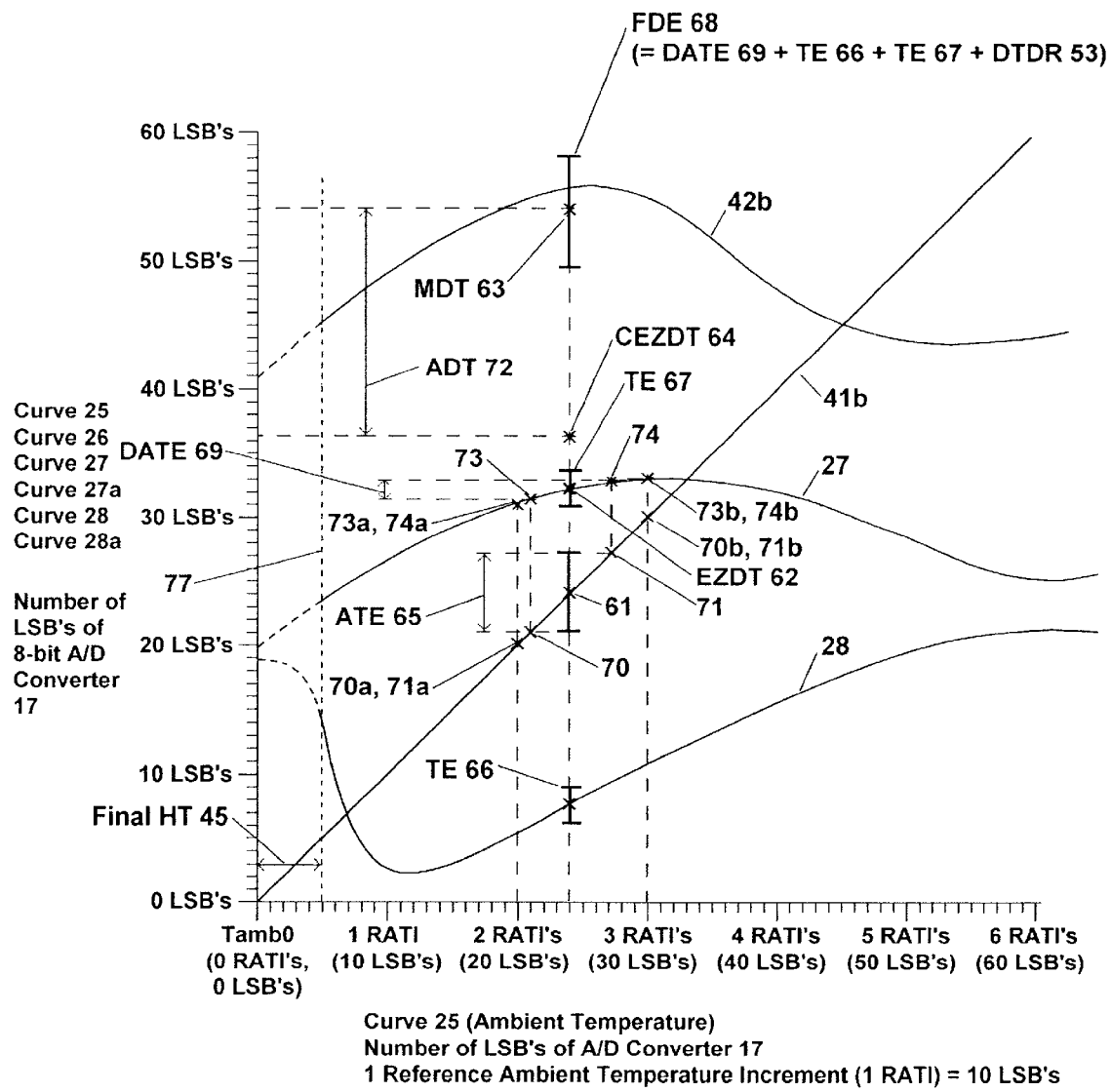
FIG. 11 is a detailed view of the lower left portion of the graph of FIG. 2, and illustrates calculations involved in a determination of the final temperature difference measurement, and consolidation of errors associated with that measurement, in accordance with the third and fourth steps of the method of the present invention in the operational mode.

Referring to FIG. 11, recall that associated with the RCM generated curves, is an error associated with the time drift of components, including feedback resistors, bridge resistors, and thermistors, which has the effect of changing the "shape" of RCM generated curves, over time. This error is referred to as TE, and was described in detail as part of SCM step 213. Recall, also, that TE as it affects the ambient temperature measurement, determined as described in SCM step 213, was associated with translated ambient temperature curve 42b, and it was demonstrated, in connection with FIG. 6, that said TE associated with the ambient temperature measurement, and initially associated with translated ambient temperature curve 42b in SCM step 213, could also be applied to SCM translated ambient temperature curve 41b. A hypothetical TE, associated with the ambient temperature measurement in the present example, is identified by ambient temperature TE error bar (ATE) 65 in FIG. 11.

Additionally, recall that in the discussion of TE, in SCM step 213, there were also mentioned similarly derivable additional TE's, for RCM generated difference temperature curve 27 and difference reference curve 28. These additional TE's can be quantified as described generally in connection with FIG. 7 (as part of SCM step 213 for a hypothetical curve 55). Referring to FIG. 11, these additional TE's associated with relating points on SCM translated ambient temperature curve 41b to other RCM generated curves include: a differential temperature TE, associated with the process of relating a point on SCM translated ambient temperature curve 41b with a corresponding point on difference temperature curve 27, hereafter referred to as difference temperature TE, identified in FIG. 11 as TE error bar 67; and a difference reference TE, associated with the process of relating a given point on SCM translated ambient temperature curve 41b with a corresponding point on difference reference curve 28, hereafter referred to as difference reference TE, identified in FIG. 11 as TE error bar 66. Referring to FIG. 11, note that TE error bars 66 and 67 represent hypothetical values to illustrate the method of the present invention. Finally, there is the hypothetical error value associated with DTDR 53 (shown in FIG. 8 as two LSB's of A/D converter 17, and not shown in FIG. 11), described above in SCM step 215. In OM step 222, the above error terms are all consolidated, to yield a final difference error (FDE) directly related to the difference temperature measurement, as described below.

Referring to FIG. 11, in order to be applicable to a final difference temperature measurement, the final consolidation of error terms preferably comprises error terms which are all associated directly with a difference measurement related to either difference temperature curve 27 or difference reference curve 28 (recall that in the present example, referring to FIG. 2, difference measurements are associated with the first difference temperature curve 27 and the first difference reference curve 28, as opposed to the second difference temperature curve 27a and the second difference reference curve 28a). All such error terms are eventually consolidated into an error bar that preferably surrounds the measured difference temperature point (MDT) 63. DTDR 53 and TE's 66 and 67 are already directly associated with either difference temperature curve 27, or difference reference curve 28, and therefore are already directly applicable to a final temperature difference measurement. However, error constituents, associated with ambient temperature measurements (i.e., ATE 65) must be converted into its direct impact upon the temperature difference measurements. Recall that over any given ambient temperature range, difference temperature measurements of the preferred embodiment of FIG. 1 typically vary two to three orders of magnitude more slowly than ambient temperature measurements, over the operating ambient temperature range of the preferred embodiment. Therefore, the error value associated with ATE 65, which represents an error in the ambient temperature measurement, will typically be attenuated by two to three orders of magnitude, when quantified for its effect upon difference temperature measurements. Additionally, note, as mentioned above, that the slow variation of thermal offset curves, relative to ambient temperature, as depicted in the figures is necessarily exaggerated, in order to illustrate the method of the present invention.

Once converted into its direct effect on difference temperature measurements, the effect of TE error bar ATE 65 on temperature difference measurements is added to DTDR 53 and TE's 66 and 67 by computer means 20, in order to provide a final cumulative difference error value, or final difference error (FDE) 68 in FIG. 11, surrounding MDT 63, as shown. FDE 68, for any given difference temperature measurement, represents the uncertainty, or potential error, in said temperature difference measurement.

As described above, referring to FIG. 11, the error component, related to ambient temperature measurement, is represented by ATE 65. Referring to FIG. 11, the procedure in OM step 222 to calculate the contribution of ATE 65 to the final difference error measurement (FDE) 68 is as follows. The computed value for ATE 65 is preferably first applied to SCM translated ambient temperature curve 41*b*, such that the current ambient temperature measurement point 61 in the present example is situated at the midpoint of ATE 65, as shown. The resulting ATE endpoints include a first ATE endpoint 70 and a second ATE endpoint 71. Said ATE endpoints are next each associated with the nearest recorded calibration points on SCM translated ambient temperature curve 41*b*, along with an interpolation fraction, as described above in SCM step 212 for each of said first and second ATE endpoints 70 and 71. Consequently, there will be a calculated first interpolation fraction, along with two first associated points 70*a* and 70*b* on SCM translated ambient temperature curve 41*b*, for first ATE endpoint 70; and a calculated second interpolation fraction, along with two second associated points 71*a* and 71*b*, as illustrated in FIG. 11, on SCM translated ambient temperature curve 41*b*, for second ATE endpoint 71, as shown in FIG. 11. The resulting two said first associated points 70*a* and 70*b* on SCM translated ambient temperature curve 41*b* are then used to find their associated recorded calibration points 73*a* and 73*b* on RCM difference temperature curve 27. The same process is repeated to determine recorded calibration points 74*a* and 74*b* on RCM difference temperature curve 27, associated with the two said second associated points 71*a* and 71*b* on SCM translated ambient temperature curve 41*b*.

Next, referring to FIG. 11, the first and second interpolation fractions, associated above with each of first and second ATE endpoints 70 and 71, respectively, are now used to find the exact position of said points 73 and 74 on difference temperature measurement curve 27 that are associated with said ATE endpoints 70 and 71, respectively, using said interpolation fractions by the method described in SCM step 212. The value of the arithmetic difference between the vertical axis values of points 73 and 74 on difference curve 27 is the magnitude of ATE that is applied to FDE 68, hereafter referred to as difference ATE (DATE), identified in FIG. 11 as DATE 69. The magnitude of DATE 69 is then added to DTDR 53 (determined during SCM step 216 and depicted in FIG. 8), as well as to TE 66 and TE 67, to equal the final value of FDE 68, as shown in FIG. 11.

OM step 4 (223 in FIG. 12C): Referring to FIG. 11, the difference between the value associated with CEZDT 64 (determined during OM step 221) and the measured difference value, represented by MDT 63 (determined during OM step 221) in FIG. 11, represents a difference temperature between thermistors 3 and 4 (ADT 72 in FIG. 11), compensated for component drift. This value is considered to be accurate to within the value of FDE 68, determined above, during OM step 222. FDE 68 is preferably used to control the way that difference temperature ADT 72 is reported to the user by computer means 20. For example, if an instantaneous FDE value is determined to be equal to four LSB's of A/D converter 17 (FIG. 1), then reported temperature differences should be in increments of not less than four LSB's of A/D converter 17, and this resolution limit is preferably reported to the user, for example, on digital display 20*a*, along with the compensated temperature difference measurement ADT 72.

It will be appreciated by those skilled in the art that difference measurements determined by the method of the present invention, and quantified in terms of LSB's of an analog to digital converter (e.g., A/D converter 17, FIG. 1), can be correlated to actual values of a physical quantity, such as temperature. In the case of temperature, for example, referring to FIG. 1, this correlation may be accomplished by calculating the effect of a hypothetical temperature difference between thermistors 3 and 4, taking bridge voltage at point 22 into account, and noting the resulting difference voltage that would appear at the outputs of amplifiers 7 and 7*a*, as a result of said hypothetical temperature difference. Additionally, it is conceivable that such a correlation between LSB's of an analog to digital converter, and actual values of differences in a physical quantity, such as temperature, can be made empirically, by intentionally applying a known difference in said physical quantity to the difference measurement system of the present invention. For example, in the case of temperature difference measurements, referring again to FIG. 1, if a known temperature difference of 0.1 C° is intentionally applied between thermistors 3 and 4, at a given ambient temperature, and said known temperature difference of 0.1 C°, results in a difference measurement, determined by the method of the present invention, of 1000 LSB's of A/D converter 17, then a numerical correlation factor between LSB's of A/D converter 17, at least at the above mentioned given ambient temperature, and actual temperature differences between thermistors 3 and 4 can be made, which, in the case of the present example, would be 1000 LSB's/0.1 C°, or 100 LSB's/micro-degree C. It will be appreciated by those skilled in the art that additional intentionally applied differences in an above said physical quantity (e.g., in the above example, at 1 C°, and 0.01 C°, in addition to 0.1 C°) can be applied to achieve a greater range of measurement and/or greater accuracy, and that such correlations may be made at the time of operation in RCM, at specific ambient conditions, or over a range of expected ambient conditions. The latter case of intentionally applying at least one known difference in a physical quantity over a range of ambient conditions would result in at least one curve relating said known difference in a physical quantity to measurements in LSB's of an analog to digital converter (e.g., A/D converter 17 in FIG. 1) over said range of ambient conditions, such that any given ambient condition within the said range of ambient conditions, on said curve, corresponds to a correlation factor relating LSB's of an analog to digital converter, at the above given ambient condition, to said known difference in a physical quantity. Then, during operation in SCM, using the above said curve, it is conceivable that the said known difference in a physical quantity can be intentionally applied once again, at a given ambient condition determined at the time of operation in SCM, and the resulting difference measurement in LSB's of said analog to digital converter compared to the recorded difference measurement in LSB's, on the above said curve, recorded at the time of operation in RCM, while the said known difference in a physical quantity was being intentionally applied, at the above said given ambient condition, in order to update the correlation factor between differences in said physical quantity, and the resulting difference measurements in LSB's of said analog to digital converter. Such an updated correlation factor, referred to below as $C_1$, determined during operation in SCM, at the above said given ambient condition determined at the time of operation in SCM, can be applied to all subsequent measurements during operation in OM, or the said updated correlation factor $C_1$ can be related to the correlation factor referred to below as $C_0$, determined at the time of operation in RCM (and associated with the above said given ambient condition, on the above said curve), to provide a correlation factor correction, referred to below as $X_C = C_1/C_0$. Subsequently, during operation in OM, the above said correlation factor correction $X_C$, can be applied to other correlation factors, on the above said curve, such other correlation factor being referred to below as $C_0'$, associated with an ambient condition on said curve, said ambient condition determined during operation in OM. For example, if at a given ambient condition, determined during operation in OM, the expected correlation factor is $C_0'$ on the above said curve (said curve determined at the time of operation in RCM), the corrected correlation factor at the said given ambient condition would be $C_1' = X_C * C_0'$, with the correlation factor correction $X_C$ determined as described above. It is also conceivable that during OM, at least one known difference in a physical quantity can be intentionally applied, at any time, as described above, to yield correlation factors usable at ambient temperatures determined during operation in OM.

It will be appreciated that the embodiments of the present invention described above are susceptible to various modifications, changes, and adaptations. For example, other measurement systems into which differential signals are coupled, that can readily be made to have sufficiently equal measurable values, in order to facilitate operation in RCM and SCM (as described above), such as amplifiers with differential inputs held at substantially equal values during operation in RCM and SCM by, for example, connecting the differential inputs together, to a common voltage, or connecting them to a common reference signal, or a system ground potential, are contemplated within the scope of the invention. It will be appreciated by those skilled in the art that where the physical variable difference being measured is purely a voltage difference, for example, between two nodes in a circuit (in contrast, for example, to a temperature difference between two physical locations, transduced by a pair of sensors at those locations, and converted into two voltages representative of the respective temperatures at those locations, as described in connection with FIG. 1), the associated two nodes being measured for voltage difference can be coupled directly to amplifier inputs of a difference amplifier, for example, points 8 and 9 (and/or 8*a* and 9*a*), in FIG. 1, and the said nodes held at substantially equal values during operation in RCM and SCM by, for example, connecting them together, or to a common reference signal, or to a system ground, or to another common potential. Thus, it will be appreciated that in the case of measuring only differences in voltage (i.e., in contrast to measuring a difference in a physical variable such as temperature or pressure or other variable, transduced by a pair of sensors, and represented as a pair of voltages) the drift compensation method of the present invention will compensate the composite drift over time and temperature of amplification electronics and analog to digital converters, as well as the drift contributions of associated auxiliary circuit elements such as resistors and capacitors operating in conjunction with the amplification electronics and analog to digital converters, with the advantage that higher drift, lower cost amplification electronics and/or analog to digital converters, using lower cost auxiliary components, may be used, to achieve higher accuracy measurements than would normally be achievable with such amplification electronics, analog to digital converters, and auxiliary components. A further advantage is that undesirable interruptions for compensation in the measurement process are avoided, since compensation is substantially achieved at a single, current arbitrary ambient temperature, the measurements for which are obtained quickly, in SCM, in accordance with the method of the present invention. It will further be appreciated by those skilled in the art, that in the case of the measured physical variable difference being purely a voltage potential difference, between the said two nodes, that a measurement signal potential at one of the said nodes, relative to a reference (e.g., ground) potential at the other of said nodes, is itself representative of a difference between the said measurement signal potential and the said reference potential. That is, if the physical variable being measured is voltage potential, and a difference is being measured between a measurement signal potential and a reference signal potential, the reference signal potential always having a potential of ground (zero volts), then it will be appreciated by those skilled in the art that the measurement signal potential can itself be interpreted as being representative of a difference between the measurement and reference signal potentials. In this case, it will be appreciated by those skilled in the art that, in order to facilitate such an interpretation, the said measurement signal potential could be amplified, and applied to the analog to digital converter's analog input, with the analog to digital converter's analog ground pin connected to the said reference signal potential, and with the said reference signal potential available at the physical location of the measurement, as well as at the amplification electronics and at the location of the analog to digital converter, to provide a voltage measurement of the said measurement signal potential, compensated for time and temperature drift of amplification and analog to digital converter electronics, in accordance with the compensation method of the present invention. It will be further appreciated by those skilled in the art, that the said reference signal potential may be a static reference potential (e.g., a system ground, signal from a voltage reference, or any voltage against which the said measurement signal potential is to be measured), provided that the said reference signal potential is available at the physical location of the measurement, at the amplifier, and at the physical location of the analog to digital converter. It is also conceivable, and will be appreciated by those skilled in the art, that the said reference signal potential may be a dynamic (e.g., sinusoidal or other time-varying) potential, provided that the said reference signal potential is available at the physical location of the measurement, at the amplifier, and at the physical location of the analog to digital converter.

Additionally, it will be appreciated by those skilled in the art that the drift compensation method of the present invention can be applied in cases where differential signals are amplified by a factor of one (i.e., buffered), or even attenuated, with the principal signal resolving power effectively occurring at the analog to digital converter (e.g., using a high resolution analog to digital converter, with, for example, 14-bit or higher resolution, of the type well known in the art). In the former case of unity gain, as described above, it will be appreciated that the drift compensation method of the present invention will act primarily to compensate the time and temperature drift of the analog to digital converter electronics, as well as the drift contributions of the unity-gain amplifier, and associated auxiliary circuit elements such as resistors and capacitors operating in conjunction with the said amplifier and analog to digital converter. By extension, it will be appreciated that, in the above described case of measuring a voltage difference between a measurement signal potential and a reference (e.g., system ground) potential, amplified at unity gain, an alternative to coupling the two said potentials to a unity-gain difference amplifier (or buffer), is to couple the said measurement signal potential directly to the analog input of the analog to digital converter, and the said reference potential directly to the analog ground pin of the analog to digital converter, thereby conceivably eliminating the need for the said unity-gain amplifier (or buffer). It will be appreciated that in this case, the drift compensation method of the present invention acts primarily to compensate the time and temperature drift of the analog to digital converter, as well as the drift contributions of associated auxiliary circuit elements such as resistors and capacitors operating in conjunction with the analog to digital converter, with the advantage that higher drift, lower cost analog to digital converters, using lower cost auxiliary components may be used, to achieve higher accuracy measurements than would normally be achievable with such analog to digital converters and auxiliary components, and with the further advantage that undesirable interruptions for compensation in the measurement process are avoided, since compensation is substantially achieved at a single, current arbitrary ambient temperature, the measurements for which are obtained quickly, in SCM, in accordance with the method of the present invention. It is also conceivable that rather than being amplified, or directly coupled to an analog to digital converter, a measurement signal potential could be attenuated by active and/or passive components such as a resistor divider, capacitor divider (for alternating current circuits), or other bridge device for attenuating signals, of the types well known in the art.

One useful application of the present invention in the above cases where the physical variable being differenced and measured is voltage, and in which amplification may or may not be required, is in electrical test and measurement devices such as digital voltmeters, and more generally, digital multimeters, in which voltage, and other electrical properties that can be represented as a voltage potential (such as current, resistance, and capacitance), are measured against a ground, reference, or other potential available at the location of the measurement, and at the location of the measurement electronics. For example, it is well known in the art that electrical properties such as electrical current can be measured by disconnecting two nodes in a circuit under test, between which current normally flows, and instead connecting the said nodes through a low-value resistor which is part of a digital measurement instrument (such as a digital multimeter), and then measuring the voltage difference between the ends of the said low-value resistor, and then applying Ohm's law to compute the current flow, from both the measured potential difference across the said low-value resistor and the known resistance value of the said low-value resistor. As in the above described cases involving voltage as the physical variable being measured, and more specifically, in the above said instance of a current measurement, a voltage difference is measured, and as is well known in the art, one end of the said low-value resistor provides a measurement signal potential, while the other end of said low-value resistor serves as the reference potential, and the voltage difference is determined with the said reference signal potential connected to an analog to digital converter's analog ground, and the amplified or unamplified measurement signal potential coupled to the analog to digital converter's analog input, and the resulting voltage, with the known resistance value of the said low-value resistor, and amplifier gain (if any), are used to compute current flow by Ohm's law.

Alternatively, it is well known in the art that electrical properties such as electrical current can be measured by a current transformer coupled between two nodes in a circuit under test, between which current normally flows and charging a capacitor which is part of a digital measurement instrument (such as a digital multimeter), and using the voltage difference between the capacitor voltage and a reference signal potential to compute the current flow, from both the measured potential difference across the said capacitor and the known reference signal potential and current transformer characteristics. As in the above described cases involving voltage as the physical variable being measured, and more specifically, in the above said instance of a current measurement, a voltage difference is measured, and as is well known in the art, capacitor voltage provides a measurement signal potential, and the voltage difference is determined with the said reference signal potential connected to an analog to digital converter's analog ground, and the amplified or unamplified measurement signal potential coupled to the analog to digital converter's analog input, and the resulting voltage, with the known transformation ratio of the current transformer, and amplifier gain (if any), are used to compute current flow.

It is also well known in the art that measurements of other electrical properties such as resistance, capacitance, conductance, and transistor characteristics, as well as other electrical properties routinely made by electrical test and measurement devices such as digital multimeters can be performed by creating a voltage potential difference between two points, one of which serves as a reference voltage potential, or ground potential to be connected to the analog ground of the measurement instrument's analog to digital converter, and the other potential serving as a measurement signal voltage potential as described above in the case of current measurement. The voltage difference is determined, and then used with other parameters (such as in the above cases using the resistance value of the low-value resistor or transformer ratio of the current transformer) to calculate the value of the electrical property under test. In these cases of measuring electrical properties such as current, resistance, and capacitance, the compensation method of the present invention is as described above, for the case of the physical variable under test being voltage, except that, as in the above case of current measurement, one or more additional components (e.g., a low-value resistor or current transformer and capacitor, as in the above cases) are utilized "in front" of the amplification electronics (if present) and analog to digital converter, for manifesting the electrical property under test as a voltage that can computationally be converted to a value for the electrical property under test, using the resulting voltage measurement, and known values for the above said one or more additional components. By way of an additional example, to illustrate measurement of electrical properties which can be calculated from a voltage, and known component properties, the measurement of electrical resistance provides an instructive example in the use of the compensation method of the present invention to compensate such measurements, and will now be described. In this case of resistance measurement, it is common to use a current generator that is part of the measurement system, to provide a known current across a resistance value under test, and the resulting voltage across the said resistor under test measured, and the said resulting voltage across the said resistor under test used with the said known current to compute the resistance value of the said resistor under test, by Ohm's law. In these cases of measuring electrical properties such as current, resistance, and capacitance, by electrical test and measurement devices such as digital multimeters, it will be appreciated by those skilled in the art, that the compensation method of the present invention can be used to compensate the time and temperature drift of amplification electronics (if any) and analog to digital converter, as well as the drift contributions of associated auxiliary circuit elements such as resistors and capacitors operating in conjunction with the amplification electronics and analog to digital converter, with the advantage that higher drift, lower cost amplification electronics and/or analog to digital converters using lower cost auxiliary components may be used, to achieve higher accuracy measurements than would normally be achievable with such amplification electronics and analog to digital converters, and auxiliary components and with the further advantage that undesirable interruptions for compensation in the measurement process are avoided, since compensation is substantially achieved at a single, current arbitrary ambient temperature, the measurements for which are obtained quickly, in SCM, in accordance with the method of the present invention. It is also conceivable, and will be appreciated by those skilled in the art, that the above said additional components positioned "in front" of any amplification electronics and analog to digital converter, for the purpose of determining electrical properties such as current, resistance, and capacitance (e.g., a low-value resistor or current transformer, as in the above cases of current measurement, or a current generator as in the above case of resistance measurement), can also be compensated for time and temperature drift in accordance with the method of the present invention. More specifically, in these cases of measuring electrical properties such as current, resistance, and capacitance, and in which additional components positioned "in front" of any amplification electronics and analog to digital converter, are compensated for drift by the method of the present invention, it will be appreciated that thermal offset curves are recorded in a reference calibration mode (RCM), correlating ambient temperature measurements to measurements from the amplification electronics (if present), and analog to digital converter, including one curve with a zero voltage difference maintained (between inputs to amplification electronics, if present, or if not present, between the analog input to the analog to digital converter and its analog ground), and another curve recorded with said additional components connected, and operational in a known state (if active, as in the above case of a current generator for measuring resistance), and if necessary, said additional components connected to a known nominal value of the item to be tested, as would be required in the case of a resistance measurement (in order to complete the circuit path through which the current generated by the above said current generator flows, to provide a voltage across the resistor under test). It will be appreciated by those skilled in the art that during operation in a standard calibration mode (SCM), in accordance with the method of the present invention, the said additional components will be similarly connected, and/or operational in a known state (if active, as in the above case of a current generator for measuring resistance), and if necessary, connected to the same said known nominal value of the item to be tested, so that a measurement (compensated for any drift contributions of amplification electronics and analog to digital converter, during operation in SCM) can be compared to an expected value at the current ambient temperature, in accordance with the method of the present invention, in order to provide an offset corresponding to the drift of said additional components, which can be applied, in accordance with the method of the present invention, during subsequent operation in the operational mode.

Figure 14:
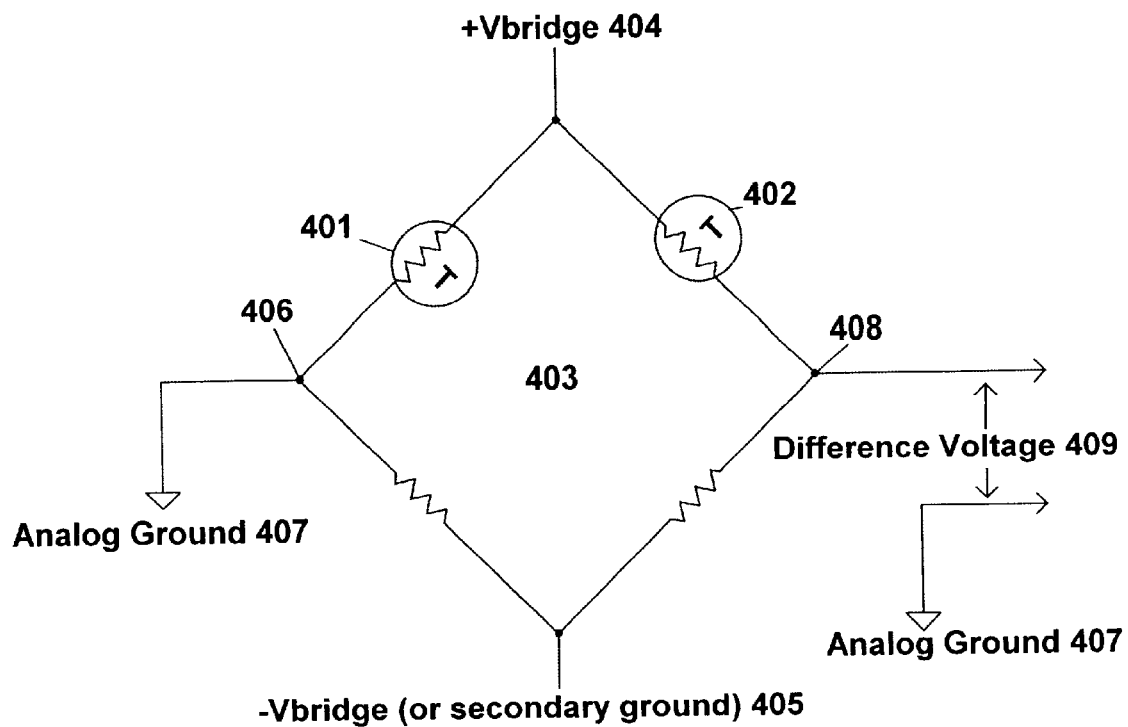
FIG. 14 is a schematic representation of components comprising a circuit in accordance with yet another preferred embodiment of the present invention.

Additionally, in the case of measurements of physical variables involving sensors, such as temperature sensors, it is well known in the art that, referring to FIG. 14, for example, two temperature sensors 401 and 402, can be configured in a bridge circuit 403 (excited by bridge voltages 404 and 405), such that one reference node 406 of the said bridge circuit is connected to an analog ground or reference potential 407, and the other measurement node 408 provides a voltage 409, itself representative of a difference in temperature between the two said temperature sensors 401 and 402. Thus, in such a configuration, it will be appreciated by those skilled in the art, that the present invention would connect the said analog ground or reference potential 407 to the amplification electronics (if present, in order to provide a reference potential against which another potential can be measured), and to an analog ground of an analog to digital converter (the analog ground of the analog to digital converter providing a reference potential against which an input to the analog to digital converter can be measured), with the other said measurement node 408 providing a voltage, itself representative of difference temperature, coupled to amplification electronics if present, and if not present, to the analog input of the analog to digital converter. It will be appreciated by those skilled in the art that other types and configurations of sensors may replace the temperature sensors of FIG. 14.

Figure 13:
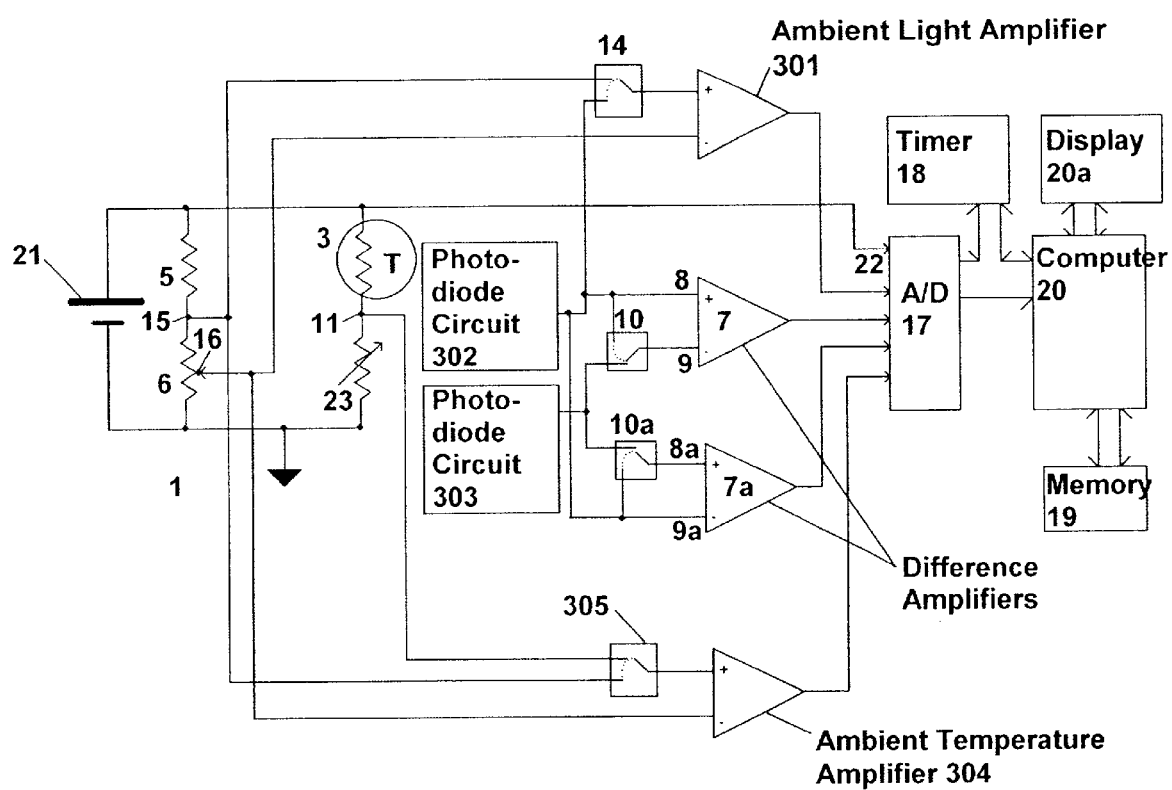
FIG. 13 is a schematic representation of components comprising a circuit in accordance with another preferred embodiment of the present invention.

Additionally, other differential measurement systems into which differential signals are coupled, that can be made to have sufficiently equal measurable values, in order to facilitate operation in RCM and SCM (as described above), such as amplifiers with differential inputs held at substantially equal values during operation in RCM and SCM by, for example, connecting the differential inputs together, to a common voltage, or connecting them, for example, to a common reference signal, or a system ground potential, or by positioning sensors such that they are subject to substantially the same excitation of a physical variable to which said sensors are susceptible, said inputs at other times, specifically during OM, being connected to other electronics having differential signals, for example, to fixed or variable resistance bridge circuits, circuits having differential currents (e.g., a differential electrometer), and circuits employing any type of sensor or transducer from which a signal may be obtained, can readily be adapted for use in association with the drift compensation method of the present invention. In the later cases, in which differences in signals, not representative of temperature (e.g., light intensity or frequency, pressure, or other physical variable requiring the use of a transducer), are being measured, and in which component drift due to temperature variation is not significant, time drift compensation can conceivably be accomplished by replacing measurement bridge 2 in FIG. 1 with another type of sensing electronics, similarly having two outputs. For example, two photodiode detection circuits, of the type well known to persons skilled in the art, for measuring differential light intensity, may replace measurement bridge 2 in FIG. 1, with the two outputs, from said two photodiode detection circuits, connected to difference amplifiers 7 and 7a in FIG. 1, with one of said outputs connected to ambient amplifier 13. That is, in this case of the embodiment for measuring differential light intensity, ambient temperature amplifier 13 in FIG. 1 would measure ambient light intensity, and difference temperature amplifiers 7 and 7a, connected to said photodiode circuits, would instead measure differential light intensity. In this case, operation of the present invention will be the same as described earlier, except that rather than cycling such an embodiment for measuring differential light intensity through a range of ambient temperatures, during operation in RCM, said embodiment would instead be cycled through a range of expected ambient light intensities, with both of the photodiode circuits configured to experience an identical level of light intensity, during operation of said embodiment in both RCM and in SCM. That is, rather than compensating variations in difference temperature measurement, due to ambient temperature variations, variations in the light intensity difference measurements, due to variations in the level of ambient, or "common mode", light intensity would be compensated, along with component time drift. Additionally, in the case of the embodiment for measuring differential light intensity, the set of RCM generated curves associated with said embodiment, rather than correlating ambient temperature to expected zero difference temperature, would instead correlate ambient light intensity to expected zero difference light intensity. In the case of such an alternative embodiment of the present invention, for measuring differential light intensity, and in which both time and temperature drift are considered significant, but in which variations in measured differential light intensity do not vary significantly with ambient (common mode) light intensity, measurement bridge 2 in FIG. 1 would still be replaced by said photodiode circuits, for measuring differences in light intensity, and difference temperature amplifiers 7 and 7a in FIG. 1 would still measure differential light intensity. However, ambient temperature amplifier 13 in FIG. 1 would measure ambient temperature, independently of the differential light intensity measurement, and independently of associated photodiode circuitry, and, moreover, it will be appreciated that the set of RCM generated curves associated with such an embodiment, rather than correlating ambient temperature to expected zero difference temperature, as in the embodiment depicted in FIG. 1, would instead correlate ambient temperature to expected zero difference light intensity. It will be appreciated by those skilled in the art that such an embodiment of the present invention could use any ambient temperature measurement technique, keeping in mind, however, that the effects of time and temperature drift of said ambient temperature measurement technique, upon differential measurements, are typically attenuated by two to three orders of magnitude, since variations in differential measurements, due to ambient temperature variations, are typically two to three orders of magnitude smaller than said ambient temperature measurement variations themselves, as described earlier. Finally, it is conceivable that the above alternative embodiments compensate for both temperature drift and ambient (common mode) light intensity, as well as time drift. In this case, referring to FIG. 13, ambient light amplifier 301 would measure ambient light intensity, via at least one of photodiode circuits 302 or 303 (302 is used in the preferred embodiment of FIG. 13), and a separate ambient temperature amplifier 304 would be employed to measure ambient temperature, via a separate thermistor bridge comprising thermistor 3 and resistance 23, preferably powered by bridge voltage 21, with said ambient temperature amplifier 304 connected to A/D converter 17. Also, note that the inverting input of ambient temperature amplifier 304 is connected to node 16 of substantially time stable resistance bridge 1, and the non-inverting input of said ambient temperature amplifier 304 is connected to either thermistor bridge node 11 (between thermistor 3 and resistance 23), or node 15 of substantially time stable resistance bridge 1, depending on the state of switch 305. It will be appreciated by those skilled in the art that while switch 305 may be operated to connect the non-inverting input of ambient temperature amplifier 304 to thermistor bridge node 11, for the purpose of measuring ambient temperature, said switch 305 may also be operated to connect node 15 of substantially time stable resistance bridge 1 to the non-inverting input of said ambient temperature amplifier 304 in order to calibrate said ambient temperature amplifier 304 for time drift in accordance with the method of the present invention. It will also be appreciated that in order to calibrate said ambient temperature amplifier 304 for time drift in accordance with the method of the present invention, said switch 305 may be operated to connect node 15 of substantially time stable resistance bridge 1 to the non-inverting input of said ambient temperature amplifier 304, with variable resistor 6 set such that nodes 15 and 16 are at substantially the same potential, or alternatively switch 305 may be operated to simply connect both inputs of ambient temperature amplifier 304 to a single substantially time-stable reference potential, or a system ground, thereby eliminating the need for substantially time stable resistance bridge 1. Incidentally, it will also be appreciated by those skilled in the art that in the exemplary embodiment of FIGS. 1 and 9, in order to calibrate said ambient temperature amplifier 13 for time drift in accordance with the method of the present invention, switch 14 may be operated to connect node 15 of substantially time stable resistance bridge 1 to the non-inverting input of said ambient temperature amplifier 13, with variable resistor 6 set such that nodes 15 and 16 are at substantially the same potential, or alternatively switch 14 may be operated to simply connect both inputs of ambient temperature amplifier 13 to a single substantially time-stable reference potential, or a system ground.

Also, referring again to FIG. 13, during operation of such an embodiment in RCM, with both photodiode circuits exposed to identical light intensity, a distinct set of characteristic RCM curves would be generated over a range of ambient temperatures, each said set of RCM curves corresponding to one of at least two ambient light intensities, preferably including the minimum and maximum expected ambient light intensities, as detected by ambient light amplifier 301. This would result in at least two sets of RCM generated curves, each said set of curves corresponding to a particular ambient light intensity, and each said set of curves correlating ambient temperature to expected zero difference light intensity. In this case, during operation in SCM, an ambient light intensity measurement would be used to select which set or sets of RCM generated curves is to be used (in subsequent operation in OM) to correlate ambient temperature to differential light intensity. Additionally, said selected set or sets of RCM generated curves corresponding to the measured ambient light intensity (determined during operation in SCM) would also be that set or sets of RCM generated curves that are compensated for component time drift, as described above in the discussion of SCM. It will be appreciated that if the measured ambient light intensity is between values of ambient light intensity, for which sets of RCM generated curves were generated during operation in RCM, then the two sets of RCM generated curves associated with values of ambient light intensity, closest to that ambient light intensity actually measured during operation in SCM, can be used to interpolate a set of RCM curves, approximating that which should be associated with said measured ambient light intensity. Approaches that mathematically model multiple curves, that can be applied to such a multiple curve interpolation problem, are well known, for example, see "Piecewise-linear interpolation between polygonal slices" by Gill Barequet and Micha Sharir in Proceedings of the Tenth Annual Symposium on Computational Geometry, pages 93–102. Additionally, referring again to FIG. 1, it will be appreciated by those skilled in the art that the method for measuring differential temperature there depicted preferably positions thermistors 3 and 4 of measurement bridge 2 in thermal contact with amplification electronics, including at least the most thermally sensitive of amplifiers 7, 7a, and 13, so that ambient temperature measurements reflect an ambient temperature common to both measurement bridge 2 and said amplification electronics. It is conceivable that measurement bridge 2 and said amplification electronics are located sufficiently far from each other that distinct ambient temperature curves are preferably acquired and recorded for the measurement bridge 2 (FIG. 1) and for the amplification electronics, including at least the most thermally sensitive of amplifiers 7, 7a, and 13. For the case of differential thermal measurement, referring again to FIG. 13, photodiode circuits 302 and 303 would be replaced by a measurement bridge comprising thermistors such as those depicted in measurement bridge 2 shown in FIG. 1, and ambient light amplifier 301 (FIG. 13) would instead measure ambient temperature at said measurement bridge (just as is performed by ambient temperature amplifier 13 shown in FIG. 1), and separate ambient temperature amplifier 304 would be employed to measure ambient temperature via a separate thermistor bridge preferably comprising thermistor 3 and resistance 23 (FIG. 13), with said thermistor 3 (FIG. 13, modified) preferably positioned in substantial thermal contact with thermally sensitive amplification electronics, including at least the most thermally sensitive of amplifiers 7, 7a, 301, and 304. Again, it will be appreciated by those skilled in the art that if the measurement bridge ambient temperature is between values of the measurement bridge ambient temperature for which sets of RCM generated curves were generated during operation in RCM, then the two sets of RCM generated curves associated with values of measurement bridge ambient temperature closest to that measurement bridge ambient temperature actually measured during operation in SCM can be used to interpolate (by a known approach such as disclosed in the interpolation reference cited above) a set of RCM curves, approximating that which should be associated with said measurement bridge ambient temperature actually measured during operation in SCM. Said interpolated set of RCM curves would then correlate ambient temperature, as measured by ambient temperature amplifier 304, to measurements associated with each curve in the said set of RCM curves. By extension, it is conceivable, and will be appreciated by those skilled in the art, that additional sets of RCM generated curves corresponding to ambient conditions of physical variables at additional locations in the circuit can be acquired and combined by known means (such as disclosed in the interpolation reference cited above) to arrive at a single composite curve for each curve common to said sets of RCM generated curves.

Additionally, it will be apparent to those skilled in the art that, generally speaking, difference measurements performed b the method of the present invention are referenced to an ambient condition so that time drift of electronics associated with ambient condition measurements will have an effect upon the accuracy of difference measurements. Nevertheless, it has been pointed out that a given difference measurement performed by the method of the present invention varies more slowly, over a given range of ambient conditions, than ambient condition measurements over the same given range of ambient conditions. Consequently, ambient condition measurements need not be performed with as much accuracy as difference measurements, in order to achieve a given difference measurement accuracy. Therefore, it will be appreciated by those skilled in the art that in some embodiments of the present invention, the ambient temperature amplification means need not provide any amplification, and indeed may simply connect the output of a temperature transducer (such as a thermocouple or thermistor bridge arrangement) to the analog to digital converter, in order to provide a signal representative of temperature. Additionally, since ambient condition measurements need not be performed with as much accuracy as difference measurements, in order to achieve a given difference measurement accuracy, it will also be appreciated by those skilled in the art that compensation for time drift of electronic components associated with ambient condition measurements is not as critical to accurate difference measurements as compensation for time drift of electronic components associated with difference measurements versus measured ambient condition. Accordingly, it is conceivable that in some cases the embodiments of the present invention may be simplified such that difference measurements associated with the method of the present invention correlate directly to ambient condition measurements, and that the method of translating difference offset curves described above may be conducted without the need to acquire and translate an ambient reference curve, or to reference said difference measurements to a translated curve representative of ambient condition compensated for time drift of electronic components associated with ambient condition measurements versus measured ambient condition, with the result that said difference measurements can instead be referenced directly to measured ambient conditions, uncompensated for time drift, as measured directly by electronics associated with ambient condition measurements. In this case, difference measurements are compensated for time drift of components associated with difference measurement again utilizing the substantially linear drift of offset curves over time, in order to permit measurements at an arbitrary ambient condition during operation in SCM, in accordance with the preferred embodiment, to substantially compensate subsequent difference measurements during operation in OM, over the range of ambient conditions in which said offset curves were acquired during operation in RCM. More specifically, referring to the preferred embodiment of FIG. 1, in the case in which only difference measurements are compensated for drift, rather than both difference and ambient temperature measurements are compensated, RCM step 203, used for acquiring RCM generated ambient reference curve 26 (FIG. 2), can be eliminated, since this curve is used only to compensate ambient temperature measurements, and is consequently not needed. Also, referring to FIG. 8, all subsequent operations that reference the translated ambient temperature curve 41b instead reference the uncompensated ambient temperature curve 25 directly. Finally, in the case in which only difference measurements are compensated for drift, rather than both difference and ambient temperature measurements, SCM steps 2, 3, and 4 (211, 212, and 213, respectively, in FIG. 12B) are skipped, because these steps are used only to compensate ambient temperature measurements for drift of components associated with ambient temperature measurement. Otherwise, in the case in which only difference measurements are compensated for drift, rather than both difference and ambient temperature measurements, the preferred compensation technique of the present invention is as previously described. Additionally, it will be appreciated by those skilled in the art that yet other differential measurement systems into which differential signals are coupled, that can be made to have not necessarily equal, but sufficiently repeatable, measurable values, such as a sufficiently time and temperature stable voltage potential difference (for example, as might be generated by a voltage reference), in order to facilitate operation in RCM and SCM (as described above, except with a repeatable non-zero potential difference, which may be useful in the case of input electronics having a relatively large inbuilt input offset), such as amplifiers with differential inputs held at the said repeatable non-zero difference value during operation in RCM and SCM by, for example, connecting the differential inputs to a reference signal and ground, or two reference signals, or by positioning sensors such that they are subject to a substantially repeatable excitation of a physical variable to which said sensors are susceptible, said inputs at other times, specifically during OM, being connected to other electronics having differential signals, for example, to fixed or variable resistance bridge circuits, circuits having differential currents (e.g., a differential electrometer), and circuits employing any type of sensor or transducer from which a signal may be obtained, can readily be adapted for use in association with the drift compensation method of the present invention. Additionally, other high resolution differential measurement systems designed specifically to measure near-equal or random differential signals, known to typically average to zero over time, for example, for the purpose of generating natural random numbers (in contrast to pseudo-random numbers), such as signals resulting from diode noise, can also benefit from, and may be readily adapted to, the method of the present invention. Accordingly, the scope of the present invention can only be ascertained by reference to the appended claims.

What is claimed is:

1. A method for compensating electronic difference measurement apparatus for at least one of time and temperature drift of electronic components, comprising the steps of:
  providing either:
    a) a first signal representative of a first value of a physical variable and, a second signal representative of a second value of the same physical variable; or
    b) a first signal representative of a difference between a first value of a physical variable and a second value of the same physical variable, and, a second signal available at the location of the measurement and at the location of the apparatus, for purposes of comparison with the first signal, the second signal being one of:
      i.) a system ground potential, so that the said first signal effectively comprises a difference potential in respect to the said second signal which is at a system ground potential; or
      ii.) a static potential other than system ground, so that the said first signal effectively comprises a difference potential in respect to the said reference signal which is at the static potential; or
      iii.) a dynamic potential, so that the said first signal effectively comprises a difference potential at any point in time in respect to the dynamic potential, at the same point in time, the second signal being the dynamic potential;
  and, providing at least one difference signal means for one of:
    a) obtaining the difference between the first and second signals at a gain factor greater than one, or equal to one, or less than one, to produce a difference signal; or
    b) attenuating the difference between the first and second signals using passive components to produce a difference signal; or
    c) electrically conveying the first signal, with the second signal being available at the location of the measurement, and at the location of the apparatus for purposes of comparison with the first signal, the second signal being one of:
      i.) a system ground potential, so that the first signal effectively comprises a difference signal in respect to the second signal, which is at a system ground potential; or
      ii.) a static potential, other than system ground, so that the first signal effectively comprises a difference signal in respect to the second signal, which is at the static potential; or
      iii.) a dynamic potential, so that the first signal effectively comprises a difference signal at any point in time in respect to the second signal, at the same point in time, the second signal being the dynamic potential;
  providing at least one ambient condition signal means responsive to the ambient condition of at least one of a) the physical variable and b) temperature for providing a third signal;
  providing analog to digital converter means for converting the difference signal produced by the difference signal means and the third signal provided by the ambient condition signal means into digital form;
  providing computer means for compensating the electronic difference measurement apparatus for drift of electronic components;
  providing memory means for storing calibration information used for compensating the electronic difference measurement apparatus for drift of electronic components;
  operating in a reference calibration mode, in which at least one offset curve representative of offset for electronic components associated with difference signal measurements versus measured ambient condition is acquired over a range of ambient conditions and stored in the memory means, the curve so generated being referred to as a difference reference curve;
  operating in a standard calibration mode, in which a difference signal offset that substantially compensates the difference reference curve for drift over time is determined at a current arbitrary ambient condition by comparing difference measurements at the current arbitrary ambient condition to previously stored values on the difference reference curve and at least one of a) translating the difference reference curve in order to substantially compensate the difference reference curve for time drift associated with difference signal measurement, the difference reference curve after translation being referred to as a translated difference reference curve, the translated difference reference curve being used to provide a difference signal offset during an operational mode, that substantially compensates difference measurements for drift, and b) setting the difference signal offset to the difference between an estimated difference reference and an actual difference reference, the difference signal offset being used to linearly translate difference measurements during the operational mode in order to substantially compensate difference measurements for drift of components associated with difference measurement; and performing at least one difference measurement in the operational mode, in which a measurement representative of current ambient condition provides an ambient condition measurement which is correlated to a difference signal offset measurement, the difference signal offset measurement being at least one of a) determined from the translated difference reference curve at the measured ambient condition measurement, b) equivalent to the difference signal offset determined during the standard calibration mode, and c) derived by empirically comparing values for the difference signal offset at various times during operation in the standard calibration mode at various ambient conditions, and the difference signal offset measurement being used to correct the difference signal for component drift to provide a compensated difference measurement between the first and second values of the physical variable.

2. A method as defined in claim 1 wherein the difference signal means comprises differential inputs coupled to a measurement bridge comprising a first sensor having an impedance responsive to the physical variable, the first sensor being connected in series to a first impedance, the first sensor and first impedance being connected across a measurement bridge potential for producing the first signal, and the first sensor and first impedance being connected in parallel to a second sensor having an impedance responsive to the same physical variable as the first sensor, the second sensor being connected in series with a second impedance, the series-connected second sensor and second impedance also being connected across the measurement bridge potential for producing the second signal, and the inputs to the difference signal means being coupled to the measurement bridge, such that each differential input is coupled to the measurement bridge at a different bridge node, situated between either the first sensor and first impedance or between the second sensor and second impedance.

3. A method as defined in claim 2 wherein the first and second sensors are at least one of:

configured to be subject to substantially the same value of the physical variable, to which the sensors are responsive, during the reference calibration mode, as well as during the standard calibration mode, and wherein operation of the electronic difference measurement apparatus in the reference calibration mode, with the first and second sensors subject to substantially the same value of the physical variable, results in at least one physical variable difference curve distinct from the difference reference curve, which is used during the standard calibration mode, with the first and second sensors again subject to substantially the same value of the physical variable, to compare points on the physical variable difference curve, acquired at different times, so as to provide an offset measurement which substantially compensates for variations between the sensors, over the range of ambient conditions in which the physical variable difference curve is acquired, and additionally to compensate for time drift in the variation over the ambient condition range in which the physical variable difference curve was acquired during the reference calibration mode; and configured to be subject to a substantially repeatable difference in values of the physical variable, to which the sensors are responsive, during the reference calibration mode, as well as during the standard calibration mode, and wherein operation of the electronic difference measurement apparatus in the reference calibration mode, with the first and second sensors subject to the substantially repeatable difference in values of the physical variable, results in at least one physical variable difference curve distinct from the difference reference curve, which is used during the standard calibration mode, with the first and second sensors again subject to said substantially repeatable difference in values of the physical variable, to compare points on the physical variable difference curve, acquired at different times, so as to provide an offset measurement which substantially compensates for variations between the sensors, over the range of ambient conditions in which the physical variable difference curve is acquired, and additionally to compensate for time drift in the variation over the ambient condition range in which the physical variable difference curve was acquired during the reference calibration mode.

4. A method as defined in claim 2 wherein the measurement bridge potential is applied across a reference resistance bridge to generate at least one reference signal used to compensate the ambient condition signal means for component time drift.

5. A method as defined in claim 2 wherein at least one input to the ambient condition signal means is coupled to one of the first and second sensors of the measurement bridge.

6. A method as defined in claim 3 wherein the measurement bridge potential is applied across a reference resistance bridge to generate at least one reference signal used to compensate the ambient condition signal means for component time drift.

7. A method as defined in claim 3 wherein at least one input to the ambient condition signal means is coupled to one of the first and second sensors of the measurement bridge.

8. A method as defined in claim 2 wherein the first and second sensors and the ambient condition signal means are responsive to temperature.

9. A method as defined in claim 3 wherein the first and second sensors and the ambient condition signal means are responsive to temperature.

10. A method as defined in claim 8 wherein at least one input to the ambient condition signal means is coupled to one of the first and second temperature sensors of the measurement bridge.

11. A method as defined in claim 9 wherein at least one input to the ambient condition signal means is coupled to one of the first and second temperature sensors of the measurement bridge.

12. A method as defined in claim 2 wherein the potential across the measurement bridge is at least one of a) applied to an input of the analog to digital converter means in order to provide a ratiometric compensation for variations in bridge voltage and b) generated using the analog to digital converter means.

13. A method as defined in claim 4 wherein the potential across the reference resistance bridge is at least one of a) applied to an input of the analog to digital converter means in order to provide a ratiometric compensation for variations in bridge voltage and b) generated using the analog to digital converter means.

14. A method as defined in claim 6 wherein the potential across the reference resistance bridge is at least one of a) applied to an input of the analog to digital converter means in order to provide a ratiometric compensation for variations in bridge voltage and b) generated using the analog to digital converter means.

15. A method as defined in claim 1 wherein the difference reference curve is re-acquired and compared to a previous version of the difference reference curve to at least one of a) estimate error in the linear translations, associated with the standard calibration mode, and b) track trends in drift of the difference reference curve.

16. A method as defined in claim 3 wherein at least one of the difference reference curve and physical variable difference curve is re-acquired at a known time, relative to the time at which the respective offset curves were last acquired, and compared to previous versions of the respective offset curves to at least one of a) estimate error in the linear translations, associated with the standard calibration mode, and b) track trends in drift of the respective offset curves.

17. A method as defined in claim 15 wherein errors associated with the linear translations in the standard calibration mode are at least one of a) reported to a user as an indicator of achievable accuracy, b) used to limit the accuracy with which difference measurements are reported to the user, and c) used with tracked trends in drift of the respective offset curves to predict drift in the respective offset curves, in order to improve the accuracy with which difference measurements are reported to the user.

18. A method as defined in claim 16 wherein errors associated with the linear translations in the standard calibration mode are at least one of a) reported to a user as an indicator of achievable accuracy, b) used to limit the accuracy with which difference measurements are reported to the user, and c) used with tracked trends in drift of the respective offset curves to predict drift in the respective offset curves, in order to improve the accuracy with which difference measurements are reported to the user.

19. A method as defined in claim 1 wherein at least one of the first and second signals provides a substantially random signal source.

20. A method as defined in claim 1, further comprising the steps of providing a first sensor responsive to the first value of the physical variable for producing the first signal and providing a second sensor responsive to the second value of the physical variable for producing the second signal, wherein the first and second sensors are at least one of:

configured to be subject to substantially the same value of the physical variable, to which the sensors are responsive, during the reference calibration mode, as well as during the standard calibration mode, and wherein operation of the electronic difference measurement apparatus in the reference calibration mode, with the first and second sensors subject to substantially the same value of the physical variable, results in at least one physical variable difference curve distinct from the difference reference curve, which is used during the standard calibration mode, with the first and second sensors again subject to substantially the same value of the physical variable, to compare points on the physical variable difference curve, acquired at different times, so as to provide an offset measurement which substantially compensates for variations between the sensors, over the range of ambient conditions in which the physical variable difference curve is acquired, and additionally to compensate for time drift in the variation over the ambient condition range in which the physical variable difference curve was acquired during the reference calibration mode; and configured to be subject to a substantially repeatable difference in values of the physical variable, to which the sensors are responsive, during the reference calibration mode, as well as during the standard calibration mode, and wherein operation of the electronic difference measurement apparatus in the reference calibration mode, with the first and second sensors subject to the substantially repeatable difference in values of the physical variable, results in at least one physical variable difference curve distinct from the difference reference curve, which is used during the standard calibration mode, with the first and second sensors again subject to said substantially repeatable difference in values of the physical variable, to compare points on the physical variable difference curve, acquired at different times, so as to provide an offset measurement which substantially compensates for variations between the sensors, over the range of ambient conditions in which the physical variable difference curve is acquired, and additionally to compensate for time drift in the variation over the ambient condition range in which the physical variable difference curve was acquired during the reference calibration mode.

21. A method as defined in claim 1 wherein the ambient condition signal means is responsive to temperature for providing the third signal.

22. A method as defined in claim 1 wherein a first ambient condition signal means is responsive to the ambient condition of a first physical variable to provide the third signal and at least one second ambient condition signal means is responsive to a second physical variable for providing a fourth signal, the fourth signal being converted by the analog to digital converter means into digital form and stored in the memory means for use by the computer means for compensating the electronic difference measurement apparatus for drift of electronic components due to variations in the ambient value of the second physical variable, and wherein at least two sets of offset curves are acquired over the range of the first physical variable, each set of offset curves being acquired at a different value of ambient condition of the second physical variable within the range of ambient conditions of the second physical variable.

23. A method as defined in claim 22 wherein at least one of first and second physical variables is temperature.

24. A method as defined in claim 22 wherein multiple second physical variables are representative of the same physical parameter in different physical locations.

25. A method as defined in claim 1 wherein drift parameters associated with at least one of the difference signal means and ambient condition signal means are stored in the memory means and used to determine the difference reference curve.

26. A method as defined in claim 3 wherein drift parameters associated with at least one of the first sensor, second sensor, and difference signal means are stored in the memory means and used to determine at least one of the a) difference reference curve and b) physical variable difference curve.

27. A method as defined in claim 20 wherein drift parameters associated with at least one of the first sensor, second sensor, and difference signal means are stored in the memory means and used to determine at least one of the a) difference reference curve and b) physical variable difference curve.

28. A method as defined in claim 22 wherein drift parameters associated with at least one of the first sensor, second sensor, and difference signal means are stored in the memory means and used to determine at least one of the a) difference reference curve and b) offset curves.

29. Apparatus for compensating electronic difference measurements for at least one of time and temperature drift of electronic components, comprising:
   means for providing either:
      a) a first signal representative of a first value of a physical variable and, a second signal representative of a second value of the same physical variable; or
      b) a first signal representative of a difference between a first value of a physical variable and a second value of the same physical variable, and, a second signal available at the location of the measurement and at the location of the apparatus for purposes of comparison with the first signal, the second signal being one of:
         i.) a system ground potential, so that the said first signal effectively comprises a difference potential in respect to the said second signal which is at a system ground potential; or
         ii.) a static potential other than system ground, so that the said first signal effectively comprises a difference potential in respect to the said reference signal which is at the static potential; or
         iii.) a dynamic potential, so that the said first signal effectively comprises a difference potential at any point in time in respect to the dynamic potential, at the same point in time, the second signal being the dynamic potential; and
   at least one difference signal means for one of:
      a) amplifying the difference between the first and second signals by a gain factor greater than one, or equal to one, or less than one, to produce a difference signal; or
      b) attenuating the difference between the first and second signals using passive components to produce a difference signal; or
      c) electrically conveying the first signal, with the second signal being available at the location of the measurement, and at the location of the apparatus for purposes of comparison with the first signal, the second signal being one of;
         i.) a system ground potential, so that the first signal effectively comprises a difference signal in respect to the second signal, which is at a system ground potential; or
         ii.) a static potential, other than system ground, so that the first signal effectively comprises a difference signal in respect to the second signal, which is at the static potential; or
         iii.) a dynamic potential, so that the first signal effectively comprises a difference signal at any point in time in respect to the second signal, at the same point in time, the second signal being the dynamic potential;
   at least one ambient condition signal means responsive to the ambient condition of at least one of a) the physical variable and b) temperature for providing a third signal;
   analog to digital converter means coupled to the difference signal means and the ambient condition signal means for converting the difference signal produced by the difference signal means and the third signal provided by the ambient condition signal means into digital form;
   computer means for compensating the electronic difference measurement apparatus for drift of electronic components;
   memory means for storing calibration information used for compensating the electronic difference measurement apparatus for drift of electronic components;
   the apparatus being operable in a reference calibration mode, in which at least one offset curve representative of offset for electronic components associated with difference signal measurements versus measured ambient condition is acquired over a range of ambient conditions and stored in the memory means, the curve so generated being referred to as a difference reference curve;
   the apparatus additionally being operable in a standard calibration mode, in which a difference signal offset that substantially compensates the difference reference curve for drift over time is determined at a current arbitrary ambient condition by comparing difference measurements at the current arbitrary ambient condition to previously stored values on the difference reference curve and at least one of a) translating the difference reference curve in order to substantially compensate the difference reference curve for time drift associated with difference signal measurement, the difference reference curve after translation being referred to as a translated difference reference curve, the translated difference reference curve being used to provide a difference signal offset during an operational mode, that substantially compensates difference measurements for drift, and b) setting the difference signal offset to the difference between an estimated difference reference and an actual difference reference, the difference signal offset being used to linearly translate difference measurements during the operational mode in order to substantially compensate difference measurements for drift of components associated with difference measurement; and
   the apparatus for performing at least one difference measurement in the operational mode, in which a measurement representative of current ambient condition provides an ambient condition measurement which is correlated to a difference signal offset measurement, the difference signal offset measurement being at least one of a) determined from the translated difference reference curve at the measured ambient condition measurement, b) equivalent to the difference signal offset determined during the standard calibration mode, and c) derived by empirically comparing values for the difference signal offset at various times during operation in the standard calibration mode at various ambient conditions, and the difference signal offset measurement being used to correct the difference signal for component drift to provide a compensated difference measurement between the first and second values of the physical variable.

30. Apparatus as defined in claim 29 wherein the difference signal means comprises differential inputs coupled to a measurement bridge comprising a first sensor having an impedance responsive to the physical variable, the first sensor being connected in series to a first impedance, the first sensor and first impedance being connected across a measurement bridge potential for producing the first signal, and the first sensor and first impedance being connected in parallel to a second sensor having an impedance responsive to the same physical variable as the first sensor, the second sensor being connected in series with a second impedance, the series-connected second sensor and second impedance also being connected across the measurement bridge potential for producing the second signal, and the inputs to the difference signal means being coupled to the measurement bridge, such that each differential input is coupled to the measurement bridge at a different bridge node, situated between either the first sensor and first impedance or between the second sensor and second impedance.

31. Apparatus as defined in claim 30 wherein the first and second sensors are at least one of:
configured to be subject to substantially the same value of the physical variable, to which the sensors are responsive, during the reference calibration mode, as well as during the standard calibration mode, and wherein operation of the electronic difference measurement apparatus in the reference calibration mode, with the first and second sensors subject to substantially the same value of the physical variable, results in at least one physical variable difference curve distinct from the difference reference curve, which is used during the standard calibration mode, with the first and second sensors again subject to substantially the same value of the physical variable, to compare points on the physical variable difference curve, acquired at different times, so as to provide an offset measurement which substantially compensates for variations between the sensors, over the range of ambient conditions in which the physical variable difference curve is acquired, and additionally to compensate for time drift in the variation over the ambient condition range in which the physical variable difference curve was acquired during the reference calibration mode; and
configured to be subject to a substantially repeatable difference in values of the physical variable, to which the sensors are responsive, during the reference calibration mode, as well as during the standard calibration mode, and wherein operation of the electronic difference measurement apparatus in the reference calibration mode, with the first and second sensors subject to the substantially repeatable difference in values of the physical variable, results in at least one physical variable difference curve distinct from the difference reference curve, which is used during the standard calibration mode, with the first and second sensors again subject to said substantially repeatable difference in values of the physical variable, to compare points on the physical variable difference curve, acquired at different times, so as to provide an offset measurement which substantially compensates for variations between the sensors, over the range of ambient conditions in which the physical variable difference curve is acquired, and additionally to compensate for time drift in the variation over the ambient condition range in which the physical variable difference curve was acquired during the reference calibration mode.

32. Apparatus as defined in claim 30 wherein the measurement bridge potential is applied across a reference resistance bridge to generate at least one reference signal used to compensate the ambient condition signal means for component time drift.

33. Apparatus as defined in claim 30 wherein at least one input to the ambient condition signal means is coupled to one of the first and second sensors of the measurement bridge.

34. Apparatus as defined in claim 31 wherein the measurement bridge potential is applied across a reference resistance bridge to generate at least one reference signal used to compensate the ambient condition signal means for component time drift.

35. Apparatus as defined in claim 31 wherein at least one input to the ambient condition signal means is coupled to one of the first and second sensors of the measurement bridge.

36. Apparatus as defined in claim 30 wherein the first and second sensors and the ambient condition signal means are responsive to temperature.

37. Apparatus as defined in claim 31 wherein the first and second sensors and the ambient condition signal means are responsive to temperature.

38. Apparatus as defined in claim 36 wherein at least one input to the ambient condition signal means is coupled to one of the first and second temperature sensors of the measurement bridge.

39. Apparatus as defined in claim 37 wherein at least one input to the ambient condition signal means is coupled to one of the first and second temperature sensors of the measurement bridge.

40. Apparatus as defined in claim 30 wherein the potential across the measurement bridge is at least one of a) applied to an input of the analog to digital converter means in order to provide a ratiometric compensation for variations in bridge voltage and b) generated using the analog to digital converter means.

41. Apparatus as defined in claim 32 wherein the potential across the reference resistance bridge is at least one of a) applied to an input of the analog to digital converter means in order to provide a ratiometric compensation for variations in bridge voltage and b) generated using the analog to digital converter means.

42. Apparatus as defined in claim 34 wherein the potential across the reference resistance bridge is at least one of a) applied to an input of the analog to digital converter means in order to provide a ratiometric compensation for variations in bridge voltage and b) generated using the analog to digital converter means.

43. Apparatus as defined in claim 29, further comprising a timer and wherein the difference reference curve is re-acquired at a known time, relative to the time at which the difference reference curve was last acquired and compared to a previous version of the difference reference curve to at least one of a) estimate error in the linear translations, associated with the standard calibration mode, and b) track trends in drift of the difference reference curve.

44. Apparatus as defined in claim 31, further comprising a timer and wherein at least one of the difference reference curve and physical variable difference curve are re-acquired at a known time, relative to the time at which the respective offset curves were last acquired, and compared to previous versions of the respective offset curves to at least one of a) estimate error in the linear translations, associated with the standard calibration mode, and b) track trends in drift of the respective offset curves.

45. Apparatus as defined in claim 43 wherein errors associated with the linear translations in the standard calibration mode are at least one of a) reported to a user as an indicator of achievable accuracy, b) used to limit the accuracy with which difference measurements are reported to the user, and c) used with tracked trends in drift of the respective offset curves to predict drift in the respective offset curves, in order to improve the accuracy with which difference measurements are reported to the user.

46. Apparatus as defined in claim 44 wherein errors associated with the linear translations in the standard calibration mode are at least one of a) reported to a user as an indicator of achievable accuracy, b) used to limit the accuracy with which difference measurements are reported to the user, and c) used with tracked trends in drift of the respective offset curves to predict drift in the respective offset curves, in order to improve the accuracy with which difference measurements are reported to the user.

47. Apparatus as defined in claim 29 wherein at least one of the first and second signals provides a substantially random signal source.

48. Apparatus as defined in claim 29 wherein the means for providing the first signal representative of a first value of the physical variable comprises a first sensor and the means for providing the second signal representative of a second value of the same physical variable comprises a second sensor and wherein the first and second sensors are at least one of:

configured to be subject to substantially the same value of the physical variable, to which the sensors are responsive, during the reference calibration mode, as well as during the standard calibration mode, and wherein operation of the electronic difference measurement apparatus in the reference calibration mode, with the first and second sensors subject to substantially the same value of the physical variable, results in at least one physical variable difference curve distinct from the difference reference curve, which is used during the standard calibration mode, with the first and second sensors again subject to substantially the same value of the physical variable, to compare points on the physical variable difference curve, acquired at different times, so as to provide an offset measurement which substantially compensates for variations between the sensors, over the range of ambient conditions in which the physical variable difference curve is acquired, and additionally to compensate for time drift in the variation over the ambient condition range in which the physical variable difference curve was acquired during the reference calibration mode; and configured to be subject to a substantially repeatable difference in values of the physical variable, to which the sensors are responsive, during the reference calibration mode, as well as during the standard calibration mode, and wherein operation of the electronic difference measurement apparatus in the reference calibration mode, with the first and second sensors subject to the substantially repeatable difference in values of the physical variable, results in at least one physical variable difference curve distinct from the difference reference curve, which is used during the standard calibration mode, with the first and second sensors again subject to said substantially repeatable difference in values of the physical variable, to compare points on the physical variable difference curve, acquired at different times, so as to provide an offset measurement which substantially compensates for variations between the sensors, over the range of ambient conditions in which the physical variable difference curve is acquired, and additionally to compensate for time drift in the variation over the ambient condition range in which the physical variable difference curve was acquired during the reference calibration mode.

49. Apparatus as defined in claim 29 wherein the ambient condition signal means is responsive to temperature for providing the third signal.

50. Apparatus as defined in claim 29 wherein a first ambient condition signal means is responsive to the ambient condition of a first physical variable to provide the third signal and at least one second ambient condition signal means is responsive to a second physical variable for providing a fourth signal, the fourth signal being converted by the analog to digital converter means into digital form and stored in the memory means for use by the computer means for compensating the electronic difference measurement apparatus for drift of electronic components due to variations in the ambient value of the second physical variable, and wherein at least two sets of offset curves are acquired over the range of the first physical variable, each set of offset curves being acquired at a different value of ambient condition of the second physical variable within the range of ambient conditions of the second physical variable.

51. Apparatus as defined in claim 50 wherein at least one of the first and second physical variables is temperature.

52. Apparatus as defined in claim 50 wherein multiple second physical variables are representative of the same physical parameter in different physical locations.

53. Apparatus as defined in claim 29 wherein drift parameters associated with the difference signal means are stored in the memory means and used to determine the difference reference curve.

54. Apparatus as defined in claim 31 wherein drift parameters associated with at least one of the first sensor, second sensor, and difference signal means are stored in the memory means and used to determine at least one of the a) difference reference curve and b) physical variable difference curve.

55. Apparatus as defined in claim 48 wherein drift parameters associated with at least one of the first sensor, second sensor, and difference signal means are stored in the memory means and used to determine at least one of the a) difference reference curve and b) physical variable difference curve.

56. Apparatus as defined in claim 50 wherein drift parameters associated with at least one of the first signal, second signal, and difference signal means are stored in the memory means and used to determine at least one of the a) difference reference curve and b) offset curves.

57. Apparatus as defined in claim 29, further comprising internal switches for connecting at least one of a) a signal representative of ambient condition, b) a common signal, and c) at least one reference signal to the inputs of the ambient condition signal means, the switches being operated under control of the computer means.

58. Apparatus as defined in claim 29, further comprising internal switches for connecting at least one of a) the first signal, b) the second signal, c) a common signal, and d) at least one reference signal to the inputs of the difference signal means, the switches being operated under control of the computer means.

59. Apparatus as defined in claim 57 wherein the switches are responsive to a delayed action of a power switch and wherein the function of the internal switches is performed by electronically controllable external switches operated under control of the computer means during operation in the reference calibration mode.

60. Apparatus as defined in claim 58 wherein the switches are responsive to a delayed action of a power switch and wherein the function of the internal switches is performed by electronically controllable external switches operated under control of the computer means during operation in the reference calibration mode.

61. A method as defined in claim 23 wherein multiple second physical variables are representative of the same physical parameter in different physical locations.

62. Apparatus as defined in claim 51 wherein multiple second physical variables are representative of the same physical parameter in different physical locations.

63. A method as defined in claim 1, further comprising the steps of:
- operating in the reference calibration mode, in which offset curves are acquired over a range of ambient conditions and stored in the memory means, the offset curves comprising:
  - a) at least one curve representative of offset for electronic components associated with ambient condition measurements versus measured ambient condition, the curve so generated being referred to as an ambient reference curve; and
  - b) the difference reference curve;
- operating in the standard calibration mode, in which an ambient signal offset and a difference signal offset that substantially compensate the ambient reference curve and difference reference curve, respectively, for drift over time are determined at a current arbitrary ambient condition by comparing measurements at the current arbitrary ambient condition to previously stored values on the ambient reference curve and difference reference curve and, for both the ambient reference curve and difference reference curve, one of a) translating at least one of the ambient reference curve and difference reference curve in order to substantially compensate the at least one reference curve for time drift associated with ambient condition measurement and difference signal measurement, the respective reference curves after translation being referred to as a translated ambient reference curve and a translated difference reference curve, respectively, and b) determining at least one of an ambient signal offset and difference signal offset by obtaining the difference between an estimated ambient reference measurement and an actual ambient reference measurement, and between an estimated difference reference measurement and an actual difference reference measurement, respectively, the respective signal offset being used to linearly translate ambient condition measurements and difference measurements, respectively, in order to substantially compensate the respective measurements during the operational mode for drift of components associated with ambient condition measurement and difference measurement, respectively; and
- performing at least one difference measurement in the operational mode in which a measurement representative of current ambient condition compensated for time drift using at least one of the translated ambient reference curve and ambient signal offset determined during the standard calibration mode provides an ambient condition measurement which is correlated to a difference signal offset measurement, the difference signal offset measurement being at least one of a) determined from the translated difference reference curve at the compensated ambient condition measurement, b) equivalent to the difference signal offset determined during the standard calibration mode, and c) derived by empirically comparing values for the difference signal offset at various times during operation in the standard calibration mode, at various ambient conditions, and the difference signal offset measurement being used to correct the difference signal for component drift to provide a compensated difference measurement between the first and second values of the physical variable.

64. A method as defined in claim 63 wherein the ambient reference curve and difference reference curve are re-acquired and compared to previous versions of the respective offset curves to at least one of a) estimate error in the linear translations, associated with the standard calibration mode, and b) track trends in drift of the respective offset curves.

65. A method as defined in claim 63, further comprising the steps of providing a first sensor responsive to the first value of the physical variable for producing the first signal, providing a second sensor responsive to the second value of the physical variable for producing the second signal, storing drift parameters associated with at least one of the first sensor, second sensor, difference signal means, and ambient condition signal means in the memory means, and using the stored drift parameters to determine at least one of a) the ambient reference curve and b) the difference reference curve.

66. Apparatus as defined in claim 29, further comprising:
- the apparatus being operable in a reference calibration mode, in which offset curves are acquired over a range of ambient conditions and stored in the memory means, the offset curves comprising:
  - a) at least one curve representative of offset for electronic components associated with ambient condition measurements versus measured ambient condition, the curve so generated being referred to as an ambient reference curve; and
  - b) the difference reference curve;
- the apparatus additionally being operable in the standard calibration mode in which an ambient signal offset and a difference signal offset that substantially compensate the ambient reference curve and difference reference curve, respectively, for drift over time are determined at a current arbitrary ambient condition by comparing measurements at the current arbitrary ambient condition to previously stored values on the ambient reference curve and difference reference curve and, for both the ambient reference curve and difference reference curve, one of a) translating at least one of the ambient reference curve and difference reference curve in order to substantially compensate the at least one reference curve for time drift associated with ambient condition measurement and difference signal measurement, respectively, the respective reference curves after translation being referred to as a translated ambient reference curve and a translated difference reference curve, respectively, b) determining at least one of an ambient signal offset and difference signal offset by obtaining the difference between an estimated ambient reference measurement and an actual ambient reference measurement, and between an estimated difference reference measurement and an actual difference reference measurement, respectively, the respective signal offset being used to linearly translate ambient condition measurements and difference measurements, respectively, in order to substantially compensate the respective measurements during the operational mode for drift of components associated with ambient condition measurement and difference measurement, respectively; and
- the apparatus for performing at least one difference measurement in the operational mode in which a measurement representative of current ambient condition compensated for time drift using at least one of the translated ambient reference curve and ambient signal offset determined during the standard calibration mode provides an ambient condition measurement which is correlated to a difference signal offset measurement, the difference signal offset measurement being at least one of a) determined from the translated difference reference curve at the compensated ambient condition measurement, b) equivalent to the difference signal offset determined during the standard calibration mode, and c) derived by empirically comparing values for the difference signal offset at various times during operation in the standard calibration mode, at various ambient conditions, and the difference signal offset measurement being used to correct the difference signal for component drift to provide a compensated difference measurement between the first and second values of the physical variable.

67. Apparatus as defined in claim 66, further comprising a timer and wherein the ambient reference curve and difference reference curve are re-acquired at a known time, relative to the time at which the respective offset curves were last acquired and compared to previous versions of the respective offset curves to at least one of a) estimate error in the linear translations, associated with the standard calibration mode, and b) track trends in drift of the respective offset curves.

68. Apparatus as defined in claim 66 wherein the means for providing the first signal representative of a first value of the physical variable comprises a first sensor and the means for providing the second signal representative of a second value of the same physical variable comprises a second sensor and wherein drift parameters associated with at least one of the first sensor, second sensor, difference signal means, and ambient condition signal means are stored in the memory means and used to determine at least one of a) the ambient reference curve, and b) the difference reference curve.

69. A method as defined in claim 1 wherein the physical variable is a voltage.

70. Apparatus as defined in claims 29 wherein the physical variable is a voltage.

71. A method as defined in claim 69 further comprising the steps of providing at least one additional electronic component, coupled to at least one input of the difference signal means for manifesting an electrical property other than voltage as a difference voltage which can be computationally translated into a value of the electrical property, using known value for the additional electronic component and the value of the difference voltage, and wherein the additional component is configured to be in substantially the same state during the reference calibration mode, as well as during the standard calibration mode, and wherein operation of the electronic difference measurement apparatus in the reference calibration mode, with the additional component configured to be in substantially the same state, results in at least one electrical property difference curve distinct from the difference reference curve, which is used during the standard calibration mode, with the additional component configured to be in substantially the same state, to compare points on the electrical property difference curve, acquired at different times, so as to provide an offset measurement which substantially compensates for variations in the additional component over the range of ambient conditions in which the electrical property difference curve is acquired, and additionally to compensate for time drift in the variations over the ambient condition range in which the electrical property difference curve was acquired during the reference calibration mode.

72. Apparatus as defined in claim 70 wherein at least one additional electronic component is coupled to at least one input of the difference signal means for manifesting an electrical property other than voltage as a difference voltage which can be computationally translated into a value of the electrical property, using known value for the additional electronic component and the value of the difference voltage, and wherein the additional component is configured to be in substantially the same state during the reference calibration mode, as well as during the standard calibration mode, and wherein operation of the electronic difference measurement apparatus in the reference calibration mode, with the additional component configured to be in substantially the same state, results in at least one electrical property difference curve distinct from the difference reference curve, which is used during the standard calibration mode, with the additional component configured to be in substantially the same state, to compare points on the electrical property difference curve, acquired at different times, so as to provide an offset measurement which substantially compensates for variations in the additional components, over the range of ambient conditions in which the electrical property difference curve is acquired, and additionally to compensate for time drift in the variations over the ambient condition range in which the electrical property difference curve was acquired during the reference calibration mode.

73. A method as defined in claim 71 wherein the ambient condition signal means is responsive to temperature for providing the third signal.

74. A method as defined in claim 71 wherein a first ambient condition signal means is responsive to the ambient condition of a first physical variable to provide the third signal and at least one second ambient condition signal means is responsive to a second physical variable for providing a fourth signal, the fourth signal being converted by the analog to digital converter means into digital form and stored in the memory means for use by the computer means for compensating the electronic difference measurement apparatus for drift of electronic components due to variations in the ambient value of the second physical variable, and wherein at least two sets of offset curves are acquired over the range of the first physical variable, each set of offset curves being acquired at a different value of ambient condition of the second physical variable within the range of ambient conditions of the second physical variable.

75. A method as defined in claim 74 wherein at least one of first and second physical variables is temperature.

76. A method as defined in claim 74 wherein multiple second physical variables are representative of the same physical parameter in different physical locations.

77. A method as defined in claim 73 wherein drift parameters associated with at least one of the difference signal means and ambient condition signal means are stored in the memory means and used to determine the difference reference curve.

78. A method as defined in claim 74 wherein drift parameters associated with at least one of the first sensor, second sensor, and difference signal means are stored in the memory means and used to determine at least one of the a) difference reference curve and b) offset curves.

79. Apparatus as defined in claim 72 wherein the ambient condition signal means is responsive to temperature for providing the third signal.

80. Apparatus as defined in claim 72 wherein a first ambient condition signal means is responsive to the ambient condition of a first physical variable to provide the third signal and at least one second ambient condition signal means is responsive to a second physical variable for providing a fourth signal, the fourth signal being converted by the analog to digital converter means into digital form and stored in the memory means for use by the computer means for compensating the electronic difference measurement apparatus for drift of electronic components due to variations in the ambient value of the second physical variable, and wherein at least two sets of offset curves are acquired over the range of the first physical variable, each set of offset curves being acquired at a different value of ambient condition of the second physical variable within the range of ambient conditions of the second physical variable.

81. Apparatus as defined in claim 80 wherein at least one of the first and second physical variables is temperature.

82. Apparatus as defined in claim 80 wherein multiple second physical variables are representative of the same physical parameter in different physical locations.

83. Apparatus as defined in claim 72 wherein drift parameters associated with the difference signal means are stored in the memory means and used to determine the difference reference curve.

84. Apparatus as defined in claim 80 wherein drift parameters associated with at least one of the first signal, second signal, and difference signal means are stored in the memory means and used to determine at least one of the a) difference reference curve and b) offset curves.

85. Apparatus as defined in claim 72, further comprising internal switches for connecting at least one of a) a signal representative of ambient condition, b) a common signal, and c) at least one reference signal to the inputs of the ambient condition signal means, the switches being operated under control of the computer means.

86. Apparatus as defined in claim 72, further comprising internal switches for connecting at least one of a) the first signal, b) the second signal, c) a common signal, and d) at least one reference signal to the inputs of the difference signal means, the switches being operated under control of the computer means.

87. Apparatus as defined in claim 85 wherein the switches are responsive to a delayed action of a power switch and wherein the function of the internal switches is performed by electronically controllable external switches operated under control of the computer means during operation in the reference calibration mode.

88. Apparatus as defined in claim 86 wherein the switches are responsive to a delayed action of a power switch and wherein the function of the internal switches is performed by electronically controllable external switches operated under control of the computer means during operation in the reference calibration mode.

89. A method as defined in claim 75 wherein multiple second physical variables are representative of the same physical parameter in different physical locations.

90. Apparatus as defined in claim 81 wherein multiple second physical variables are representative of the same physical parameter in different physical locations.

91. A method as defined in claim 71, further comprising:
operating in the reference calibration mode, in which offset curves are acquired over a range of ambient conditions and stored in the memory means, the offset curves comprising:
a) at least one curve representative of offset for electronic components associated with ambient condition measurements versus measured ambient condition, the curve so generated being referred to as an ambient reference curve; and
b) the difference reference curve;
operating in the standard calibration mode, in which an ambient signal offset and a difference signal offset that substantially compensate the ambient reference curve and difference reference curve, respectively, for drift over time are determined at a current arbitrary ambient condition by comparing measurements at the current arbitrary ambient condition to previously stored values on the ambient reference curve and difference reference curve and, for both the ambient reference curve and difference reference curve, one of a) translating at least one of the ambient reference curve and difference reference curve in order to substantially compensate the at least one reference curve for time drift associated with ambient condition measurement and difference signal measurement, the respective reference curves after translation being referred to as a translated ambient reference curve and a translated difference reference curve, respectively, and b) determining at least one of an ambient signal offset and difference signal offset by obtaining the difference between an estimated ambient reference measurement and an actual ambient reference measurement, and between an estimated difference reference measurement and an actual difference reference measurement, respectively, the respective signal offset being used to linearly translate ambient condition measurements and difference measurements, respectively, in order to substantially compensate the respective measurements during the operational mode for drift of components associated with ambient condition measurement and difference measurement, respectively; and performing at least one difference measurement in the operational mode in which a measurement representative of current ambient condition compensated for time drift using at least one of the translated ambient reference curve and ambient signal offset determined during the standard calibration mode provides an ambient condition measurement which is correlated to a difference signal offset measurement, the difference signal offset measurement being at least one of a) determined from the translated difference reference curve at the compensated ambient condition measurement, b) equivalent to the difference signal offset determined during the standard calibration mode, and c) derived by empirically comparing values for the difference signal offset at various times during operation in the standard calibration mode, at various ambient conditions, and the difference signal offset measurement being used to correct the difference signal for component drift to provide a compensated difference measurement between the first and second values of the physical variable.

92. A method as defined in claim 91 wherein the ambient reference curve and difference reference curve are re-acquired and compared to previous versions of the respective offset curves to at least one of a) estimate error in the linear translations, associated with the standard calibration mode, and b) track trends in drift of the respective offset curves.

93. Apparatus as defined in claim 72, further comprising:
the apparatus being operable in a reference calibration mode, in which offset curves are acquired over a range of ambient conditions and stored in the memory means, the offset curves comprising:
a) at least one curve representative of offset for electronic components associated with ambient condition measurements versus measured ambient condition, the curve so generated being referred to as an ambient reference curve; and
b) the difference reference curve;
the apparatus additionally being operable in the standard calibration mode in which an ambient signal offset and a difference signal offset that substantially compensate the ambient reference curve and difference reference curve, respectively, for drift over time are determined at a current arbitrary ambient condition by comparing measurements at the current arbitrary ambient condition to previously stored values on the ambient reference curve and difference reference curve and, for both the ambient reference curve and difference reference curve, one of a) translating at least one of the ambient reference curve and difference reference curve in order to substantially compensate the at least one reference curve for time drift associated with ambient condition measurement and difference signal measurement, respectively, the respective reference curves after translation being referred to as a translated ambient reference curve and a translated difference reference curve, respectively, b) determining at least one of an ambient signal offset and difference signal offset by obtaining the difference between an estimated ambient reference measurement and an actual ambient reference measurement, and between an estimated difference reference measurement and an actual difference reference measurement, respectively, the respective signal offset being used to linearly translate ambient condition measurements and difference measurements, respectively, in order to substantially compensate the respective measurements during the operational mode for drift of components associated with ambient condition measurement and difference measurement, respectively; and the apparatus for performing at least one difference measurement in the operational mode in which a measurement representative of current ambient condition compensated for time drift using at least one of the translated ambient reference curve and ambient signal offset determined during the standard calibration mode provides an ambient condition measurement which is correlated to a difference signal offset measurement, the difference signal offset measurement being at least one of a) determined from the translated difference reference curve at the compensated ambient condition measurement, b) equivalent to the difference signal offset determined during the standard calibration mode, and c) derived by empirically comparing values for the difference signal offset at various times during operation in the standard calibration mode, at various ambient conditions, and the difference signal offset measurement being used to correct the difference signal for component drift to provide a compensated difference measurement between the first and second values of the physical variable.

94. Apparatus as defined in claim 93, further comprising a timer and wherein the ambient reference curve and difference reference curve are re-acquired at a known time, relative to the time at which the respective offset curves were last acquired and compared to previous versions of the respective offset curves to at least one of a) estimate error in the linear translations, associated with the standard calibration mode, and b) track trends in drift of the respective offset curves.

95. Apparatus as defined in claim 70 wherein the apparatus is a digital multimeter.

96. Apparatus as defined in claim 72 wherein the apparatus is a digital multimeter.

* * * * *